United States Patent
An et al.

(10) Patent No.: US 12,150,365 B2
(45) Date of Patent: Nov. 19, 2024

(54) DISPLAY APPARATUS

(71) Applicant: Samsung Display Co., Ltd., Yongin-si (KR)

(72) Inventors: Chiwook An, Hwaseong-si (KR); Miyoung Kim, Daegu (KR); Jongseok Kim, Yongin-si (KR); Kiho Bang, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/985,907

(22) Filed: Nov. 14, 2022

(65) Prior Publication Data

US 2023/0074441 A1  Mar. 9, 2023

Related U.S. Application Data

(63) Continuation of application No. 16/943,988, filed on Jul. 30, 2020, now Pat. No. 11,502,140, which is a
(Continued)

(30) Foreign Application Priority Data

Jul. 29, 2016  (KR) ........................ 10-2016-0097471

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/0416* (2013.01);
(Continued)

(58) Field of Classification Search
CPC ........ G06F 3/044; G06F 3/041; G06F 3/0412; G06F 3/0416; G06F 3/04164;
(Continued)

(56) References Cited

U.S. PATENT DOCUMENTS 9,194,889 B2   11/2015  Lee et al.
9,696,835 B2   7/2017   Her
(Continued)

FOREIGN PATENT DOCUMENTS

CN       101174380 A       5/2008
CN       101425520 A       5/2009
(Continued)

OTHER PUBLICATIONS

Non-Final Office Action issued on Aug. 29, 2019 to U.S. Appl. No. 15/653,077.
(Continued)

*Primary Examiner* — Shahed Ahmed
*Assistant Examiner* — Khatib A Rahman
(74) *Attorney, Agent, or Firm* — Lewis Roca Rothgerber Christie LLP

(57) ABSTRACT

A display apparatus including an organic light-emitting display panel and a touch sensing unit disposed on the organic light-emitting display panel is disclosed. The touch sensing unit includes a touch electrode and a wiring part connected to the touch electrode. The wiring part of the touch sensing unit passes a protruding member disposed on a non-display region of the organic light-emitting display panel, and forms a first wiring part which does not overlap the protruding member, a second wiring part overlapping the protruding part, and a connection wiring part disposed between the first and second wiring parts and having a wiring width less than the first and second wiring parts so as to overlap an edge of the protruding member.

30 Claims, 38 Drawing Sheets

Related U.S. Application Data continuation of application No. 15/653,077, filed on Jul. 18, 2017, now Pat. No. 10,748,971.

(51) Int. Cl.
*G06F 3/044* (2006.01)
*H10K 50/84* (2023.01)
*H10K 59/131* (2023.01)

(52) U.S. Cl.
CPC .......... *G06F 3/04164* (2019.05); *G06F 3/044* (2013.01); *G06F 3/0443* (2019.05); *G06F 3/0446* (2019.05); *H10K 50/84* (2023.02); *H10K 59/131* (2023.02); *G06F 2203/04102* (2013.01); *G06F 2203/04103* (2013.01); *G06F 2203/04111* (2013.01); *G06F 2203/04112* (2013.01)

(58) Field of Classification Search
CPC ................. G06F 3/0443; G06F 3/0446; G06F 2203/04102; G06F 2203/04103; G06F 2203/04111; G06F 2203/04112; G06F 3/048; G06F 2203/0411; H01L 27/323; H01L 27/3276; H01L 51/5237; H01L 27/1244; H01L 2251/558; H10K 59/40; H10K 50/84; H10K 59/131; H10K 59/87; H10K 2102/351
See application file for complete search history.

(56) References Cited

U.S. PATENT DOCUMENTS

| | | | |
|---|---|---|---|
| 9,703,134 B2* | 7/2017 | Nakano | G06F 3/0446 |
| 9,785,005 B2 | 10/2017 | Yeh et al. | |
| 9,798,434 B2 | 10/2017 | Lee et al. | |
| 10,714,505 B2 | 7/2020 | Songbe et al. | |
| 2007/0267973 A1* | 11/2007 | Suh | H01L 51/5221 |
| | | | 313/506 |
| 2008/0106532 A1 | 5/2008 | Choi et al. | |
| 2009/0109384 A1 | 4/2009 | Kim et al. | |
| 2010/0045177 A1* | 2/2010 | Oh | H01L 51/5246 |
| | | | 313/504 |
| 2010/0045181 A1* | 2/2010 | Oh | H01L 51/5246 |
| | | | 445/25 |
| 2012/0062104 A1 | 3/2012 | Kwack et al. | |
| 2013/0106747 A1* | 5/2013 | Choi | G06F 3/0446 |
| | | | 345/173 |
| 2013/0234961 A1* | 9/2013 | Garfinkel | G06F 3/041 |
| | | | 345/173 |
| 2014/0042408 A1 | 2/2014 | Akagawa et al. | |
| 2014/0078104 A1 | 3/2014 | Lee et al. | |
| 2014/0132855 A1 | 5/2014 | Yang et al. | |
| 2014/0145977 A1 | 5/2014 | Kang | |
| 2014/0146257 A1* | 5/2014 | Fujikawa | G02F 1/136286 |
| | | | 349/42 |
| 2014/0204286 A1* | 7/2014 | Park | G06F 3/04164 |
| | | | 349/12 |
| 2014/0285728 A1* | 9/2014 | Lee | G06F 3/0446 |
| | | | 349/12 |
| 2014/0368755 A1 | 12/2014 | Chen et al. | |
| 2015/0027753 A1 | 1/2015 | Huang et al. | |
| 2015/0049030 A1 | 2/2015 | Her | |
| 2015/0101919 A1* | 4/2015 | Bae | G06F 3/044 |
| | | | 216/18 |
| 2015/0130726 A1* | 5/2015 | Min | G06F 3/04164 |
| | | | 345/173 |
| 2015/0153779 A1 | 6/2015 | Ko et al. | |
| 2015/0162389 A1 | 6/2015 | Zhang et al. | |
| 2015/0205022 A1 | 7/2015 | Kim et al. | |
| 2015/0205407 A1 | 7/2015 | Kim | |
| 2015/0237755 A1 | 8/2015 | Seo | |
| 2016/0103537 A1 | 4/2016 | Park et al. | |
| 2016/0117031 A1* | 4/2016 | Han | G06F 3/0412 |
| | | | 345/174 |
| 2016/0209965 A1* | 7/2016 | Kim | G06F 3/04164 |
| 2016/0218151 A1 | 7/2016 | Kwon et al. | |
| 2018/0039360 A1* | 2/2018 | Akimoto | G06F 3/0446 |
| 2018/0182817 A1* | 6/2018 | Jo | H01L 27/3246 |
| 2018/0203555 A1* | 7/2018 | Miyamoto | H01L 27/323 |
| 2019/0115411 A1* | 4/2019 | Park | H01L 51/5281 |

FOREIGN PATENT DOCUMENTS

| | | |
|---|---|---|
| CN | 102749747 A | 10/2012 |
| CN | 102760718 A | 10/2012 |
| CN | 102955615 | 3/2013 |
| CN | 103140921 A | 6/2013 |
| CN | 104238847 | 12/2014 |
| CN | 102937842 | 4/2016 |
| CN | 105807985 A | 7/2016 |
| JP | 2009211084 A | 9/2009 |
| KR | 20110048686 | 5/2011 |
| KR | 10-2015-0020929 | 2/2015 |
| KR | 10-2015-0025994 | 3/2015 |
| KR | 10-2018-0003709 | 1/2018 |
| KR | 20160071773 | 12/2020 |
| TW | I522861 | 8/2014 |
| TW | M524953 | 7/2016 |

OTHER PUBLICATIONS

Notice of Allowance issued on Dec. 17, 2019 to U.S. Appl. No. 15/653,077.
Notice of Allowance issued on Apr. 6, 2020 to U.S. Appl. No. 15/653,077.
Extended European Search Report dated Nov. 29, 2017, issued in European Patent Application No. 17182273.7.
Non-Final Office Action issued on Aug. 30, 2021 to U.S. Appl. No. 16/943,988.
Non-Final Office Action issued on Dec. 10, 2021 to U.S. Appl. No. 16/943,988.
Notice of Allowance issued on Mar. 30, 2022 to U.S. Appl. No. 16/943,988.
Notice of Allowance issued on Jul. 20, 2022 to U.S. Appl. No. 16/943,988.

\* cited by examiner

DISPLAY APPARATUS

CROSS-REFERENCE TO RELATED APPLICATION

This application is a Continuation of U.S. patent application Ser. No. 16/943,988, filed on Jul. 30, 2020, which is a Continuation of U.S. patent application Ser. No. 15/653,077, filed on Jul. 18, 2017, which claims priority from and the benefit of Korean Patent Application No. 10-2016-0097471, filed on Jul. 29, 2016, each of which is hereby incorporated by reference for all purposes as if fully set forth herein.

BACKGROUND

Field

The present invention relates to a display apparatus, and more particularly, to a display apparatus in which the likelihood of defects in a wiring part of a touch sensing unit is reduced.

Discussion of the Background

There have been developed various display devices used for multimedia devices, such as televisions, cellular phones, tablet computers, navigation units, and game machines. Input devices for display apparatuses include a keyboard, a mouse, or the like. Furthermore, display apparatuses are provided with a touch sensing unit as an input device.

The above information disclosed in this Background section is only for enhancement of understanding of the background of the inventive concept, and, therefore, it may contain information that does not form the prior art that is already known in this country to a person of ordinary skill in the art.

SUMMARY

An exemplary embodiment of the invention provides a display apparatus having an improved wiring structure for reducing the likelihood of a short-circuit defect caused between neighboring wiring parts in a touch sensing unit.

An exemplary embodiment of the inventive concept provides a display apparatus including: a base substrate divided into a display region and a non-display region adjacent to the display region; a circuit layer disposed on the base substrate; a light-emitting element layer disposed on the display region; an encapsulating layer covering the light-emitting element layer; a touch sensing unit disposed on the encapsulating layer and including a touch electrode and a wiring part connected to the touch electrode; and a protruding member disposed on the non-display region. In an exemplary embodiment, the wiring part may include, when viewed in a plan view: a first wiring part which does not overlap the protruding member and having a first wiring width; a second wiring part overlapping the protruding member and having a second wiring width; and a connection wiring part having a third wiring width smaller than the first and second wiring widths and disposed between the first and second wiring parts, the first to third wiring widths may be in a direction perpendicular to an extending direction of the wiring part, and the connection wiring part may overlap an edge of the protruding member.

Additional aspects will be set forth in the detailed description which follows, and, in part, will be apparent from the disclosure, or may be learned by practice of the inventive concept.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EXEMPLARY EMBODIMENTS

Figure 1A:
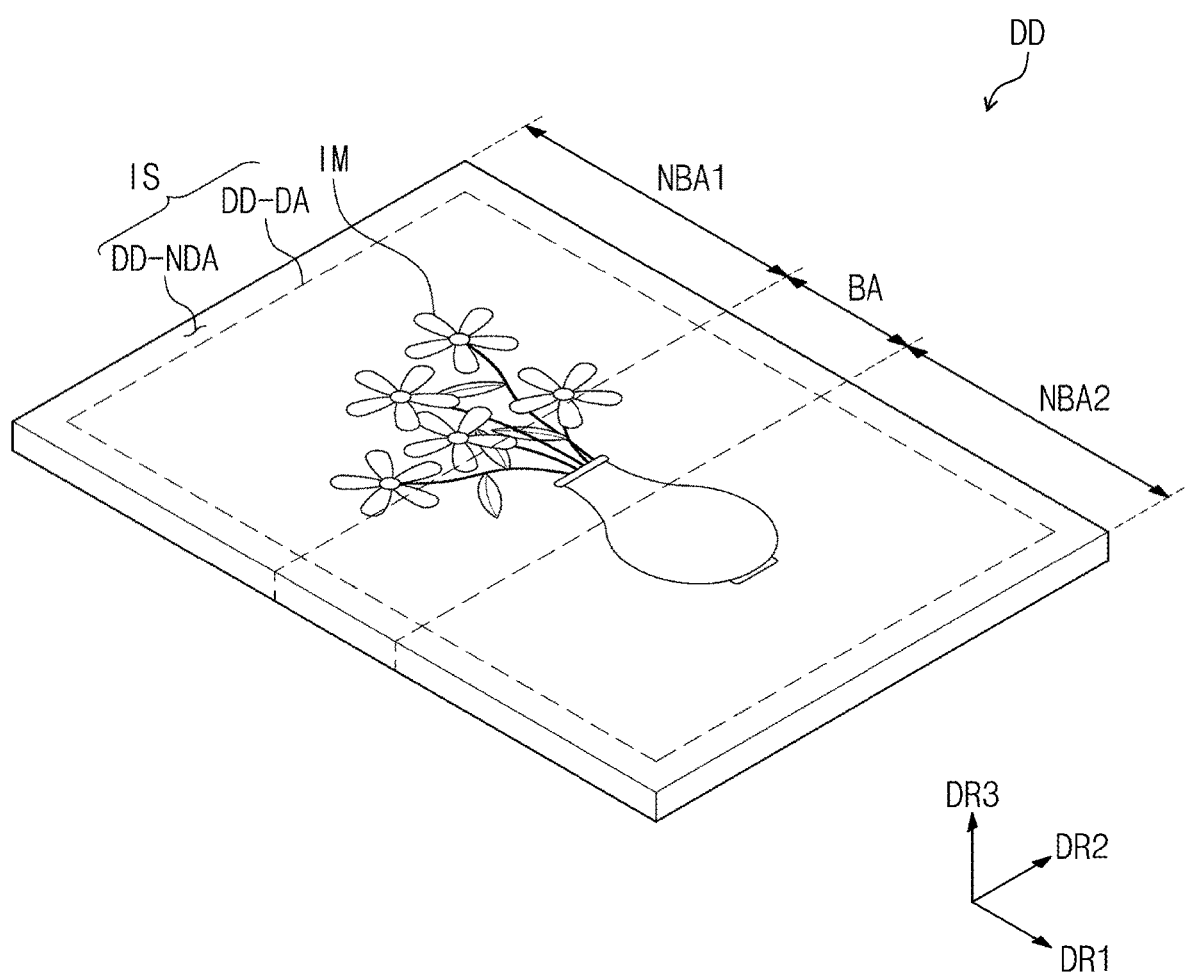
FIG. 1A is a perspective view illustrating a display apparatus in a first operation mode according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
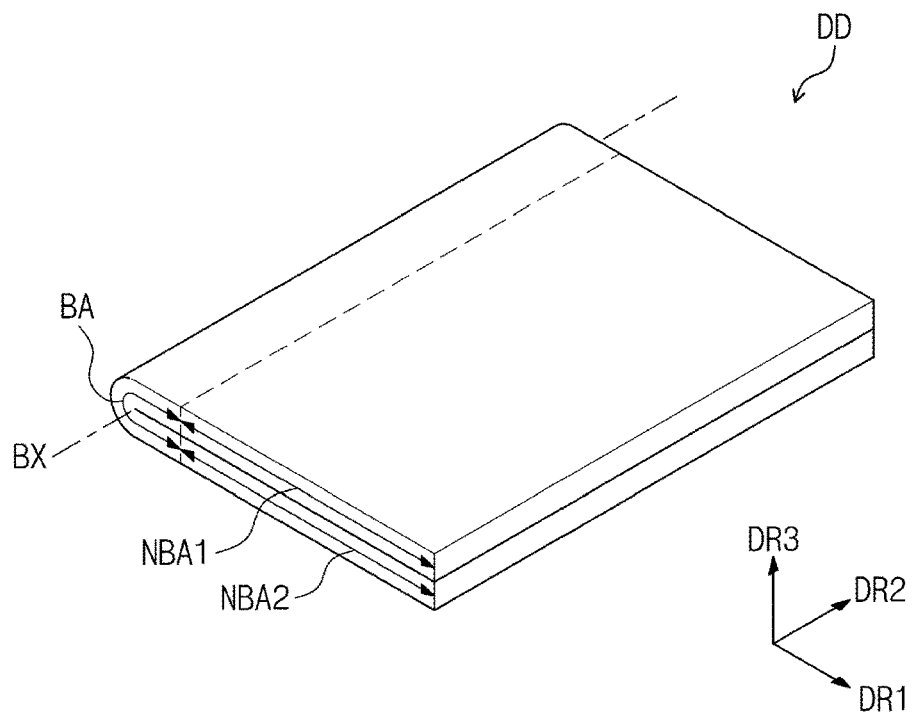
FIG. 1B is a perspective view illustrating a display apparatus in a second operation mode according to an exemplary embodiment of the inventive concept.
Figure 1C:
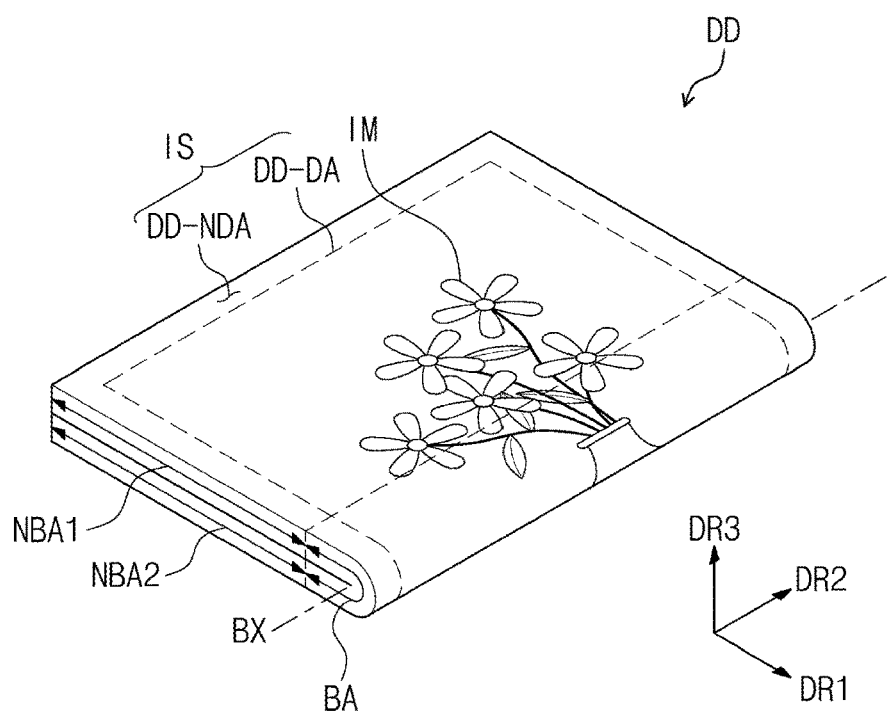
FIG. 1C is a perspective view illustrating a display apparatus in a third operation mode according to an exemplary embodiment of the inventive concept.

FIG. 1A is a perspective view illustrating a display apparatus DD in a first operation mode according to an exemplary embodiment of the inventive concept. FIG. 1B is a perspective view illustrating a display apparatus DD in a second operation mode according to an exemplary embodiment of the inventive concept. FIG. 1C is a perspective view illustrating a display apparatus DD in a third operation mode according to an exemplary embodiment of the inventive concept.

As illustrated in FIG. 1A, in a first operation mode, a display surface IS on which an image IM is displayed is parallel to a surface defined by a first direction DR1 and a second direction DR2. A normal direction of the display surface IS, that is, the thickness direction of the display apparatus DD is indicated by a third direction DR3. Front surfaces (or upper surfaces) and rear surfaces (or lower surfaces) of members are distinguished by the third direction DR3. However, the directions indicated by the first to third directions DR1, DR2, and DR3 are relative concepts and may be converted into other directions. Hereinafter, the first to third directions are directions which are respectively indicated by the first to third directions DR1, DR2, and DR3, and referred to by the same reference symbols.

FIGS. 1A to 1C illustrate a flexible foldable display apparatus as an example of the display apparatus DD. However, the exemplary embodiment of the inventive concept may be a rollable display apparatus or a bent display apparatus, and not particularly limited thereto. Also, in the current exemplary embodiment, a flexible display apparatus is illustrated, but the exemplary embodiment of the inventive concept is not limited thereto. The display apparatus DD according to the current exemplary embodiment may also be a flat rigid display apparatus or a bent rigid display apparatus. The display apparatus DD according to the exemplary embodiment of the inventive concept may be used for large sized electronic apparatuses, such as televisions, monitors, and for small and medium sized electronic apparatuses, such as cellular phones, tablet computers, car navigation units, game machines, smart watches, or the like.

As illustrated in FIG. 1A, the display surface IS of the display apparatus DD may include a plurality of regions. The display apparatus DD includes a display region DD-DA on which an image IM is displayed and a non-display region DD-NDA adjacent to the display region DD-DA. The non-display region DD-NDA is a region on which an image is not displayed. FIG. 1A illustrates a vase as an example of the image IM. For example, the display region DD-DA may have a rectangular shape. The non-display region DD-NDA may surround the display region DD-DA. However, the exemplary embodiments of the inventive concept are not limited thereto, and the shapes of the display region DD-DA and the non-display region DD-NDA may be relatively designed.

As illustrated in FIGS. 1A to 1C, the display apparatus DD may include a plurality of regions defined according to operation shapes. The display apparatus DD may include a bending region BA which may be bent about bending axis BX, and a first non-bending region NBA1 and a second non-bending region NBA2, which are not capable of being bent.

As illustrated in FIG. 1B, the display apparatus DD may be subjected to an inner-bending such that the display surface IS of the first non-bending region NBA1 and the display surface IS of the second non-bending region NBA2 face each other. As illustrated in FIG. 1C, the display apparatus DD may also be subjected to an outer-bending such that the display surface IS is exposed to the outside.

FIGS. 1A to 1C illustrate only one bending region BA, but the exemplary embodiment of the inventive concept is not limited thereto. For example, in an exemplary embodiment of the inventive concept, the display apparatus DD may include a plurality of bending regions BA.

In an exemplary embodiment of the inventive concept, the display apparatus DD may be configured to repeat only the operation modes illustrated in FIGS. 1A to 1B. However, the exemplary embodiment of the inventive concept is not limited thereto, and the bending region BA may be defined corresponding to a shape in which a user operates the display apparatus DD. For example, the bending region BA may be defined, unlike in FIGS. 1B and 1C, to be parallel to the first direction DR1 or may also be defined in a diagonal direction. The area of the bending region BA is not fixed and may be determined according to a radius of curvature.

Figure 2:
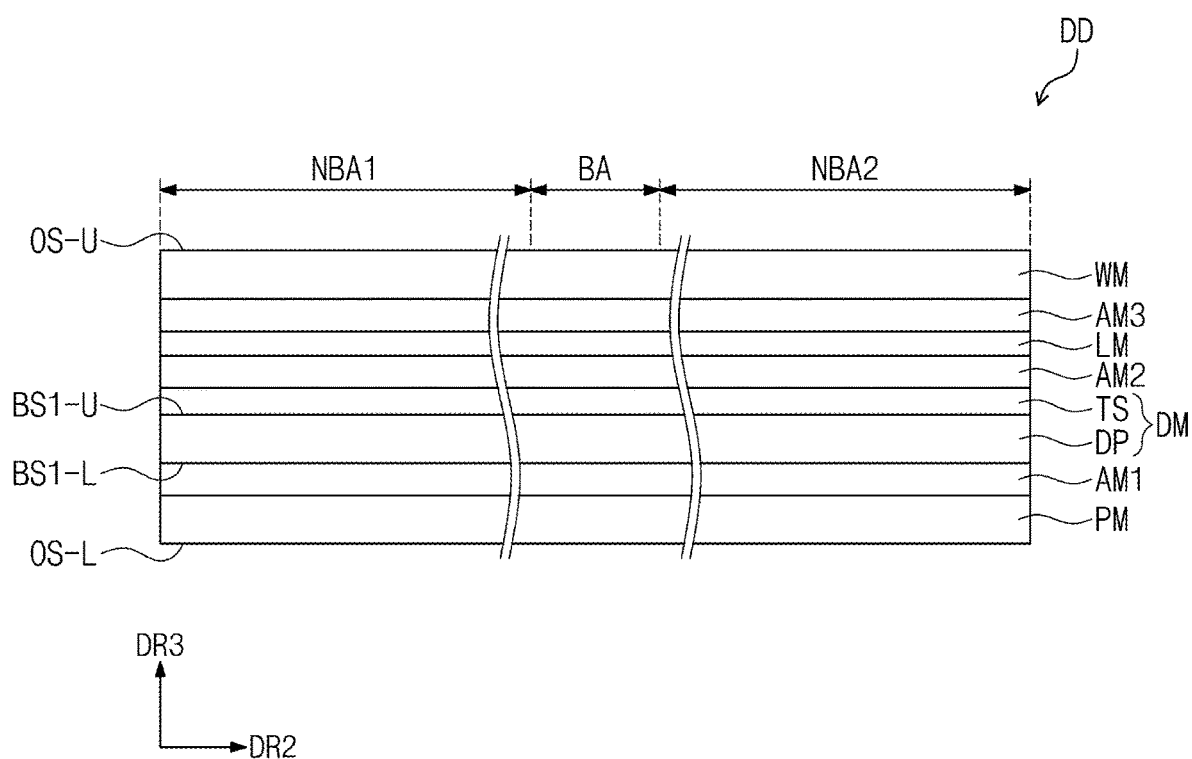
FIG. 2 is a cross-sectional view of a display apparatus according to an exemplary embodiment of the inventive concept.

FIG. 2 is a cross-sectional view of a display apparatus DD according to an exemplary embodiment of the inventive concept. FIG. 2 illustrates a cross-sectional surface defined by the second and third directions DR2 and DR3.

As illustrated in FIG. 2, the display apparatus DD may include a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 couples the display module DM and the protective film PM, the second adhesive member AM2 couples the display module DM and the optical member LM, and the third adhesive member AM3 couples the optical member LM and the window WM.

The protective film PM protects the display module DM. The protective film PM provides a first outer surface OS-L exposed to the outside and an adhesive surface adhered to the first adhesive member AM1. The protective film PM prevents external moisture from penetrating into the display module DM and absorbs external shock.

The protective film PM may include a plastic film as a base substrate. The protective film PM may include a plastic film which includes any one selected from a group consisting of polyethersulfone(PES), polyacrylate, polyetherimide (PEI), polyethylenenaphthalate(PEN), polyethyleneterephthalate(PET), polyphenylenesulfide(PPS), polyarylate, polyimide(PI), polycarbonate(PC), poly(aryleneethersulfone) and combinations thereof.

Composition materials of the protective film PM are not limited to plastic resins but may include organic/inorganic composite materials. The protective film PM may include a porous organic layer and an inorganic material filled in the pores of the organic layer. The protective film PM may further include a functional layer formed on a plastic film. The functional layer may include a resin layer. The functional layer may be formed by a coating method. In an exemplary embodiment of the inventive concept, the protective film PM may not be provided.

The window WM may protect the display module DM from external shock and provide a user with an input surface. The window WM provides a second outer surface OS-U exposed to the outside and an adhesive surface adhered to the third adhesive member AM3. The display surface IS illustrated in FIGS. 1A to 1C may be the second outer surface OS-U.

The window WM may include a plastic film. The window WM may include a multilayer structure. The window WM may have a multilayer structure selected from a glass substrate, a plastic film, and a plastic substrate. The window WM may further include a bezel pattern. The multilayer structure may be formed through a continuous process or an adhesion process using an adhesive layer.

The optical member LM decreases reflectivity of external light. The optical member LM may include at least a polarizing film. The optical member LM may further include at least an optical retardation film. In an exemplary embodiment of the inventive concept, the optical member LM may not be provided.

The display module DM may include an organic light-emitting display panel DP (or a display panel) and a touch sensing unit TS. The touch sensing unit TS is disposed on the organic light-emitting display panel DP. In an exemplary embodiment, the touch sensing unit TS may also be disposed directly on the organic light-emitting display panel DP. In the present specification, the term "directly disposed" excludes adhesion by means of a separate adhesive layer and means the formation through a continuous process.

The organic light-emitting display panel DP generates an image IM (FIG. 1A) corresponding to input image data. The organic light-emitting display panel DP provides a first display panel surface BS1-L and a second display panel surface BS1-U, which face each other in the thickness direction DR3. In the present exemplary embodiment, the organic light-emitting display panel DP is exemplarily described, but the display panel is not limited thereto.

The touch sensing unit TS obtains coordinates information of an external input. The touch sensing unit TS may detect the external input through an electrostatic capacitance method.

Although not shown separately, the display module DM according to an exemplary embodiment of the inventive concept may also further include a reflection prevention layer. The reflection prevention layer may include a color filter of a laminated structure of conductive layer/insulating layer/conductive layer. The reflection prevention layer may decrease the reflectivity of external light by absorbing, destructively interfering, or polarizing light incident from the outside. The reflection prevention layer may replace the function of the optical member LM.

Each of the first to third adhesive members AM1, AM2, and AM3 may be an organic adhesive layer such as an optically clear adhesive film (OCA), an optically clear resin (OCR), or a pressure sensitive adhesive film (PSA). The organic adhesive layer may include an adhesive material, such as a polyurethane-based, polyacryl-based, polyester-based, polyepoxy-based, or polyacetate vinyl-based adhesive material.

Although not shown separately, the display apparatus DD may further include a frame structure for supporting the functional layers to maintain the states illustrated in FIGS. 1A to 1C. The frame structure may include an articulated structure or a hinge structure.

Figure 3A:
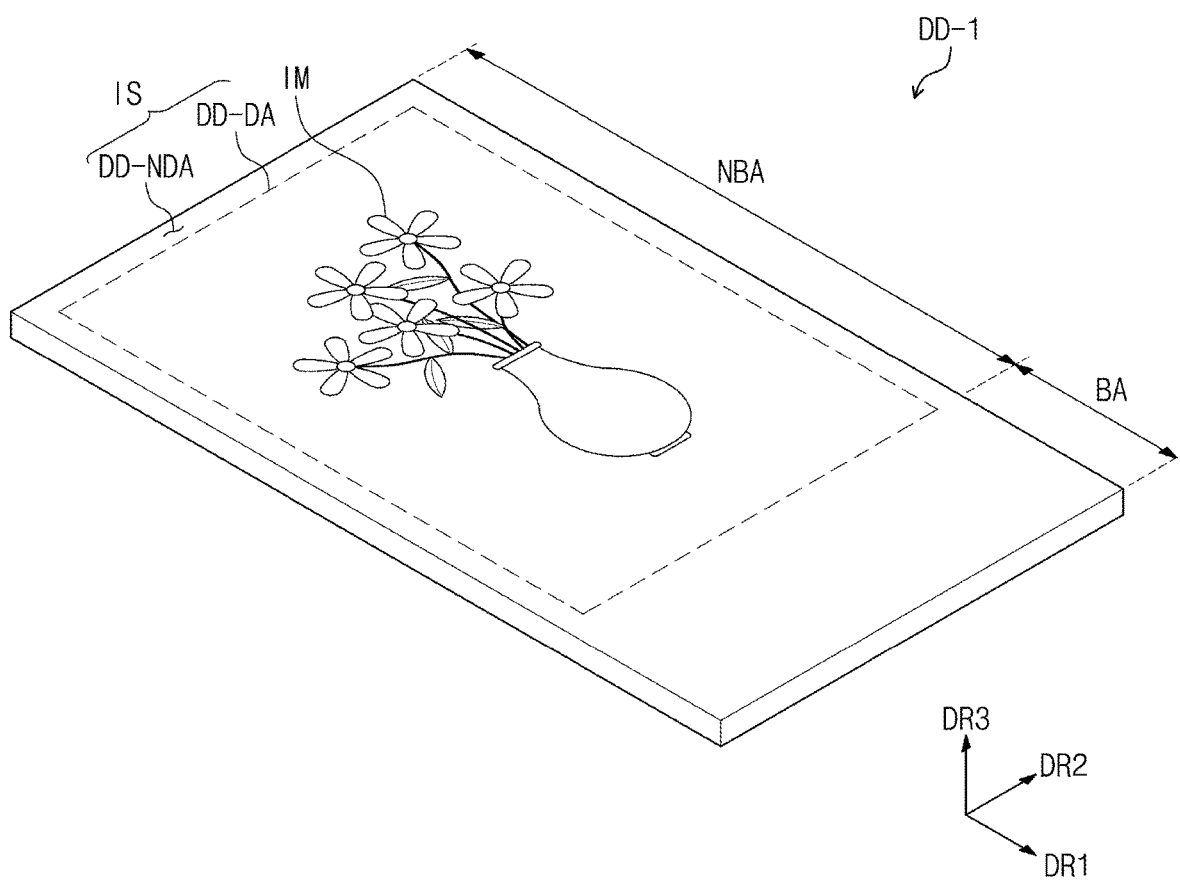
FIG. 3A and FIG. 3B are perspective views illustrating a display apparatus according to an exemplary embodiment of the inventive concept.
Figure 3B:
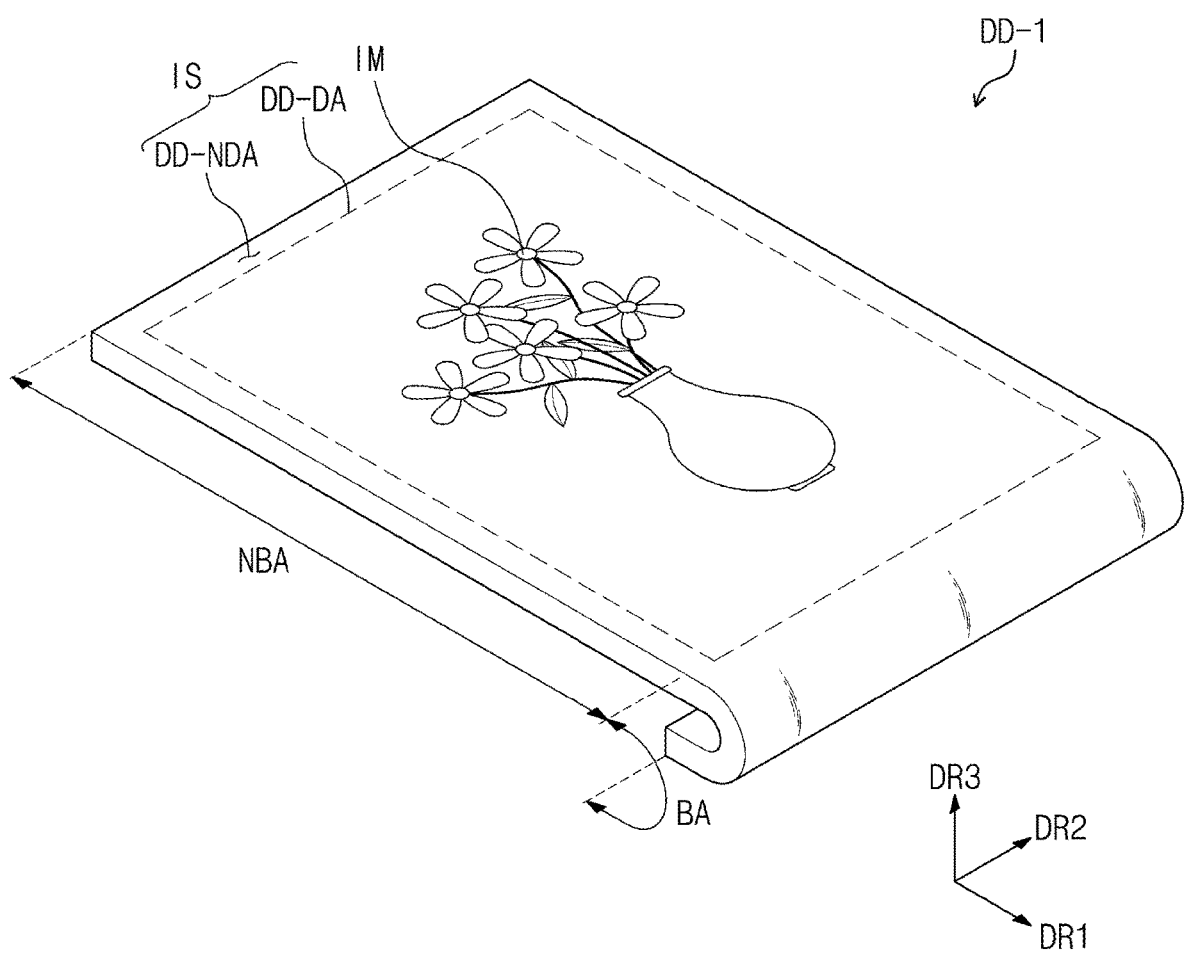

FIGS. 3A and 3B are perspective views illustrating a display apparatus DD-1 according to an exemplary embodiment of the inventive concept. FIG. 3A illustrates the display apparatus DD-1 in an unbent state, and FIG. 3B illustrates the display apparatus DD-1 in a bent state.

The display apparatus DD-1 may include one bending region BA and one non-bending region NBA. A non-display region DD-NDA of the display apparatus DD-1 may be bent. However, in an exemplary embodiment of the inventive concept, the location of the bending region BA of the display apparatus DD-1 may be changed.

The display apparatus DD-1 according to an exemplary embodiment of the inventive concept may operate in a state of being fixed in one shape, unlike the display apparatus DD illustrated in FIGS. 1A to 1C. The display apparatus DD-1, as illustrated in FIG. 3B, may operate in a bent state. The display apparatus DD-1 may be fixed to a frame or the like in the bent state, and the frame may be coupled with a housing of an electronic apparatus.

The display apparatus DD-1 according to the present exemplary embodiment may have the same cross-sectional structure as that illustrated in FIG. 2. However, the non-bending region NBA and the bending region BA may have different laminated structures. The non-bending region NBA may have the same cross-sectional structure as that illustrated in FIG. 2, and the bending region BA may have a structure different from that illustrated in FIG. 2. In the bending region BA, an optical member LM and a window WM may not be disposed. That is, the optical member LM and the window WM may be disposed only in the non-bending region NBA. A second adhesive member AM2 and a third adhesive member AM3 may also not be disposed in the bending region BA.

Figure 4A:
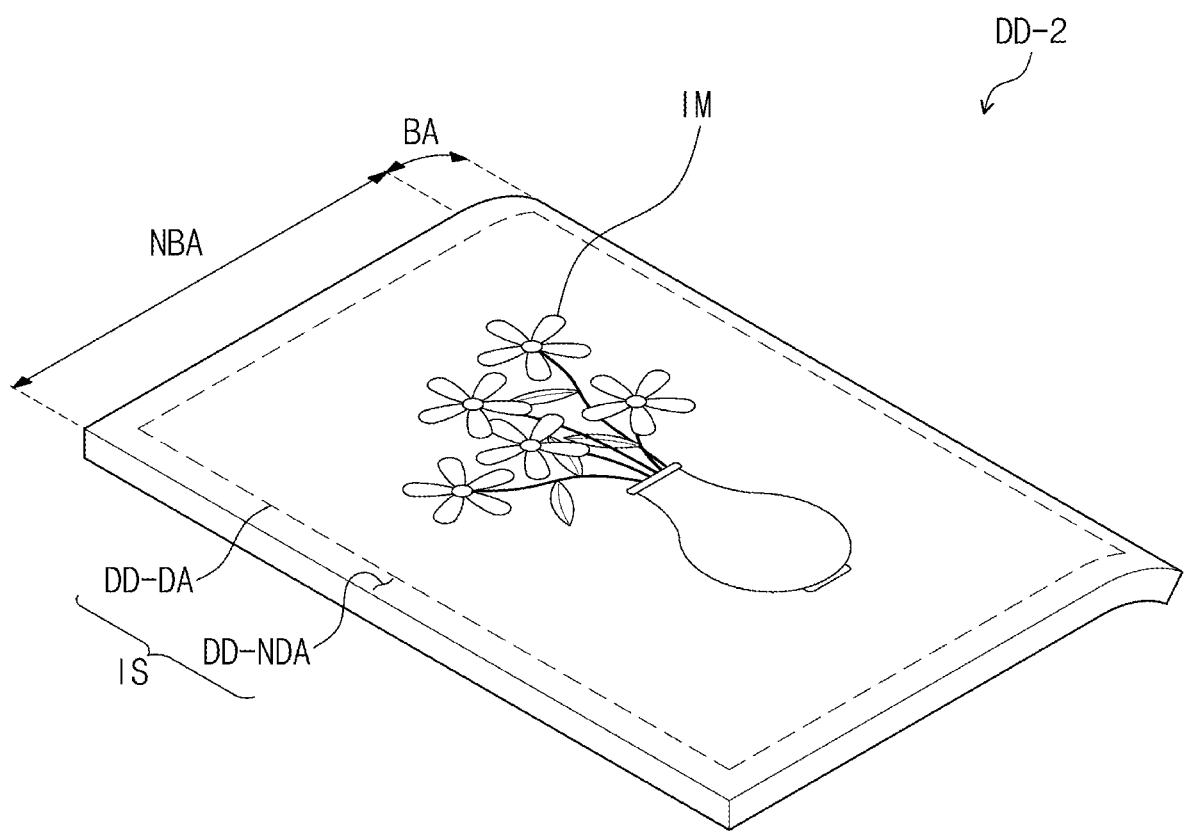
FIG. 4A and FIG. 4B are perspective views illustrating a display apparatus according to an exemplary embodiment of the inventive concept.
Figure 4A:
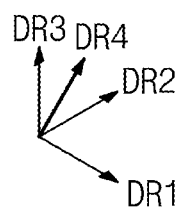

FIG. 4A is a perspective view of a display apparatus DD-2 according to an exemplary embodiment of the inventive concept.

The display apparatus DD-2 may include a non-bending region NBA (or planar region) in which a main image is displayed on a front surface and a bending region BA (or side surface region) in which a sub image is displayed on a side surface. Although not shown separately, the sub image may include an icon providing predetermined information. In the present exemplary embodiment, the terms "non-bending region NBA" and "bending region BA" define the display apparatus DD-2 by means of a plurality of regions distinguished by shapes.

The bending region BA bent from the non-bending region NBA displays the sub image in a first direction DR1, a second direction DR2, and a fourth direction DR4 crossing a third direction DR3. However, the directions indicated by the first to fourth directions DR1 to DR4 are relative concepts and may be converted into other directions.

Figure 4B:
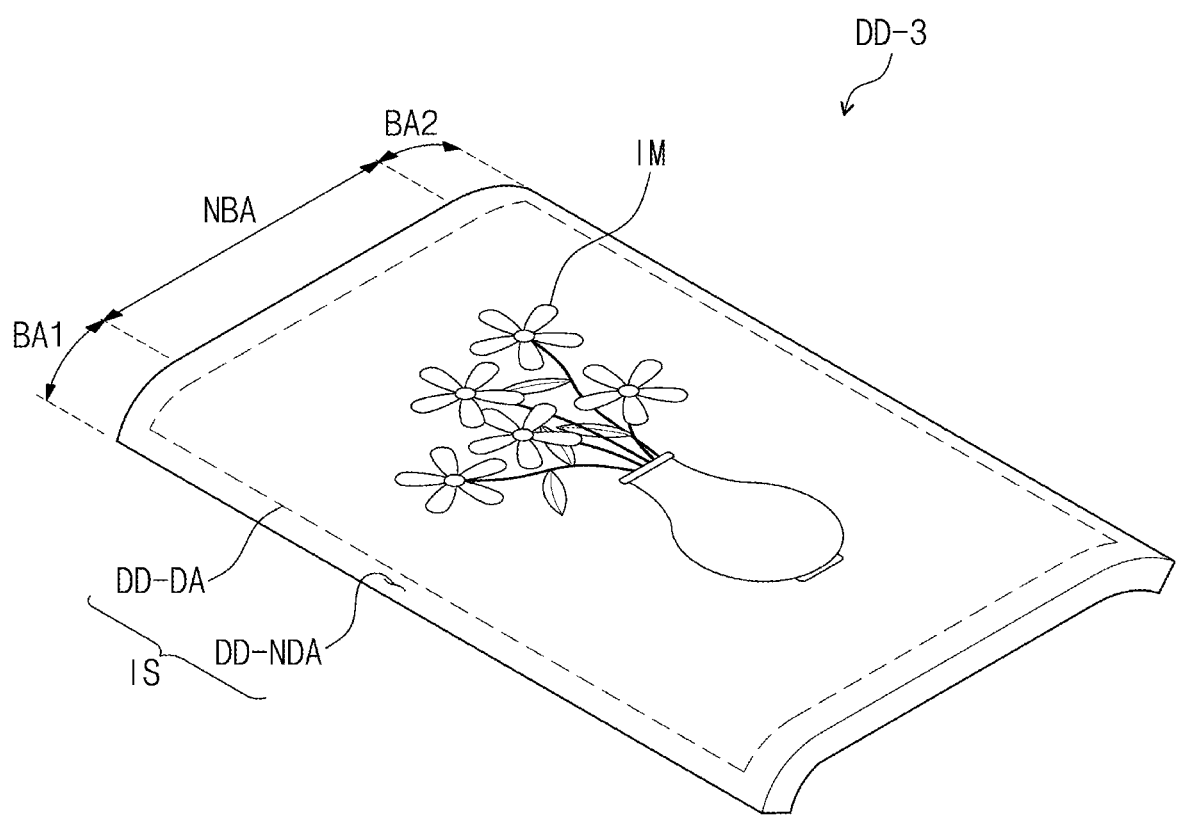

FIG. 4B is a perspective view illustrating a display apparatus DD-3 according to an exemplary embodiment of the inventive concept.

The display apparatus DD-3 includes a non-bending region NBA in which a main image is displayed on a front surface and first and second bending region BA1 and BA2 in which a sub image is displayed on side surfaces. The first and second bending regions BA1 and BA2 may be bent from both sides of the non-bending region NBA.

Figure 5A:
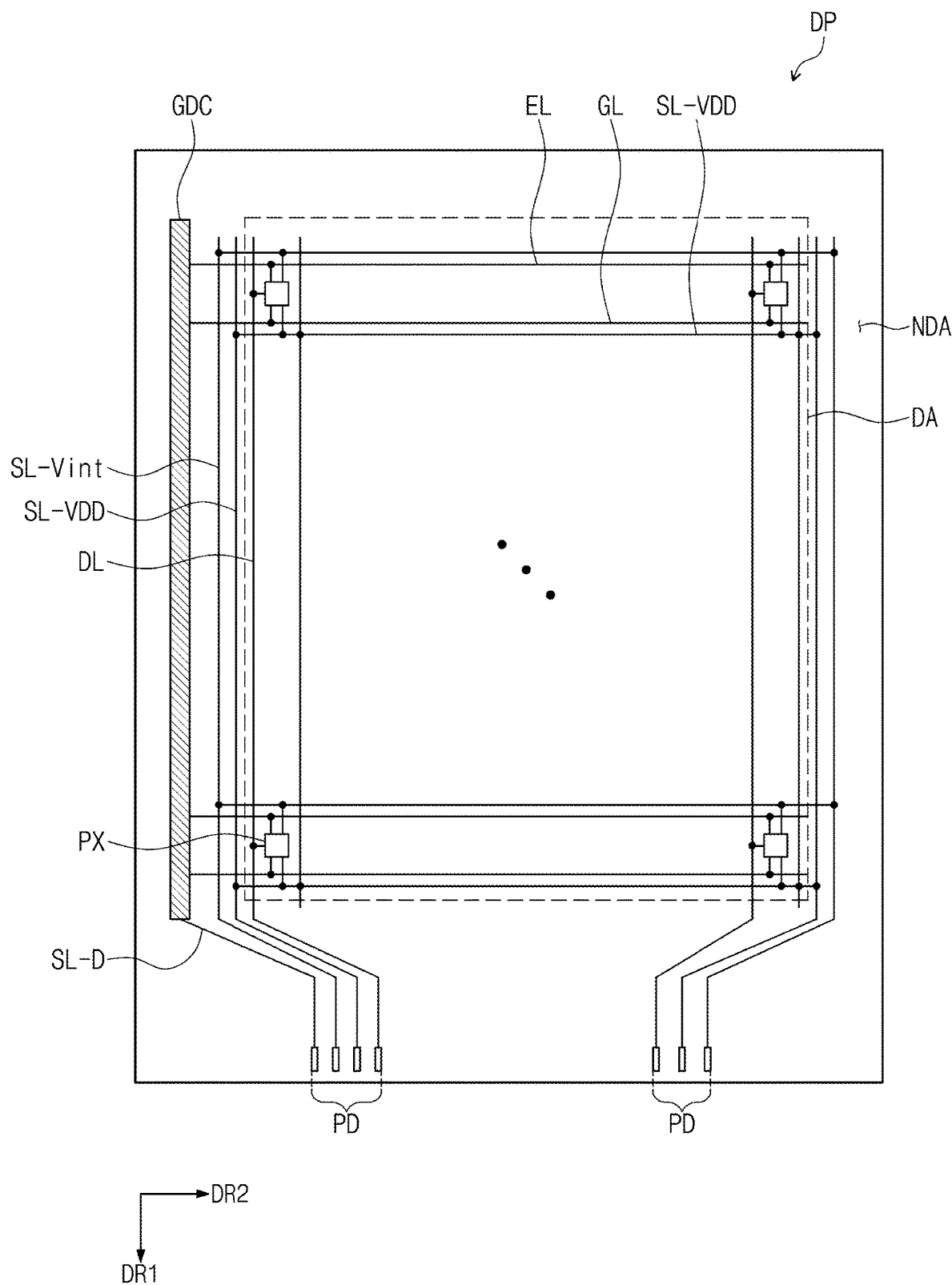
FIG. 5A is a plan view of an organic light-emitting display panel according to an exemplary embodiment of the inventive concept.
Figure 5B:
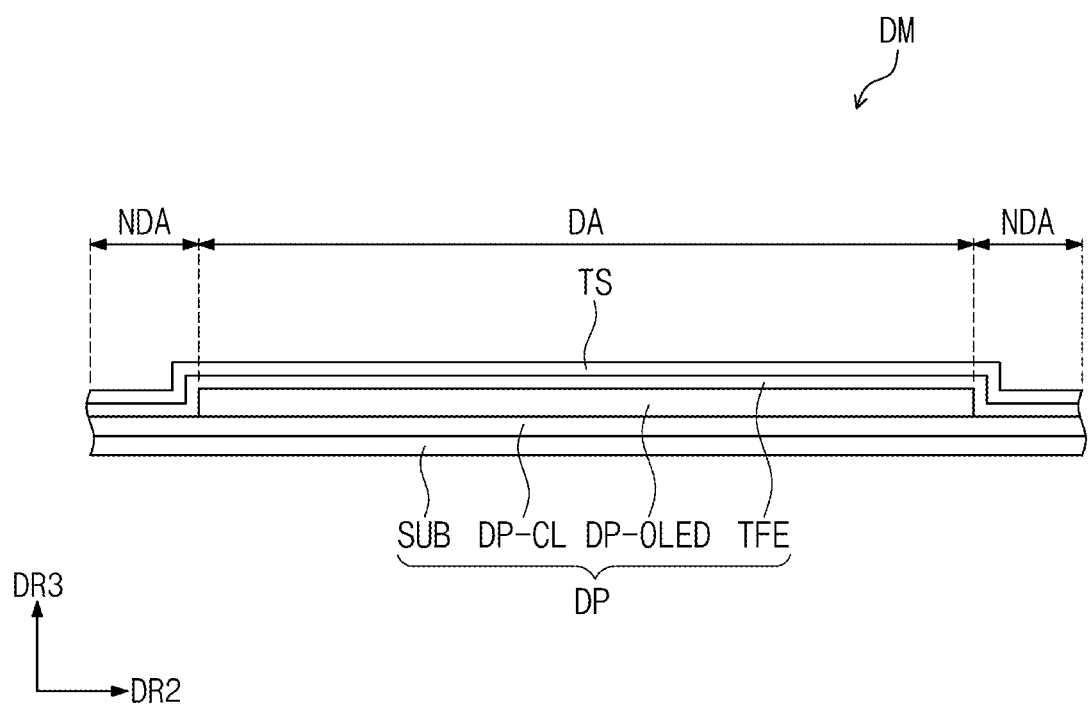
FIG. 5B is a cross-sectional view illustrating a display module according to an exemplary embodiment of the inventive concept.

FIG. 5A is a plan view of an organic light-emitting display panel DP according to an exemplary embodiment of the inventive concept, and FIG. 5B is a cross-sectional view illustrating a display module DM according to an exemplary embodiment of the inventive concept. For example, FIG. 5B may illustrate a portion of a cross-sectional surface at a surface parallel to the surface defined by a second direction DR2 and a third direction DR3.

As illustrated in FIG. 5A, the organic light-emitting display panel DP includes a display region DA and a non-display region NDA when viewed in a plan view. The display region DA and the non-display region NDA of the organic light-emitting display panel DP respectively correspond to the display region DD-DA (see FIG. 1A) and the non-display region DD-NDA (see FIG. 1A) of the display apparatus DD (see FIG. 1A). The display region DA and the non-display region NDA of the organic light-emitting display panel DP need not necessarily be the same as the display region DD-DA (see FIG. 1A) and the non-display region DD-NDA (see FIG. 1A) of the display apparatus DD (see FIG. 1A) but may be changed according to the structure/design of the organic light-emitting display panel DP.

The organic light-emitting display panel DP includes a plurality of pixels PX. A region in which the pixels PX are disposed is defined as the display region DA. In the present exemplary embodiment, the non-display region NDA may be defined along an edge of the display region DA.

The organic light-emitting display panel DP includes gate lines GL, data lines DL, light-emitting lines EL, a control signal line SL-D, an initializing voltage line SL-Vint, voltage lines SL-VDD, and a pad part PD.

The gate lines GL are respectively connected to the corresponding pixels PX from among the plurality of pixels PX, and the data lines DL are respectively connected to the corresponding pixels PX from among the plurality of pixels PX. The light-emitting lines EL are respectively disposed in parallel with the corresponding gate lines from among the gate lines GL. The control signal line SL-D may provide a gate driving circuit GDC with control signals. The initializing voltage line SL-Vint may provide the plurality of pixels PX with an initializing voltage. The voltage lines SL-VDD are connected to the plurality of pixels PX and may provide the plurality of pixels PX with a first voltage. The voltage lines SL-VDD may include a plurality of lines extending in a first direction DR1 and a plurality of lines extending in a second direction The gate driving circuit GDC in which the gate lines GL and the light-emitting lines EL are connected may be disposed on one side of the non-display region NDA. Some of the gate lines GL, the data lines DL, the light-emitting lines EL, the control signal line SL-D, the initializing voltage line SL-Vint, the voltage lines SL-VDD are disposed on the same layer and others are disposed on different layers.

The pad part PD may be connected to ends of the data lines DL, the control signal line SL-D, the initializing voltage line SL-Vint, and the voltage lines SL-VDD.

As illustrated in FIG. 5B, the organic light-emitting display panel DP may include a base substrate SUB, a circuit layer DP-CL disposed on the base substrate SUB, a light-emitting element layer DP-OLED disposed on the circuit layer DP-CL, and an encapsulating layer TFE surrounding the light-emitting element layer DP-OLED.

The base substrate SUB may include a plastic substrate, a glass substrate, a metal substrate, an organic/inorganic composite material substrate, or the like. The plastic substrate may include at least any one of an acryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. The base substrate SUB may be a flexible substrate. Alternatively, the base substrate SUB may be a rigid substrate.

The base substrate SUB may be divided into a display region DA and a non-display region NDA adjacent to the display region DA. The non-display region NDA may be disposed on edges of the display region DA. However, the exemplary embodiments of the inventive concept are not limited thereto, and the non-display region NDA may be provided on only one side of the display region DA.

The circuit layer DP-CL may be disposed on the base substrate SUB. The circuit layer DP-CL may be disposed on the display region DA and the non-display region NDA of the base substrate SUB. Although not separately shown in the drawing, the circuit layer DP-CL may include at least one pixel insulating layer, a plurality of conductive layers, and a semiconductor layer. The plurality of conductive layers of the circuit layer DP-CL may be configured for signal lines or driving circuits for pixels.

The light-emitting element layer DP-OLED may include organic light-emitting diodes. The light-emitting element layer DP-OLED may be disposed on the display region DA. The organic light-emitting diodes will be described in detail in the description of FIG. 6C below.

The encapsulating layer TFE may be disposed on the light-emitting element layer DP-OLED. The encapsulating layer TFE may be disposed to surround the light-emitting element layer DP-OLED. The encapsulating layer TFE may cover and encapsulate the light-emitting element layer DP-OLED. The encapsulating layer TFE may include an inorganic layer and an organic layer. The encapsulating layer TFE may include at least two inorganic layers and the organic layers disposed between the inorganic layers. The inorganic layers protect the light-emitting element layer DP-OLED from water/oxygen, and the organic layers protect the light-emitting element layer DP-OLED from foreign substances such as dust particles. The inorganic layers may include a silicon nitride layer, a silicon oxy nitride layer, a silicon oxide layer, or the like. The organic layers may include acryl-based organic materials, and the exemplary embodiments of the inventive concept are not limited thereto. The inorganic layers may be provided through a deposition method, and the organic layers may be provided through a coating process, but the exemplary embodiments of the inventive concept are not limited thereto. The configuration of the encapsulating layer TFE will be described in detail in the description of FIGS. 7A to 7C below.

A touch sensing unit TS is disposed on the encapsulating layer TFE. The touch sensing unit TS may be directly disposed on the encapsulating layer TFE. However, the exemplary embodiments of the inventive concepts are not limited thereto. An inorganic layer may be disposed on the encapsulating layer TFE and the touch sensing unit TS may also be disposed on the inorganic layer. The inorganic layer may be a buffer layer. The inorganic layer may be at least any one of a silicon nitride layer, a silicon oxy nitride layer, or a silicon oxide layer. However, this is exemplary, and the exemplary embodiments of the inventive concepts are not limited thereto. Also, the buffer layer may be an organic layer. Although it is described that the buffer layer is a separate configuration, the buffer layer may be included in the encapsulating layer TFE.

The touch sensing unit TS includes touch sensors and the touch signal lines. The touch sensors and the touch signal lines may have a single-layer or multilayer structure.

The touch sensors and the touch signal lines may include indium tin oxide (ITO), indium zinc oxide (IZO), zinc oxide (ZnO), indium tin zinc oxide (ITZO), PEDOT, metal nanowires, or graphene. The touch sensors and the touch signal lines may include a metal layer, such as molybdenum, silver, titanium, copper, aluminum, or alloys thereof. The touch sensors and the touch signal lines may have the same layered structure or layered structure different from each other. The touch sensing unit TS will be described in detail below.

Figure 6A:
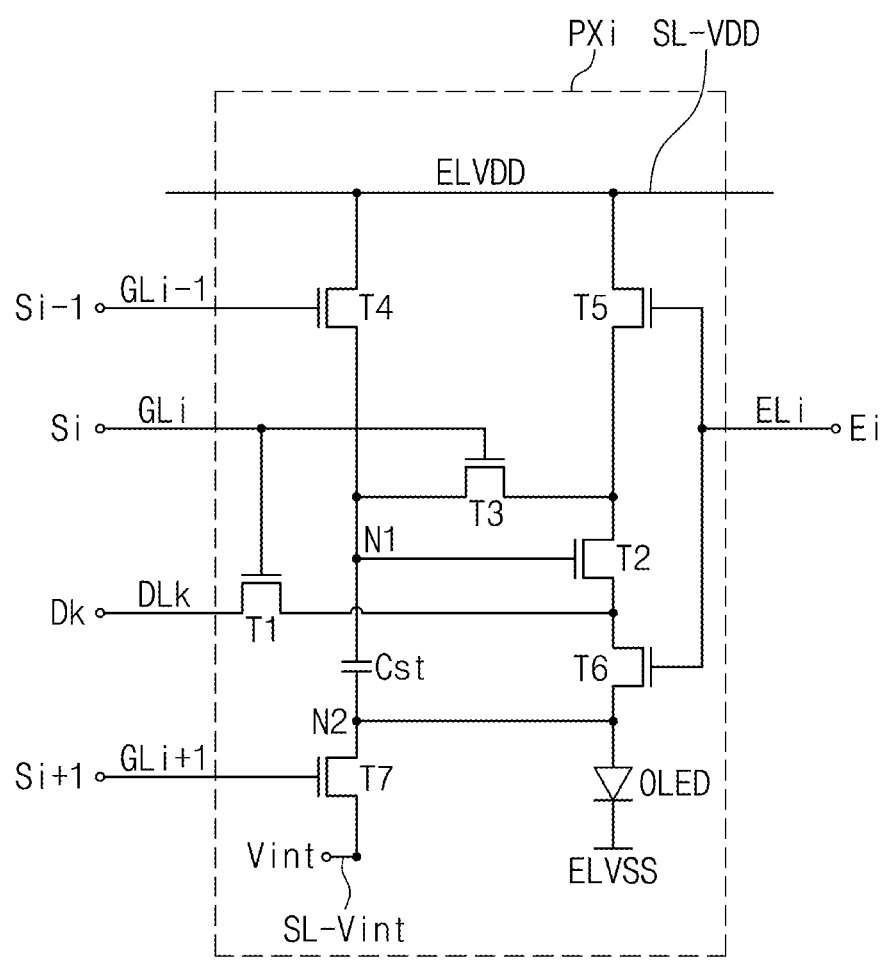
FIG. 6A is an equivalent circuit diagram of a pixel according to an exemplary embodiment of the inventive concept.

FIG. 6A is an equivalent circuit diagram of a pixel PX according to an exemplary embodiment of the inventive concept. FIG. 6A exemplarily illustrates an ith pixel PXi connected to a kth data line DLk from among a plurality of data lines DL (see FIG. 5A).

The ith pixel PXi includes an organic light-emitting diode OLED and a pixel driving circuit for controlling the organic light-emitting diode OLED. The pixel driving circuit may include seven thin film transistors T1 to T7 and one storage capacitor Cst.

A driving transistor controls driving current supplied to the organic light-emitting diode OLED. The output electrode of the second transistor T2 is electrically connected to the organic light-emitting diode OLED. The output electrode of the second transistor T2 may directly contact the anode of the organic light-emitting diode OLED or may be connected via another transistor (the sixth transistor T6 in the exemplary embodiment of the inventive concept).

The control electrode of the control transistor may receive a control signal. The control signal applied to the ith pixel PXi may include an (i−1)th gate signal Si-1, an ith gate signal Si, an (i+1)th gate signal Si+1, a kth data signal Dk, and an ith light-emitting control signal Ei. In the exemplary embodiment of the inventive concept, the control transistor may include a first transistor T1 and third to seventh transistors T3 to T7.

The first transistor T1 includes an input electrode connected to the kth data line DLk, a control electrode connected to the ith gate line GLi, and an output electrode connected to the output electrode of the second transistor T2. The first transistor T1 is turned on in response to a gate signal Si (hereinafter, an ith gate signal) applied to the ith gate line GLi, and provides the storage capacitor Cst with the data signal Dk applied to the kth data line DLk.

Figure 6B:
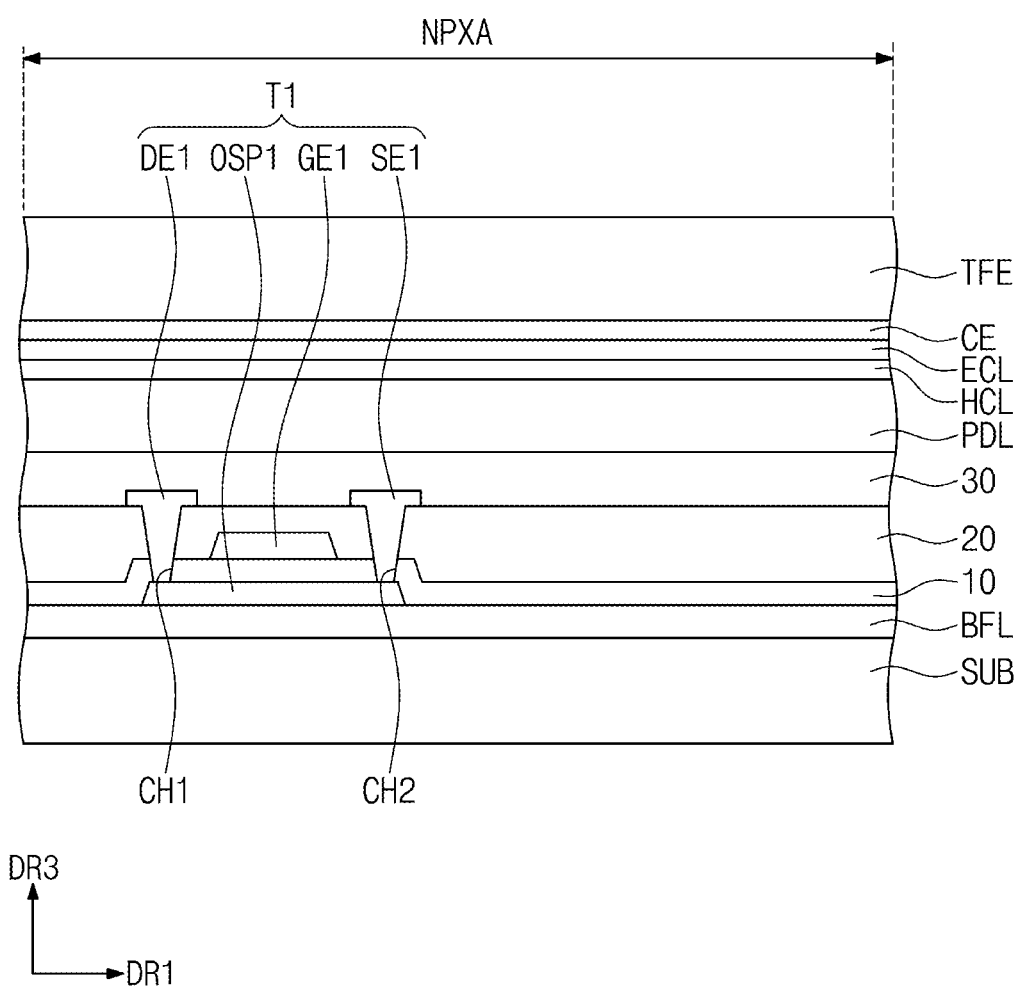
FIG. 6B is a partial cross-sectional view illustrating an organic light-emitting display panel according to an exemplary embodiment of the inventive concept.
Figure 6C:
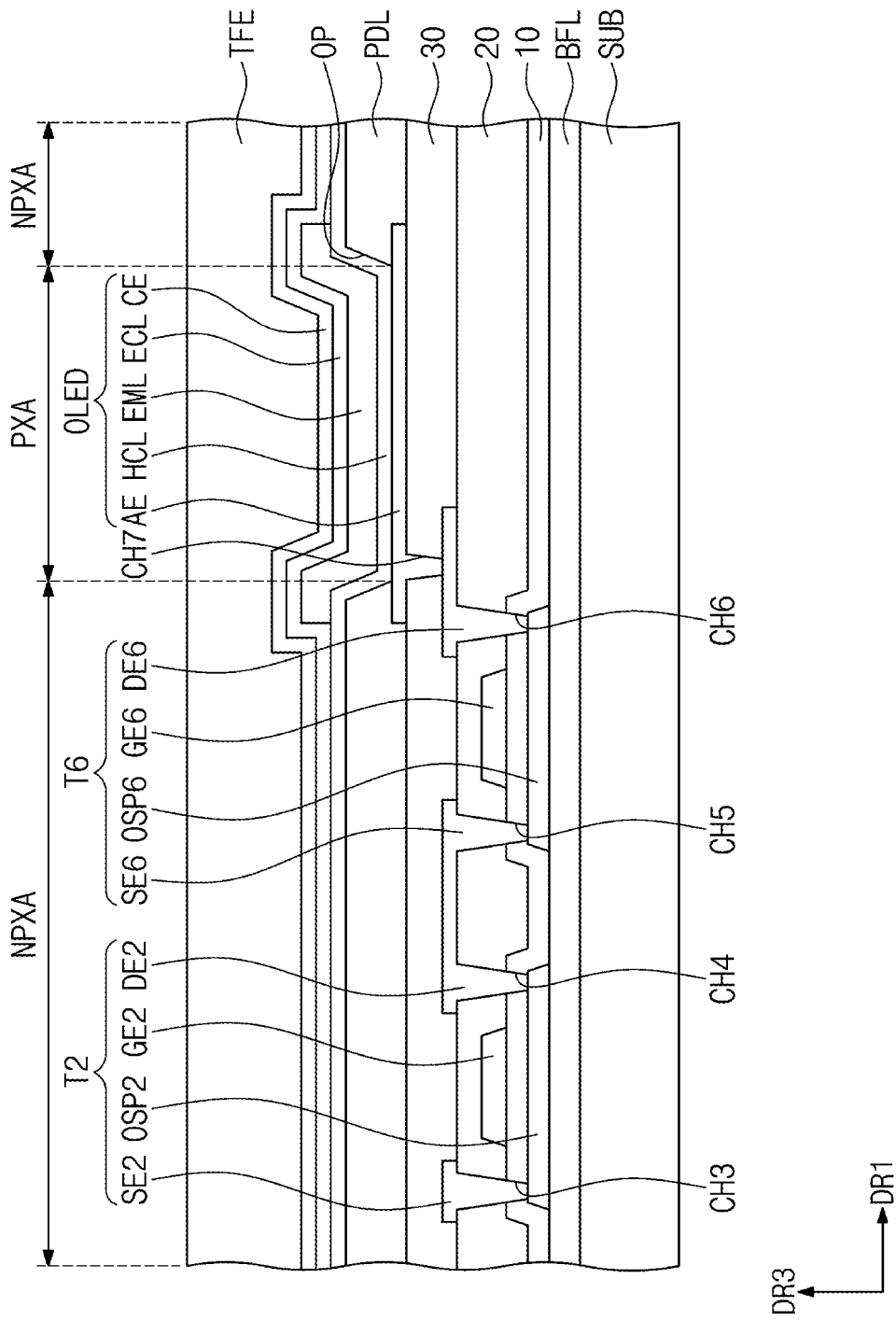
FIG. 6C is a partial cross-sectional view illustrating an organic light-emitting display panel according to an exemplary embodiment of the inventive concept.

FIG. 6B is a partial cross-sectional view illustrating an organic light-emitting display panel according to an exemplary embodiment of the inventive concept. FIG. 6C is a partial cross-sectional view illustrating an organic light-emitting display panel according to an exemplary embodiment of the inventive concept. Specifically, FIG. 6B illustrates a partial cross-sectional view of a portion corresponding to the first transistor T1 in the equivalent circuit diagram illustrated in FIG. 6A. FIG. 6C illustrates a partial cross-sectional view of a portion corresponding to the second transistor T2, the sixth transistor T6, and the organic light-emitting diode OLED in the equivalent circuit diagram illustrated in FIG. 6A.

Referring to FIGS. 6B and 6C, a buffer layer BFL may be disposed on a base substrate SUB. The buffer layer BFL improves the binding force between the base substrate SUB and conductive patterns or semiconductor patterns. The buffer layer BFL may include an inorganic layer. Although not separately shown, a barrier layer for preventing the penetration of foreign substances may further be disposed on the upper surface of the base substrate SUB. The buffer layer BFL and the barrier layer may be optionally disposed/omitted.

On the buffer layer BFL, a semiconductor pattern OSP1 (hereinafter, a first semiconductor pattern) of the first transistor T1, a semiconductor pattern OSP2 (hereinafter, a second semiconductor pattern) of the second transistor T2, and a semiconductor pattern OSP6 (hereinafter, a sixth semiconductor pattern) of the sixth transistor T6 are disposed. The first semiconductor pattern OSP1, the second semiconductor pattern OSP2, and the sixth semiconductor pattern OSP6 may be selected from amorphous silicon, poly silicon, or a metal oxide semiconductor.

A first insulating layer 10 may be disposed on the first semiconductor pattern OSP1, the second semiconductor pattern OSP2, and the sixth semiconductor pattern OSP6. FIGS. 6B and 6C exemplarily illustrate that the first insulating layer 10 is provided as a layered shape covering the first semiconductor pattern OSP1, the second semiconductor pattern OSP2, and the sixth semiconductor pattern OSP6, but the first insulating layer 10 may also be provided as a pattern disposed corresponding to the first semiconductor pattern OSP1, the second semiconductor pattern OSP2, and the sixth semiconductor pattern OSP6.

The first insulating layer 10 may include a plurality of inorganic thin films. The plurality of inorganic thin films each may include a silicon nitride layer, a silicon oxy nitride layer, and a silicon oxide layer.

On the first insulating layer 10, the control electrode GE1 (hereinafter, the first control electrode) of the first transistor T1, the control electrode GE2 (hereinafter, the second control electrode) of the second transistor T2, and the control electrode GE6 (hereinafter, the sixth control electrode) of the sixth transistor T6 are disposed. The first, second, and sixth control electrodes GE1, GE2, and GE6 may be manufactured through the same photolithography process as the gate lines GL (see FIG. 5A).

On the first insulating layer 10, a second insulating layer 20 covering the first, second, and sixth control electrodes GE1, GE2, and GE6 may be disposed. The second insulating layer 20 may provide a flat upper surface. The second insulating layer 20 may include an organic and/or inorganic material.

On the second insulating layer 20, the input electrode SE1 (hereinafter, the first input electrode) of the first transistor T1, the input electrode SE2 (hereinafter, the second input electrode) of the second transistor T2, and the input electrode SE6 (hereinafter, the sixth input electrode) of the sixth transistor T6 are disposed.

The first input electrode SE1 and a first output electrode DE1 are connected to the first semiconductor pattern OSP1 respectively through first and second through holes CH1 and CH2 which penetrate through the first insulating layer 10 and the second insulating layer 20. The second input electrode SE2 and a second output electrode DE2 are connected to the second semiconductor pattern OSP2 respectively through third and fourth through holes CH3 and CH4, which penetrate through the first insulating layer 10 and the second insulating layer 20. The sixth input electrode SE6 and a sixth output electrode DE6 are connected to the sixth semiconductor pattern OSP6 through fifth and sixth through holes CH5 and CH6, respectively, which penetrate through the first insulating layer 10 and the second insulating layer 20. Also, in another exemplary embodiment of the inventive concept, the first, second, and sixth transistors T1, T2, and T6 may be implemented in a bottom gate structure.

On the second insulating layer 20, a third insulating layer 30 covers the first, second, and sixth input electrodes SE1, SE2, and SE6, and the first, second, and sixth output electrodes DE1, DE2, and DE6. The third insulating layer 30 includes an organic and/or inorganic layer. In particular, the third insulating layer 30 may include an organic material to provide a flat surface.

Any one of the first, second, and third insulating layers 10, 20, and 30 need not be provided according to circuit structures of the pixels PX. Each of the second and third insulating layers 20 and 30 may be defined as an interlayer insulating layer. The interlayer insulating layer is disposed between the conductive pattern disposed thereunder and the conductive pattern disposed thereover, and thereby insulates the conductive patterns.

A pixel defining layer PDL and the organic light-emitting diode OLED are disposed on the third insulation layer 30. An anode AE is disposed on the third insulation layer 30. The anode AE is connected to the sixth output electrode DE6 through a seventh through hole CH7 passing through the third insulating layer 30. An opening part OP is defined in the pixel defining layer PDL. The opening part OP of the pixel defining layer PDL exposes at least a portion of the anode AE.

Pixels PX may be disposed in a pixel region when viewed in a plan view. The pixel region may include a light-emitting region PXA and a non-light-emitting region NPXA adjacent to the light-emitting region PXA. The non-light-emitting region NPXA may surround the light-emitting region PXA. In the present exemplary embodiment, the light-emitting region PXA is defined to correspond to some regions of the anode AE exposed through the opening part OP.

A hole control layer HCL may be disposed in both the light-emitting region PXA and the non-light-emitting region NPXA. Although not separately shown, a common layer, such as the hole control layer HCL may be formed in common in the plurality of pixels PX (see FIG. 5A).

An organic light-emitting layer EML is disposed on the hole control layer HCL. The organic light-emitting layer EML may be disposed in a region corresponding to the opening part OP. That is, the organic light-emitting layer EML may be formed to be separated into each of the plurality of pixels PX. In the present exemplary embodiment, the patterned organic light-emitting layer EML is exemplarily illustrated, but the organic light-emitting layer EML may be disposed in common in the plurality of pixels PX. Here, the organic light-emitting layer EML may generate white light. Also, the organic light-emitting layer EML may have a multilayer structure.

An electron control layer ECL is disposed on the organic light-emitting layer EML. Although not separately shown, the electron control layer ECL may be formed in common in the plurality of pixels PX (see FIG. 5A).

A cathode CE is disposed on the electron control layer ECL. The cathode CE is disposed in common in the plurality of pixels PX.

An encapsulating layer TFE is disposed on the cathode CE. The encapsulating layer TFE is disposed in common in the plurality of pixels PX. The encapsulating layer TFE includes at least one inorganic layer and at least one organic layer. The encapsulating layer TFE may include a plurality inorganic layers and a plurality of organic layers which are alternately laminated.

In the current exemplary embodiment, the encapsulating layer TFE directly covers the cathode CE. In an exemplary embodiment of the inventive concept, a capping layer, which covers the cathode CE, may be further disposed between the encapsulating layer TFE and the cathode CE. Here, the encapsulating layer TFE may directly cover the capping layer.

Figure 7A:
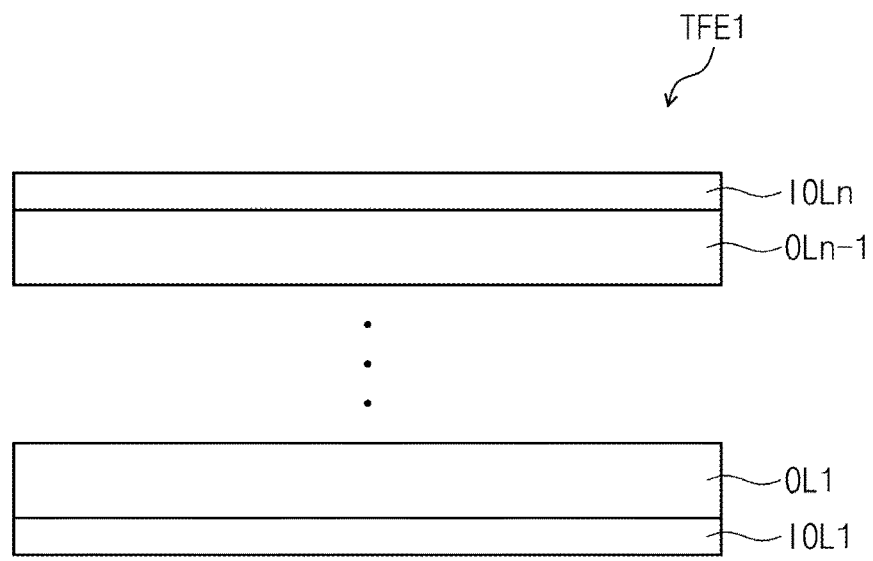
FIG. 7A, FIG. 7B, and FIG. 7C are cross-sectional views illustrating encapsulating layers according to exemplary embodiments of the inventive concept.
Figure 7B:
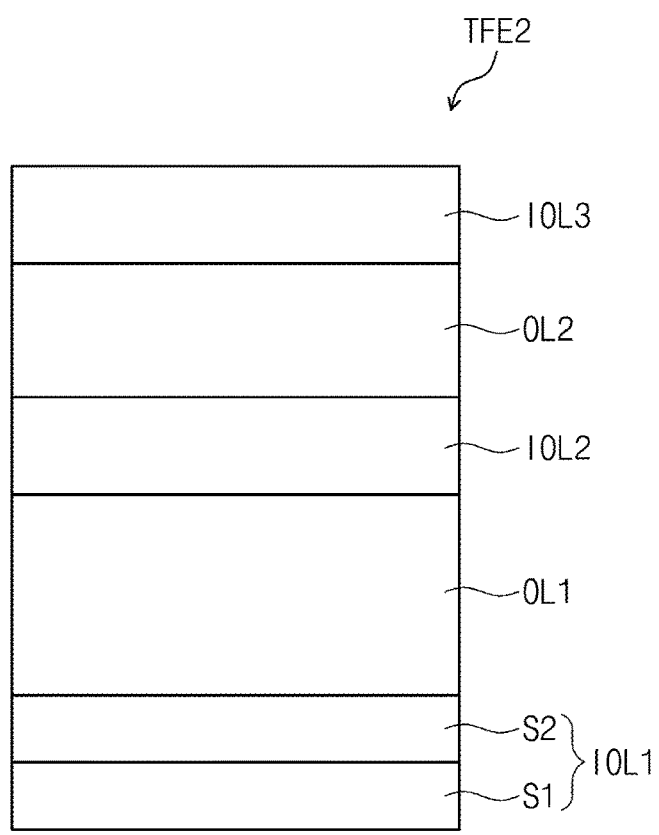
Figure 7C:
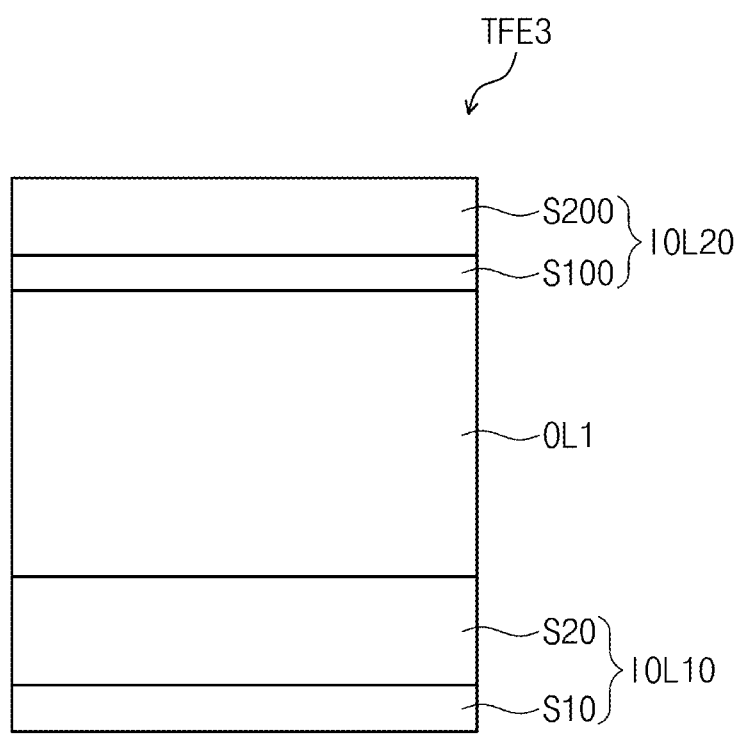

FIGS. 7A to 7C are cross-sectional views illustrating examples of encapsulating layers TFE1, TFE2, and TFE3, which are included in a display apparatus of an exemplary embodiment. As illustrated in FIG. 7A, the encapsulating layer TFE1 may include n inorganic thin films IOL1 to IOLn including a first inorganic thin film IOL1 disposed on a cathode CE (FIG. 6C). Also, the first inorganic thin film IOL1 may be disposed to directly contact the cathode CE (FIG. 6C). The first inorganic thin film IOL1 may be defined as a lower inorganic thin film, and inorganic thin films, except for the first inorganic thin film IOL1 from n inorganic thin films, may be defined as upper inorganic thin films.

The encapsulating layer TFE1 may include n-1 organic thin films OL1 to OLn-1, and the n-1 organic thin films OL1 to OLn-1 may be alternately disposed with n inorganic thin films IOL1 to IOLn.

The n-1 organic thin films OL1 to OLn-1 may have an average thickness greater than that of the n inorganic thin films IOL1 to IOLn.

Each of the n inorganic thin films IOL1 to IOLn may have a single layer including one material or may have a multi-layer each of which includes a material different from each other. Each of the n-1 organic thin films OL1 to OLn-1 may be formed by being provided with organic monomers. The organic monomers may include an acryl-based monomer. For example, each of the n-1 organic thin films OL1 to OLn-1 may be formed by being coated with a composition including an acryl-based monomer. Specifically, the organic thin films OL1 to OLn-1 may be formed by using an inkjet printing method. In an exemplary embodiment of the inventive concept, the encapsulating layer TFE1 may further include nth organic thin film.

As illustrated in FIGS. 7B and 7C, the inorganic thin films included in each of the encapsulating layers TFE2 and TFE3 may have the same inorganic materials or inorganic materials different from each other, and have the same thickness or thicknesses different from each other. The organic thin films included in each of the encapsulating layers TFE2 and TFE3 may have the same organic materials or organic materials different from each other, and may have the same thickness or thicknesses different from each other.

As illustrated in FIG. 7B, the encapsulating layer TFE2 may include a first inorganic thin film IOL1, a first organic thin film OL1, a second inorganic thin film IOL2, a second organic thin film OL2, and a third inorganic thin film IOL3. The first inorganic thin film IOL1 may have a double-layer structure. First and second sub layers S1 and S2 may include inorganic materials different from each other.

As illustrated in FIG. 7C, the encapsulating layer TFE3 may include a first inorganic thin film IOL10, a first organic thin film OL1, and a second inorganic thin film IOL20. The first inorganic thin film IOL10 may have a double-layer structure. First and second sub layers S10 and S20 may include inorganic materials different from each other. The second inorganic thin film IOL20 may have a double-layer structure. The second inorganic thin film IOL20 may include a first sub layer S100 and a second sub layer S200, which may be deposited under deposition environments that are different from each other. For example, the first sub layer S100 may be deposited under a low power condition, and the second sub layer S200 may be deposited under a high power condition. The first and second sub layers S100 and S200 may include the same inorganic material.

Also, an inorganic layer may further be disposed on the encapsulating layer TFE. The inorganic layer may be a buffer layer. In an exemplary embodiment, a touch sensing unit TS may be disposed over the buffer layer disposed on the encapsulating layer TFE.

Figure 8:
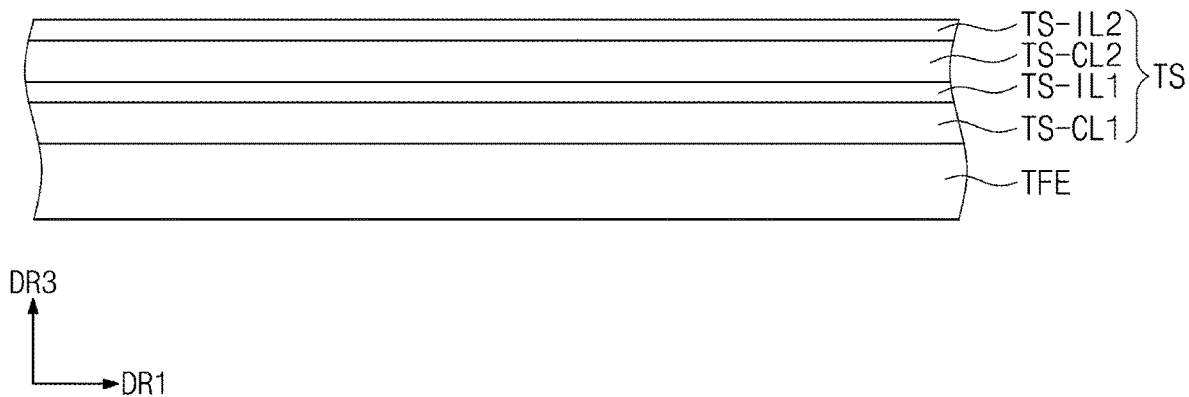
FIG. 8 is a cross-sectional view illustrating a touch sensing unit according to an exemplary embodiment of the inventive concept.

FIG. 8 is a view illustrating a cross-section of a touch sensing unit TS included in a display apparatus of an exemplary embodiment. The touch sensing unit TS may include a first conductive layer TS-CL1, a first insulating layer TS-IL1, a second conductive layer TS-CL2, and a second insulating layer TS-IL2. The first conductive layer TS-CL1 may be directly disposed on an encapsulating layer TFE. However, the exemplary embodiment of the inventive concept is not limited thereto, and another inorganic layer (for example, a buffer layer) may further be disposed between the first conductive layer TS-CL1 and the encapsulating layer TFE.

Each of the first conductive layer TS-CL1 and the second conductive layer TS-CL2 may have a single layer structure or may have a multilayer structure laminated in a third direction DR3. The multilayer-structured conductive layer may include at least two or more layers of transparent conductive layers and metal layers. The multilayer-structured conductive layer may include metal layers including metals different from each other. The transparent conductive layer may include indium tin oxide (ITO), indium zinc oxide (IZO), zinc oxide (ZnO), indium tin zinc oxide (ITZO), PEDOT, metal nanowires, or graphene. The metal layer may include molybdenum, silver, titanium, copper, aluminum, and alloys thereof.

Each of the first conductive layer TS-CL1 and the second conductive layer TS-CL2 includes a plurality of patterns. Hereinafter, it will be described that the first conductive layer TS-CL1 includes first conductive patterns, and the second conductive layer TS-CL2 includes second conductive patterns. Each of the first conductive patterns and the second conductive patterns may include a touch electrode and touch signal lines.

Each of the first insulating layer TS-IL1 and the second insulating layer TS-IL2 may include an inorganic or organic material. The inorganic material may include at least one of aluminum oxide, titanium oxide, silicon oxide, silicon nitride, silicon oxy nitride, zirconium oxide, or hafnium oxide. The organic material may include at least any one of an acryl-based resin, a methacrylate-based resin, a polyisoprene-based resin, an epoxy-based resin, a urethane-based resin, a cellulose-based resin, a siloxane-based resin, a polyimide-based resin, a polyamide-based resin, or perylene-based resin.

Each of the first insulating layer TS-IL1 and the second insulating layer TS-IL2 may include a single-layer or multilayer structure. Each of the first insulating layer TS-IL1 and the second insulating layer TS-IL2 may include at least any one of an inorganic or organic layer. The inorganic and organic layers may be formed through a chemical vapor deposition method. The laminated structure of the touch sensing unit TS is not limited to that illustrated in FIG. 8. For example, a second insulating layer TS-IL2 of the touch sensing unit may not be provided.

The first insulating layer TS-IL1 has only to insulate the first conductive layer TS-CL1 and the second conductive layer TS-CL2, and the shape thereof is not limited. According to the shapes of the first conductive patterns and the second conductive patterns, the shape of the first insulating layer TS-IL1 may be changed. The first insulating layer TS-IL1 may be shaped to entirely cover the encapsulating layer TFE or include a plurality of insulating patterns. The plurality of insulating patterns need only to overlap first connecting parts CP1 or second connecting parts CP2.

In the present exemplary embodiment, a double-layer touch sensing unit is exemplarily illustrated, but the exemplary embodiment of the inventive concept is not limited thereto. A single-layer touch sensing unit includes a conductive layer and an insulating layer covering the conductive layer. The conductive layer includes touch sensors and a wiring part connected to the touch sensors. The single-layer touch sensing unit may obtain coordinate information through a self cap method.

Hereinafter, in FIGS. 9 to 19B, a display apparatus of an exemplary embodiment will be described. Hereinafter, in the description about the display apparatus of an exemplary embodiment, contents overlapping the contents described in detail in FIGS. 1 to 8 will not be described again, and the difference will be mainly described.

Figure 9:
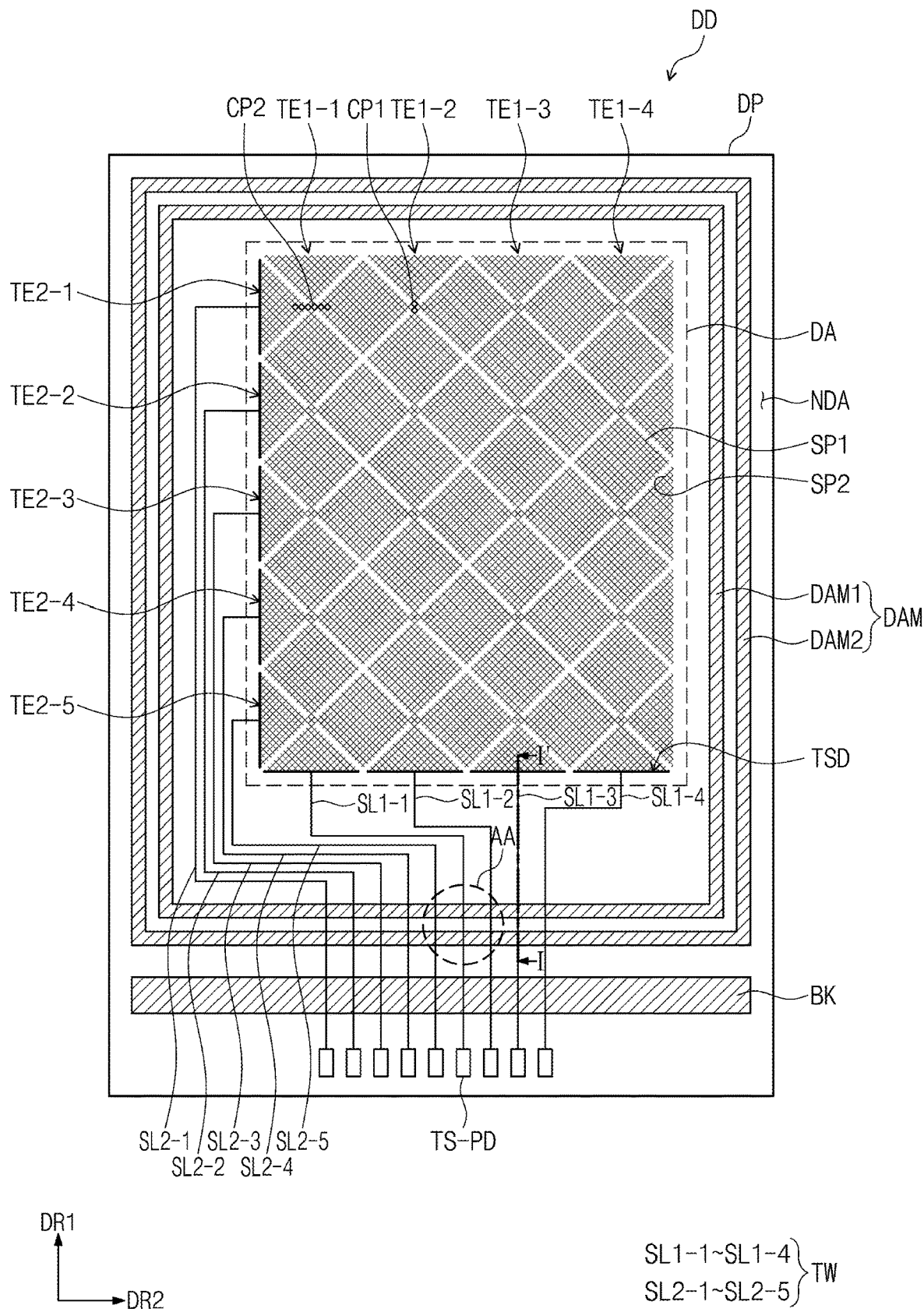
FIG. 9 is a plan view of a display apparatus according to an exemplary embodiment of the inventive concept.
Figure 10A:
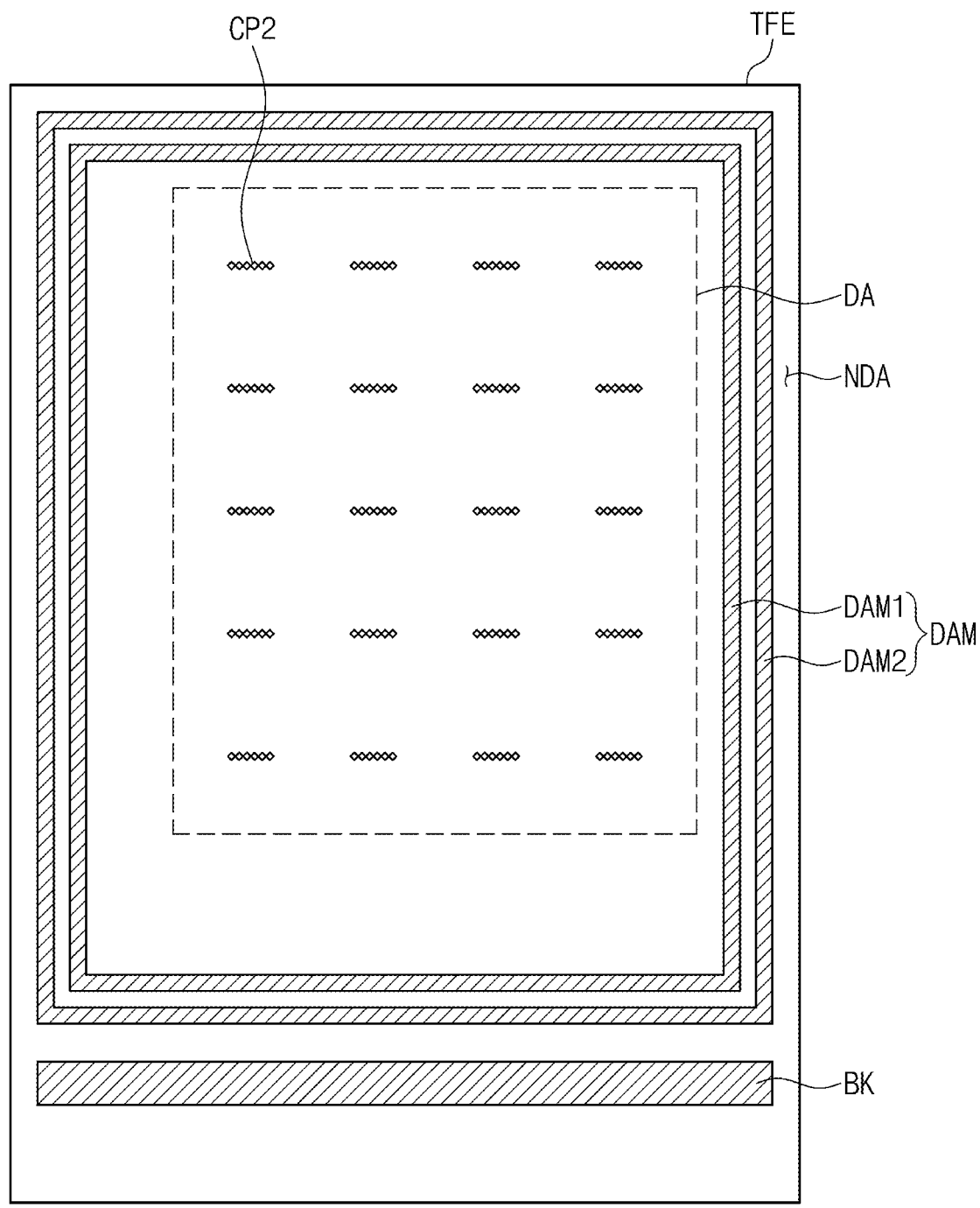
FIG. 10A, FIG. 10B, and FIG. 10C are plan views illustrating a touch sensing unit according to exemplary embodiments of the inventive concept.
Figure 10B:
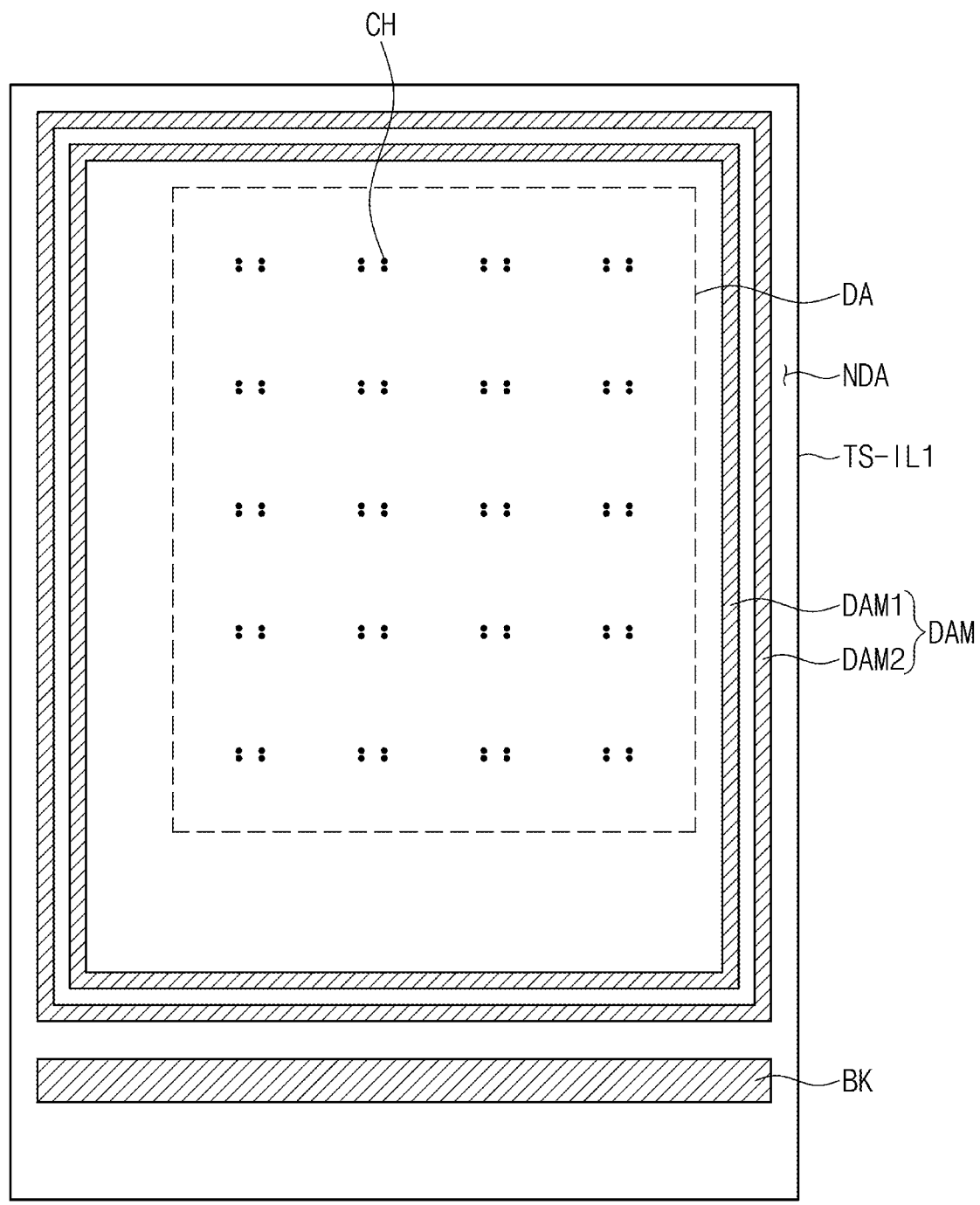
Figure 10C:
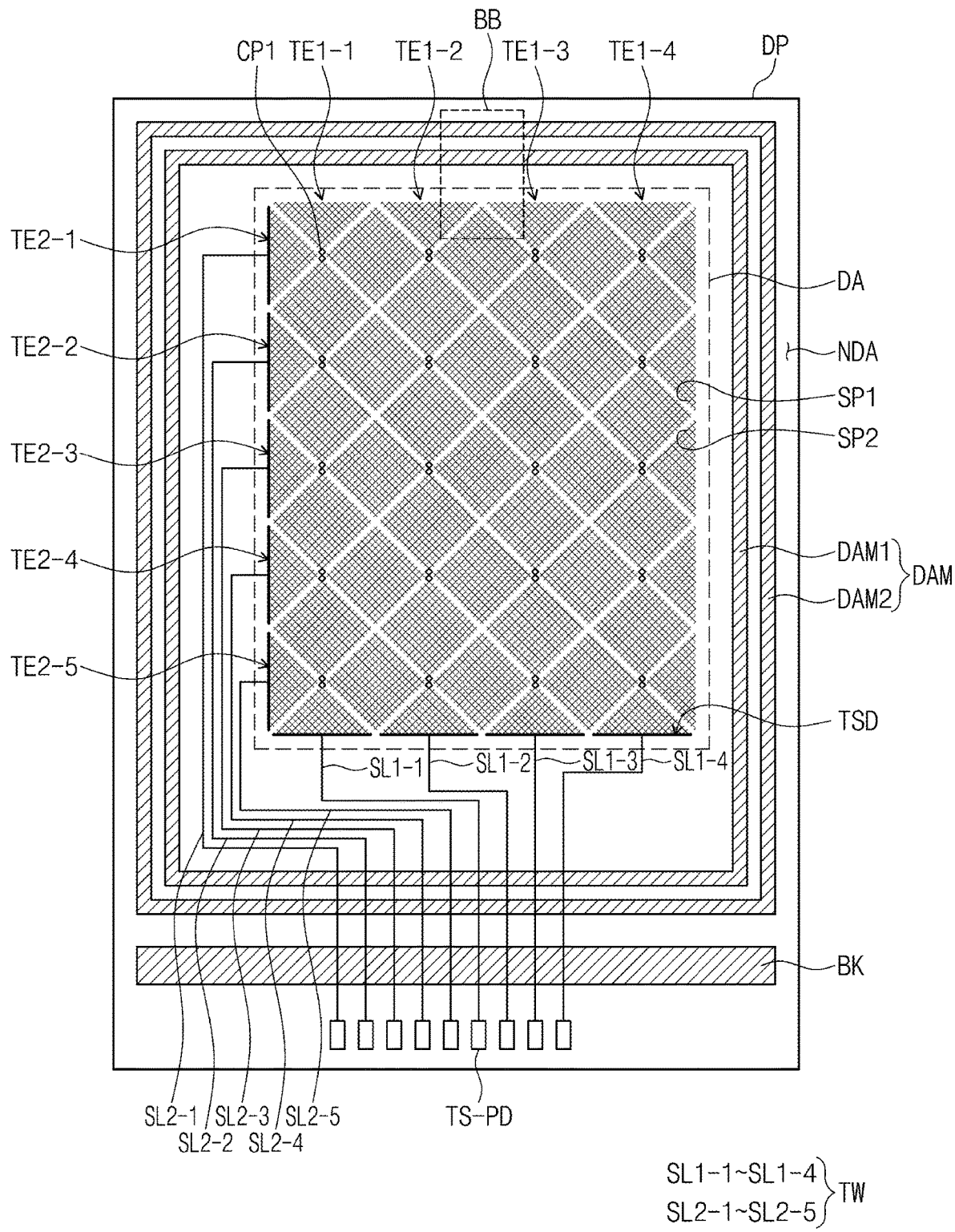
Figure 10D:
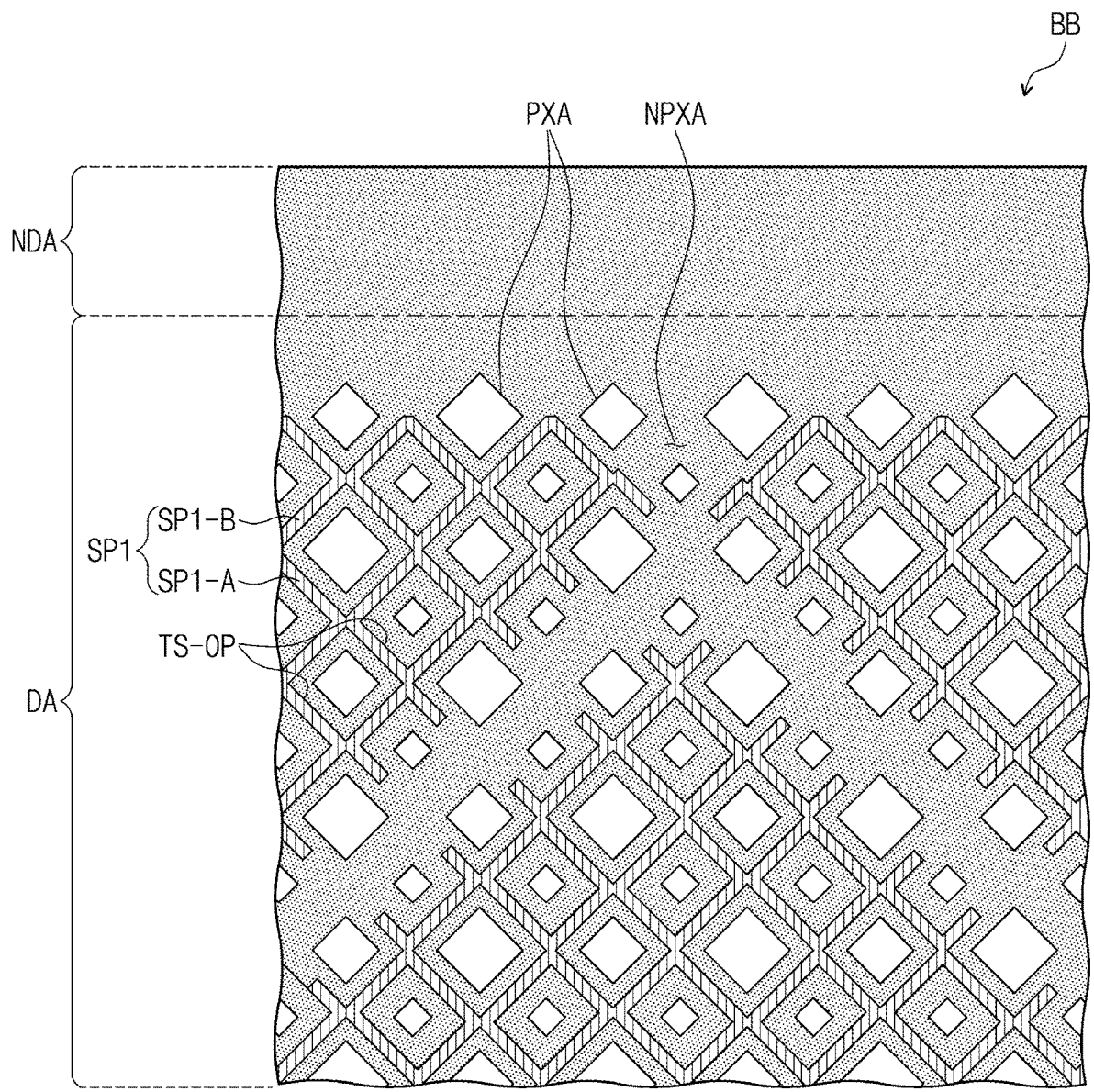
FIG. 10D is an enlarged view of region BB of FIG. 10C.
Figure 11:
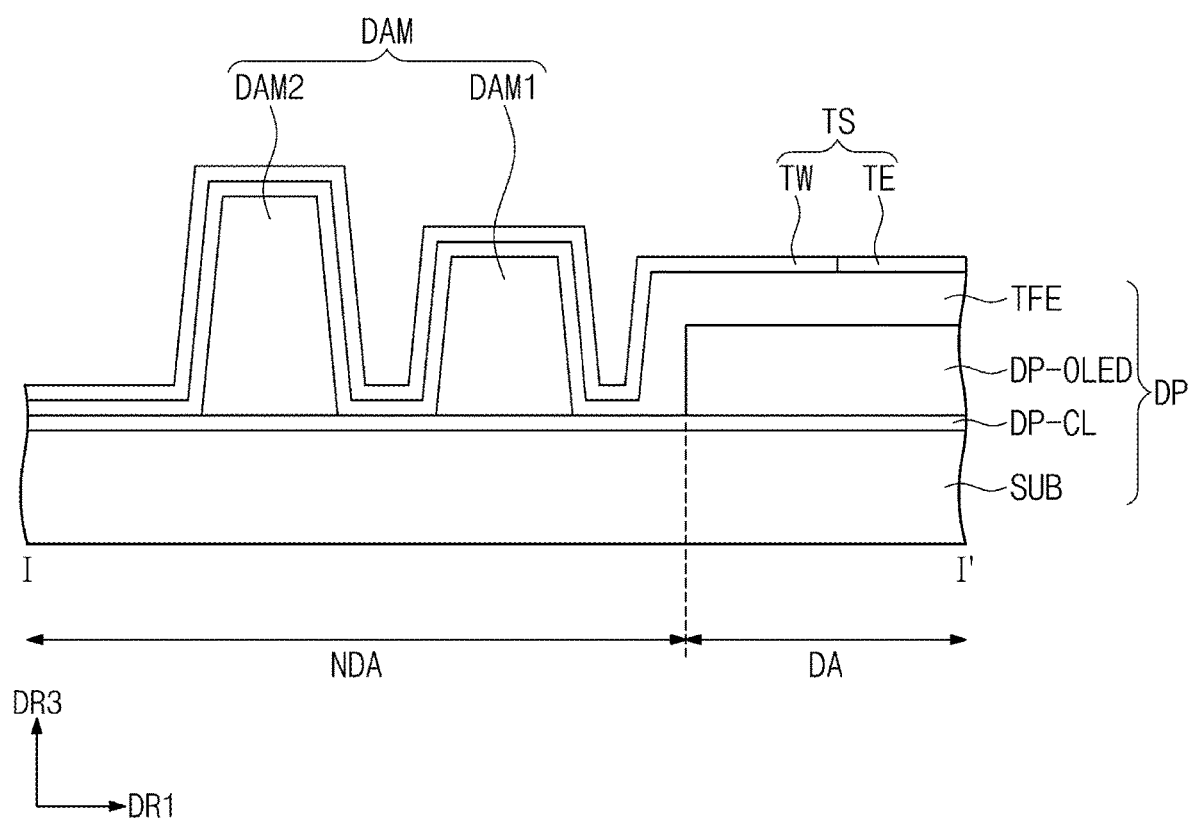
FIG. 11 is a cross-sectional view taken along line I-I' of FIG. 9.

FIG. 9 is a plan view of a display apparatus according to an exemplary embodiment of the inventive concept. FIGS. 10A to 10C illustrate a plan view of a touch sensing unit TS included in the display apparatus of an exemplary embodiment of FIG. 9. FIG. 10D is an enlarged view of a region BB of FIG. 10C. FIG. 11 is a view illustrating a cross-section of a display apparatus of an exemplary embodiment corresponding to line I-I' of FIG. 9.

A display apparatus of an exemplary embodiment may include a base substrate SUB, a circuit layer DP-CL, a light-emitting element layer DP-OLED, an encapsulating layer TFE, a touch sensing unit TS disposed on the encapsulating layer TFE, and a protruding member DAM. An organic light-emitting display panel DP may include the base substrate SUB, the circuit layer DP-CL, the light-emitting element layer DP-OLED and the encapsulating layer TFE. Referring to FIGS. 9 and 11, a display apparatus DD of an exemplary embodiment may include an organic light-emitting display panel DP, a touch sensing unit TS disposed on the organic light-emitting display panel DP, and a protruding member DAM.

The contents described in detail in the description of FIG. 5B may be applied, as is, to the organic light-emitting display panel DP. The display apparatus DD of an exemplary embodiment may include the base substrate SUB which is divided into a display region DA and a non-display region NDA. The display apparatus DD of an exemplary embodiment may include the circuit layer DP-CL disposed on the base substrate SUB, and the light-emitting element layer DP-OLED disposed in the display region DA of the base substrate SUB. The encapsulating layer TFE may be disposed to cover the light-emitting element layer DP-OLED.

Also, the protruding member DAM may be disposed in the non-display region NDA of the base substrate SUB. At least one protruding member DAM may be disposed in the non-display region NDA. For example, one protruding member DAM or two or more protruding members DAM may be disposed in the non-display region NDA. Also, when the protruding member DAM is disposed in the non-display region NDA, one protruding member DAM is disposed in a portion of the non-display region NDA, and a plurality of protruding members DAM may be disposed in the remaining portions. Also, when the plurality of protruding members DAM are disposed, the number of the disposed protruding members may be changed according to the position of the non-display region NDA. Also, the encapsulating layer TFE may be disposed to cover the protruding member DAM and extend to the non-display region NDA of the base substrate SUB. Here, the encapsulating layer TFE covering the protruding member DAM may be configured from only inorganic thin films IOL1 to IOLn (FIG. 7A) excluding organic thin films OL1 to OLn-1 (FIG. 7A). However, the exemplary embodiment of the inventive concept is not limited thereto, and the encapsulating layer TFE may include all the inorganic thin films IOL1 to IOLn (FIG. 7A) and the organic thin films OL1 to OLn-1 (FIG. 7A) disposed between the inorganic thin films IOL1 to IOLn (FIG. 7A), also in a portion covering the protruding member DAM. Also, when the plurality of protruding members DAM are disposed, the encapsulating layer TFE surrounding a first protruding member DAM1 which is the protruding member DAM closer to the display region DA may include the organic thin films OL1 to OLn-1 (FIG. 7A) disposed between the inorganic thin films IOL1 to IOLn (FIG. 7A). In comparison with this, the encapsulating layer TFE surrounding the second protruding member DAM2 disposed outside the first protruding member DAM1 may be configured from only the inorganic thin films IOL1 to IOLn (FIG. 7A).

The protruding member DAM may be disposed in the non-display region NDA. The protruding member DAM may be disposed outside the display region DA. The protruding member DAM may be disposed to surround the display region DA. The protruding member DAM may include a first protruding member DAM1 disposed substantially adjacent to the display region DA and a second protruding member DAM2 disposed outside the first protruding member DAM1. The second protruding member DAM2 may have a thickness greater than the first protruding member DAM1 in the third direction DR3. For example, the first protruding member DAM1 prevents the organic monomer formed by coating the organic thin films OL1 to OLn-1 (FIG. 7A) from flowing to the outside.

The protruding member DAM may be formed of a plurality of layers. For example, two layers may be laminated in the first protruding member DAM1, and three layers may be laminated in the second protruding member DAM2. FIG. 9 illustrates the protruding member DAM surrounding the entire display region DA, but the exemplary embodiment of the inventive concept is not limited thereto. For example, the protruding member DAM may be disposed at at least one side of the display region DA.

Although not illustrated in FIG. 9, the display apparatus DD of an exemplary embodiment may further include a side surface protruding member (not shown) disposed in the non-display region NDA of the base substrate SUB. The side surface protruding member (not shown) may be disposed outside the second protruding member DAM2. For example, the side surface protruding member (not shown) may be disposed to extend in the first direction DR1 from the edge of the second protruding member DAM2. The side surface protruding member (not shown) may provide a fracture prevention function, which prevents shock from being transferred toward the display region DA by absorbing the shock when external stimulation is applied.

Also, the display apparatus DD of an exemplary embodiment may further include a bank part BK disposed outside the second protruding member DAM2 to be adjacent to a touch pad TS-PD. Also, the bank part BK may be a third protruding member which is disposed outside the second protruding member DAM2 to extend in the second direction DR2. The bank part BK may provide a spacer function such that a mask used in the manufacturing process of the organic light-emitting display panel DP and the touch sensing unit TS does not directly contact the configuration of the organic light-emitting display panel DP or the touch sensing unit TS. The thickness of the bank part BK may be greater than that of the first protruding member DAM1 or the second protruding member DAM2.

In an exemplary embodiment, the bank part BK need not be provided. Also, in an exemplary embodiment, any one of the side surface protruding member (not shown) and the bank part need not be provided.

The touch sensing unit TS may be disposed on the encapsulating layer TFE. The touch sensing unit TS may include a touch electrode TE and a wiring part TW. The touch electrode TE may be disposed on the encapsulating layer TFE of the display region DA, and the wiring part TW may be connected to the touch electrode TE and disposed on the protruding member DAM. The wiring part TW may be disposed on the protruding member DAM along the step of the protruding member DAM. The wiring part TW may extend from the touch electrode TE to be connected to the touch pad TS-PD.

In the plan view of FIG. 9, the touch sensing unit TS may include first touch electrodes TE1-1 to TE1-4, first touch signal lines SL1-1 to SL1-4 connected to the first touch electrodes TE1-1 to TE1-4, second touch electrodes TE2-1 to TE2-5, second touch signal lines SL2-1 to SL2-5 connected to the second touch electrodes TE2-1 to TE2-5. Also, connecting electrodes TSD may be disposed between the first touch electrodes TE1-1 to TE1-4 and the first touch signal lines SL1-1 to SL1-4 and between the second touch electrodes TE2-1 to TE2-5 and the second touch signal lines SL2-1 to SL2-5. The connecting electrodes TSD may be connected to the end of each of the first touch electrodes TE1-1 to TE1-4 and the second touch electrodes TE2-1 to TE2-5 and may thereby transmit signals. In another exemplary embodiment of the inventive concept, the connecting electrodes TSD need not be provided.

In FIG. 9, the first touch signal lines SL1-1 to SL1-4 and the second touch signal lines SL2-1 to SL2-5 connect the touch electrode TE and the touch pad TS-PD, and correspond to the wiring part TW of the inventive concept. The wiring part TW illustrated in FIG. 11 may represent any one of the first touch signal lines SL1-1 to SL1-4 and the second touch signal lines SL2-1 to SL2-5. Also, the touch electrode TE illustrated in FIG. 11 may be any one of the first touch electrodes TE1-1 to TE1-4 or the second touch electrodes TE2-1 to TE2-5.

In FIG. 9, the touch sensing unit TS including the four first touch electrodes TE1-1 to TE1-4 and the five second touch electrodes TE2-1 to TE2-5 is exemplarily illustrated, but the exemplary embodiment of the inventive concept is not limited thereto.

Each of the first touch electrodes TE1-1 to TE1-4 may have a mesh shape in which a plurality of touch openings are defined. Each of the first touch electrodes TE1-1 to TE1-4 may include a plurality of first touch sensor parts SP1 and a plurality of first connecting parts CP1. The first touch sensor parts SP1 are arranged in the first direction DR1. Each of the first connecting parts CP1 connects the first touch sensor parts SP1, which are adjacent to each other from among the first touch sensor parts SP1. Although not specifically illustrated, the first touch signal lines SL1-1 to SL1-4 may also have mesh shapes.

The second touch electrodes TE2-1 to TE2-5 cross the first touch electrodes TE1-1 to TE1-4 in an insulating manner. Each of the second touch electrodes TE2-1 to TE2-5 may have a mesh shape in which a plurality of touch openings are defined. Each of the second touch electrodes TE2-1 to TE2-5 may include a plurality of second touch sensor parts SP2 and a plurality of second connecting parts CP2. The second touch sensor parts SP2 are arranged in the second direction DR2. Each of the second connecting parts CP2 connects the second touch sensor parts SP2 which are adjacent to each other from among the second touch sensor parts SP2. The second touch signal lines SL2-1 to SL2-5 may also have mesh shapes.

The first touch electrodes TE1-1 to TE1-4 and the second touch electrodes TE2-1 to TE2-5 are electrostatically coupled. Since the touch sensing signals are applied to the first touch electrodes TE1-1 to TE1-4, capacitors are formed between the first and second touch sensor parts SP1 and SP2.

Some portions of the plurality of first touch sensor parts SP1, the plurality of first connecting parts CP1, the plurality of first touch signal lines SL1-1 to SL1-4, the plurality of second touch sensor parts SP2, the plurality of second connecting parts CP2, and the plurality of second touch signal lines SL2-1 to SL2-5 may be formed by patterning the first conductive layer TS-CL1 illustrated in FIG. 8, and other portions may be formed by patterning the second conductive layer TS-CL2 illustrated in FIG. 8.

In order to electrically connect the conductive patterns disposed on different layers, contact holes passing through the first insulating layer TS-IL1 illustrated in FIG. 8 may be formed. Hereinafter, referring to FIGS. 10A to 10C, the touch sensing unit TS according to an exemplary embodiment will be described. In FIG. 10A to FIG. 10C, the first to third protruding members DAM1, DAM2, and BK may be disposed in the non-display region NDA.

As illustrated in FIG. 10A, the first conductive patterns are disposed on the encapsulating layer TFE. The first conductive patterns may include bridge patterns. The bridge patterns are directly disposed on the encapsulating layer TFE. The bridge patterns correspond to the second connecting parts CP2 illustrated in FIG. 9.

As illustrated in FIG. 10B, the first insulating layer TS-IL1 covering the bridge patterns CP2 is disposed on the encapsulating layer TFE. Contact holes CH partially exposing the bridge patterns CP2 are defined in the first insulating layer TS-IL1. The contact holes CH may be formed through a photolithography process.

As illustrated in FIG. 10C, the second conductive patterns may be disposed on the first insulating layer TS-IL 1. The second conductive patterns may include the plurality of first touch sensor parts SP1, the plurality of first connecting parts CP1, the first touch signal lines SL1-1 to SL1-4, the plurality of second touch sensor parts SP2, and the second touch signal lines SL2-1 to SL2-5. Although not separately shown, a second touch insulating layer TS-IL2 covering the second conductive patterns is disposed on the first touch insulating layer TS-IL1.

In another exemplary embodiment of the inventive concept, the first conductive patterns may include the first touch electrodes TE1-1 to TE1-4 and the first touch signal lines SL1-1 to SL1-4. The second conductive patterns may include the second touch electrodes TE2-1 to TE2-5 and the second touch signal lines SL2-1 to SL2-5. Here, the contact holes CH are not defined in the first touch insulating layer TS-IL1.

Also, in an exemplary embodiment of the inventive concept, the first and second conductive patterns may be interchanged with each other. That is, the second conductive patterns may include bridge patterns CP2.

FIG. 10D is an enlarged view of region BB of FIG. 10C. As illustrated in FIG. 10D, the first touch sensor parts SP1 overlaps a non-light-emitting region NPXA. The first touch sensor part SP1 include a plurality of first extension parts SP1-A, which extend in a fifth direction DR5 crossing the first direction DR1 and the second direction DR2, and a plurality of second extension parts SP1-B which extend in a sixth direction DR6 crossing the fifth direction DR5. The plurality of first extension parts SP1-A and the plurality of second extension parts SP1-B may be defined as a mesh line. The width of the mesh line may be several micrometers.

The plurality of first extension parts SP1-A and the plurality of second extension parts SP1-B may be connected to each other to form a plurality of touch openings TS-OP. In other words, the first touch sensor part SP1 has a mesh shape provided with the plurality of touch openings TS-OP. The touch openings TS-OP are illustrated to correspond one-to-one to a light-emitting region PXA, but the exemplary embodiment of the inventive concept is not limited thereto. One touch opening TS-OP may correspond to two or more light-emitting regions PXA.

The sizes of the light-emitting regions PXA may be diverse. For example, the sizes of the light-emitting regions PXA providing blue light and the light-emitting regions PXA providing red light may be different. Accordingly, the sizes of the touch openings TS-OP may also be diverse. In FIG. 10D, the sizes of the light-emitting regions PXA are illustrated to be diverse, but the exemplary embodiment of the inventive concept is not limited thereto. The sizes of the light-emitting regions PXA may be the same as each other, and the sizes of the touch openings TS-OP may be the same as each other.

In the exemplary embodiment illustrated in FIGS. 9 and 10C, the protruding member DAM is disposed in the non-display region NDA, and the first and second protruding members DAM1 and DAM2 may be disposed to surround the touch electrodes TE1-1 to TE1-4 and TE2-1 to TE2-5, which are disposed in the display region DA. Also, the wiring part TW is illustrated to only pass the protruding member DAM adjacent to the touch pad TS-PD, but the exemplary embodiment of the inventive concept is not limited thereto. The wiring part TW may be disposed to pass not only a portion adjacent to the touch pad TS-PD, but also other portions of the protruding member DAM. For example, the second touch signal lines SL2-1 to SL2-5, which are the wiring parts TW, may be disposed to pass at least one of the first to second protruding members DAM1 and DAM2 which extend in the first direction DR1. Also, the bank part BK may be disposed on one side outside the second protruding member DAM2 as a third protruding member, and the wiring part TW may pass the bank part BK to be connected to the touch pad TS-PD.

Figure 12:
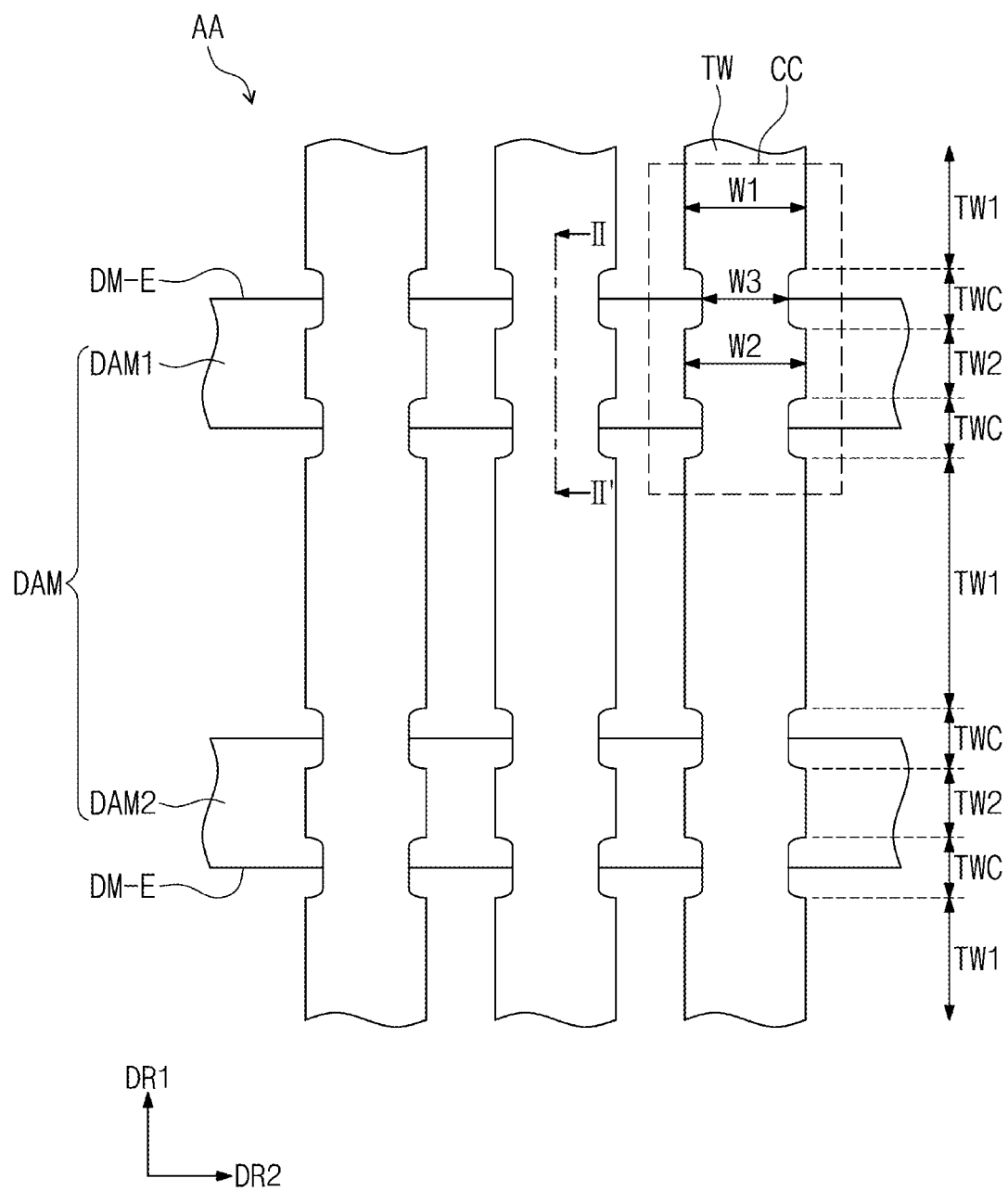
FIG. 12 is an enlarged plan view illustrating region AA of FIG. 9.

FIG. 12 is an enlarged plan view illustrating region AA of FIG. 9. FIG. 12 is an enlarged plan view illustrating the wiring part TW connecting the touch electrode and the touch pad TS-PD (FIG. 9). The touch electrode may be any one of the first touch electrodes TE1-1 to TE1-4 and the second touch electrodes TE2-1 to TE2-5. The wiring part TW may represent any one of the first touch signal lines SL1-1 to SL1-4 (FIG. 9) and the second touch signal lines SL2-1 to SL2-5 (FIG. 9).

Figure 13A:
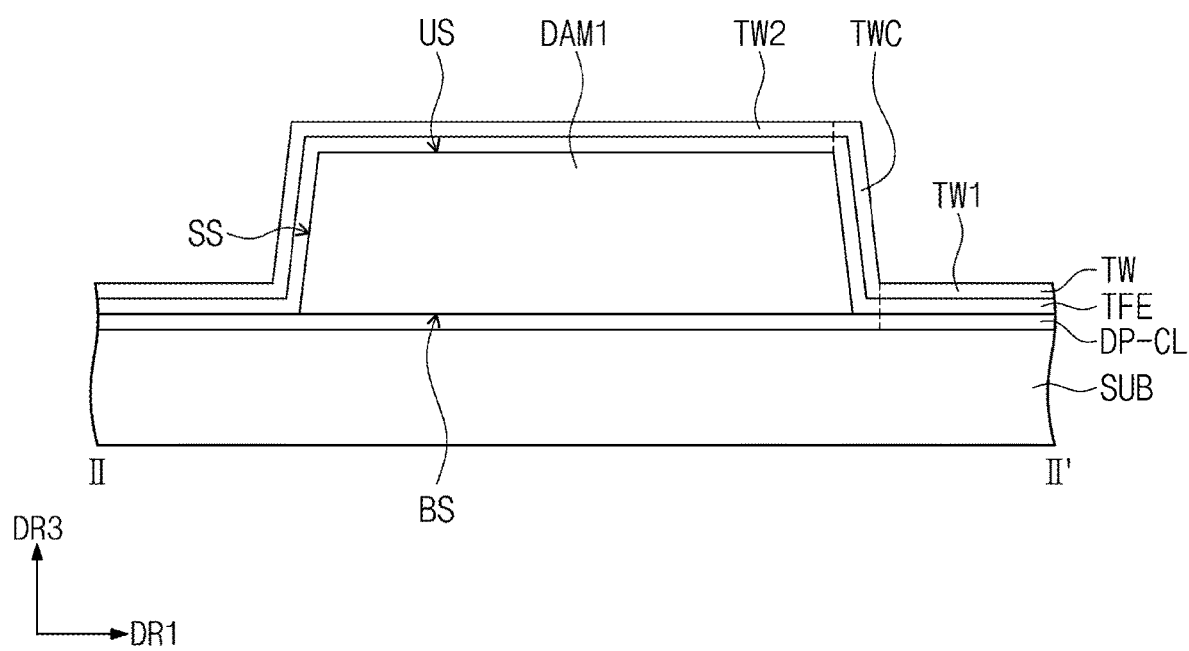
FIG. 13A is a cross-sectional view taken along line II-II' of FIG. 12.
Figure 13B:
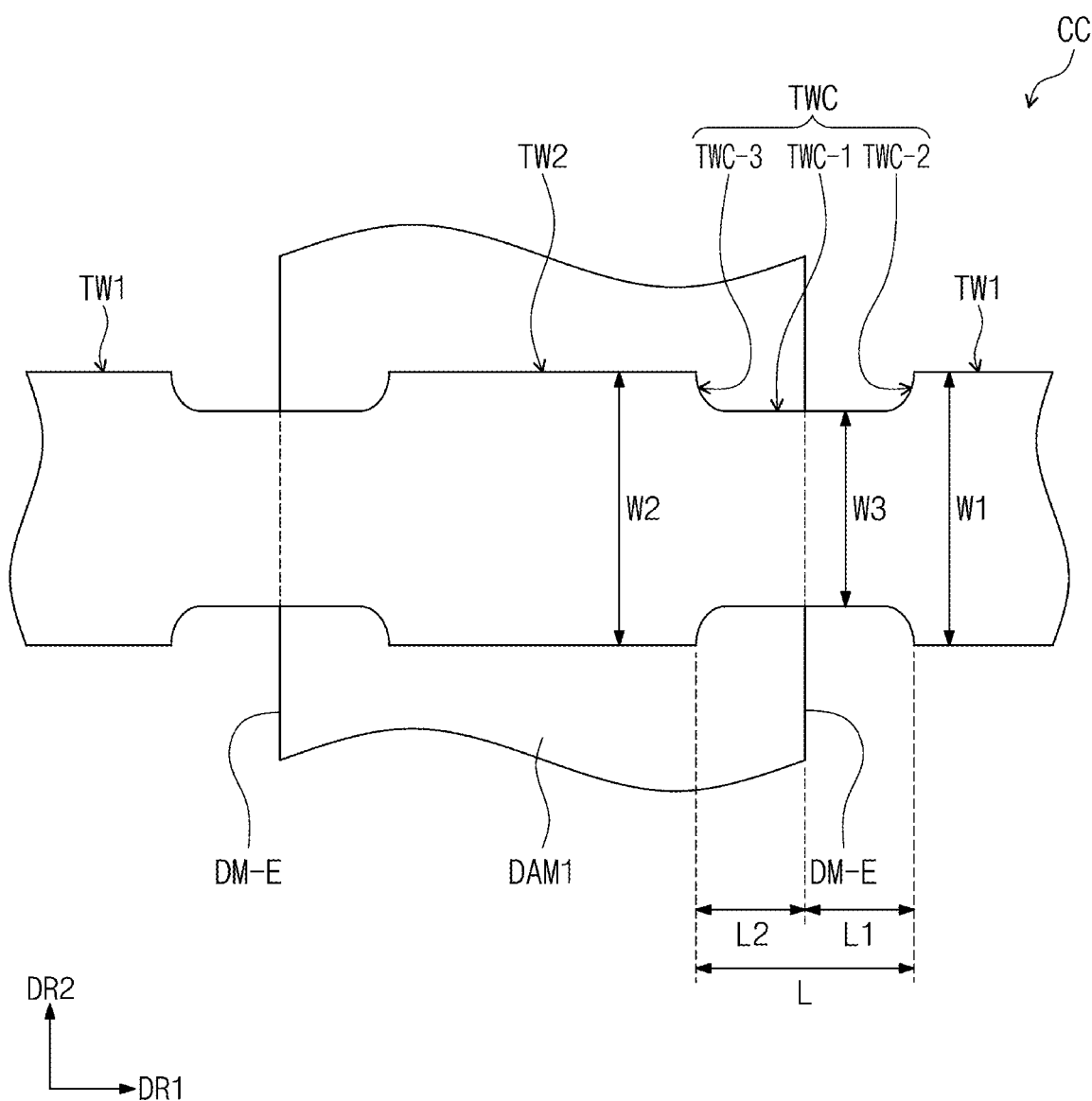
FIG. 13B is an enlarged view of region CC of FIG. 12.

FIG. 13A is a cross-sectional view illustrating a portion corresponding to line II-II' of FIG. 12, and FIG. 13B is an enlarged plan view illustrating region "CC" of FIG. 12. FIGS. 13A and 13B illustrate an exemplary embodiment of the wiring part TW passing the first protruding member DAM1 in the plan view of FIG. 12.

Also, FIG. 12 illustrates that the shapes of the wiring part TW of a portion passing and overlapping the first protruding member DAM1 and the shapes of the wiring part TW of a portion passing and overlapping the second protruding member DAM2 are the same, but the exemplary embodiment of the inventive concept is not limited thereto. The shapes of the second wiring part TW2 overlapping the first protruding member DAM1 and the shapes of the second wiring part TW2 overlapping the second protruding member DAM2 are different from each other.

FIG. 12 illustrates the wiring part TW passing the first and second protruding members DAM1 and DAM2, and the wiring part TW passes the first protruding member DAM1 and extends toward the second protruding member DAM2. The wiring part TW may extend in the first direction DR1.

Referring to FIGS. 12, 13A, and 13B, the wiring part TW may include a first wiring part TW1, which does not overlap the protruding member DAM, a second wiring part TW2 overlapping the protruding member DAM, and a connection wiring part TWC disposed between the first and second wiring parts TW1 and TW2. Also, the wiring part TW disposed between the first and second protruding members DAM1 and DAM2 corresponds to the first wiring part TW1, which does not overlap the protruding member DAM.

FIGS. 13A and 13B are views illustrating the first protruding member DAM1 and the wiring part TW passing the first protruding member DAM1. The first wiring part TW1 may have a first wiring width W1, the second wiring part TW2 may have a second wiring width W2, and the connection wiring part TWC may have a third wiring width W3 less than the first and second wiring widths W1 and W2. For example, the first and second wiring widths W1 and W2 may be the same. However, the exemplary embodiment of the inventive concept is not limited thereto, and the first and second wiring widths W1 and W2 may be different from each other.

In the description of the inventive concept, the wiring widths W1, W2, and W3 of the first wiring part TW1, the second wiring part TW2, and the connection wiring part TWC represent the widths in the direction perpendicular to the extending direction of the wiring part TW. Hereinafter, in the description of the inventive concept, the width of the wiring part will be described to represent the width in the direction perpendicular to the extending direction of the wiring part when viewed in a plan view. Referring to FIG. 12, the wiring widths W1, W2, and W3 may represent the widths in the second direction DR2 perpendicular to the first direction DR1 in which the wiring part TW extends.

In an exemplary embodiment, the first wiring part TW1 may be a portion in which the wiring width is maintained at the first wiring width W1, and the second wiring part TW2 may be a portion in which the wiring width is maintained at the second wiring width W2. However, the exemplary embodiment of the inventive concept is not limited thereto. The first wiring part TW1 may have a partially different wiring width. Also, the second wiring part TW2 may have a partially different wiring width.

The connection wiring part TWC may be a portion which has a width smaller than the first wiring part TW1 and the second wiring part TW2. The third wiring width W3 may represent the minimum wiring width in the connection wiring part TWC. The connection wiring part TWC may be disposed to overlap an edge DM-E of the protruding member DAM. For example, a portion having the third wiring width W3 which is the minimum wiring width in the connection wiring part TWC may be disposed to overlap the edge DM-E of the protruding member.

Referring again to FIG. 13B, the ratio of the first wiring width W1 of the first wiring part TW1 to the third wiring width W3 of the connection wiring part TWC may be greater than or equal to about 1:0.3 and less than about 1:1. For example, the first wiring width W1 may be about 8 μm to about 15 μm, inclusive, and the third wiring width W3 may be about 4 μm to about 10 μm, inclusive. The first wiring width W1 may be about 10 μm to about 12 μm, inclusive, and the third wiring width W3 may be about 6 μm to about 8 μm, inclusive. When the wiring width W3 is less than about 4 μm, the wiring part may be disconnected, and when the wiring width W3 is greater than about 10 μm, a short-circuit defect may be caused because the gap between the adjacent connection wiring parts is decreased.

The length L of the connection wiring part TWC in the extending direction of the wiring part TW may be about 5 μm to about 50 μm, inclusive. That is, the gap between the first wiring part TW1 and the second wiring part TW2 which extend in the first direction DR1 may be about 5 μm to about 50 μm, inclusive. Also, the central portion of the connection wiring part TWC may overlap the edge DM-E of the protruding member. For example, the length of a portion overlapping the protruding member DAM1 in the connection wiring part TWC and a portion which does not overlap the protruding member DAM1 may be the same.

For example, when the length L of the connection wiring part TWC in the first direction DR1 is about 50 μm, when the distance from the portion overlapping the edge DM-E of the protruding member to the first wiring part TW1 is L1, and when the distance from the portion overlapping the edge DM-E of the protruding member to the second wiring part TW2 is L2, both L1 and L2 may be about 25 μm. However, the exemplary embodiments of the inventive concept are not limited thereto, and L1 and L2 may be different from each other. Here, L1 may be the length of a portion which does not overlap the protruding member DAM1 in the connection wiring part TWC, and L2 may be the length of a portion overlapping the protruding member DAM2 in the connection wiring part TWC.

In the wiring part TW, the connection wiring part TWC may be a portion having a notch shape. Referring to FIG. 13B, the connection wiring part TWC may include a first sub connecting part TWC-1 having a wiring width less than the first wiring width W1, a second sub connecting part TWC-2 disposed between the first wiring part TW1 and the first sub connecting part TWC-1, and a third sub connecting part TWC-3 disposed between the second wiring part TW2 and the first sub connecting part TWC-1. The first sub connecting part TWC-1 may be a portion having the third wiring width W3 which is the minimum width in the connection wiring part TWC. Referring to FIG. 13B, the first sub connecting part TWC-1 in the connection wiring part TWC may be disposed to overlap the edge DM-E of the protruding member.

The wiring width of the second sub connecting part TWC-2 may be increased in the direction from the first sub connecting part TWC-1 toward the first wiring part TW1. Also, the wiring width of the third sub connecting part TWC-3 may be increased in the direction from the first sub connecting part TWC-1 toward the second wiring part TW2. For example, edges of the second sub connecting part TWC-2 and the third sub connecting part TWC-3 may have curved shapes. Also, although not shown in the drawing, the edges of the second sub connecting part TWC-2 or the third sub connecting part TWC-3 may have straight line shapes.

Referring to FIG. 13A, the first protruding member DAM1 may include a bottom surface BS, an upper surface US facing the bottom surface BS, and a side surface SS connecting the bottom surface BS and the upper surface US. The side surface SS may have an inclination with respect to the bottom surface BS. For example, the first protruding member DAM1 may have a trapezoidal shape in a cross-section perpendicular to the base substrate SUB. That is, when viewed in the plane defined by the first and third directions DR1 and DR3, the first protruding member DAM1 may have a shape in which the width of the protrusion gradually decreases in the direction from the bottom surface BS toward the upper surface US. The area of the bottom surface BS of the protruding member DAM may be not less than the area of the upper surface US. Also, although not separately shown in the drawing, a plurality of layers may be laminated in the protruding member.

In FIG. 13A, although only the wiring part TW passing the first and second protruding members DAM1 and DAM2 is illustrated, the second protruding member DAM2 of FIG. 12 may also have the same shape as the first protruding member DAM1. However, the exemplary embodiment of the inventive concept is not limited thereto, and the first and second protruding members DAM1 and DAM2 may have shapes different from each other. For example, the first and second protruding members DAM1 and DAM2 may have heights different from each other. The height of the second protruding member DAM2 may be higher than that of the first protruding member DAM1.

Figure 14A:
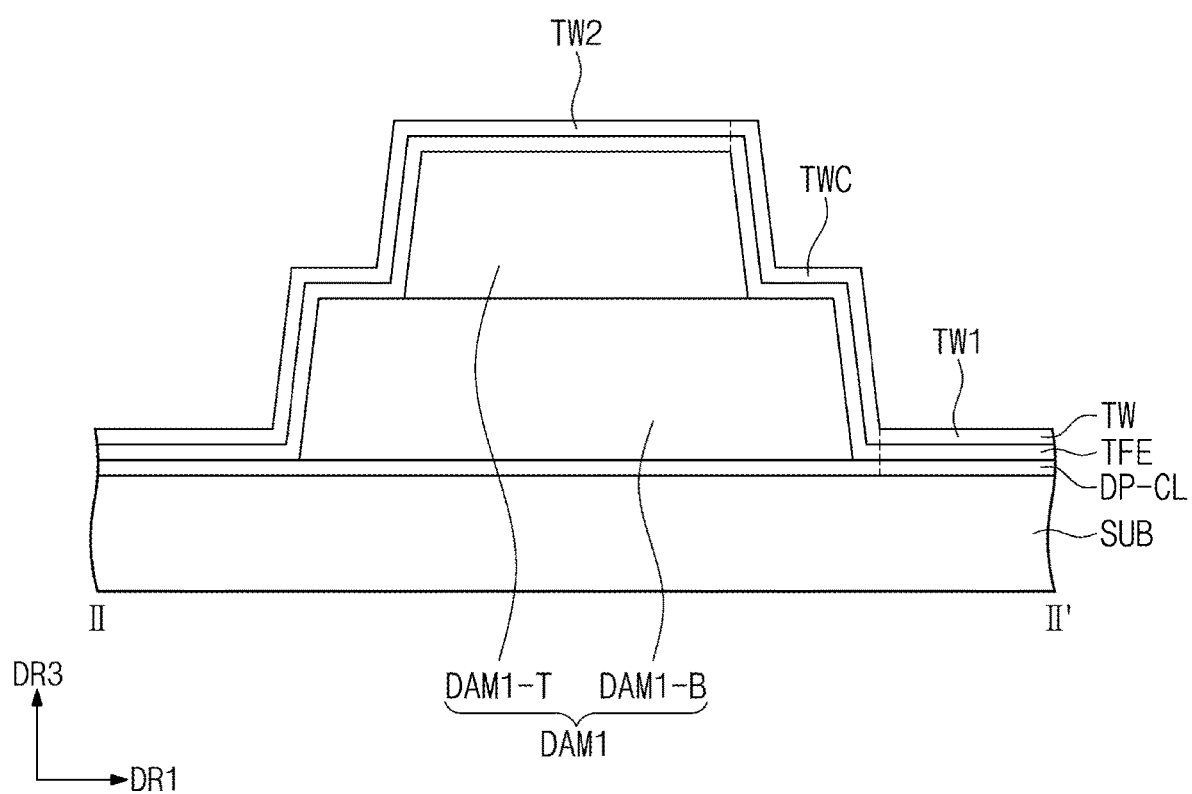
FIG. 14A is a cross-sectional view taken along line II-II' of FIG. 12.
Figure 14B:
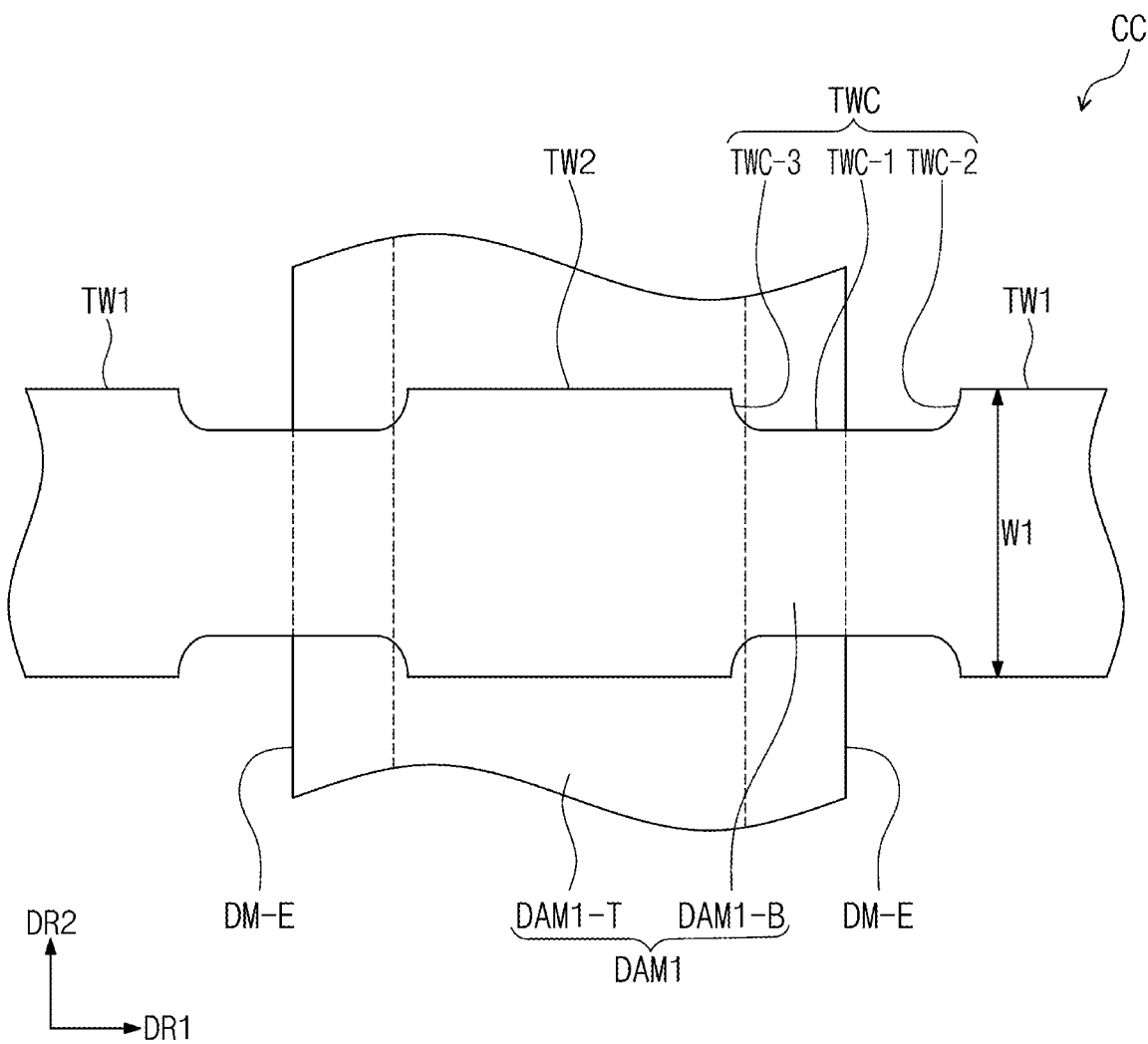
FIG. 14B is an enlarged view of region CC of FIG. 12.

FIGS. 14A to 14B are view illustrating an example when the protruding member DAM are formed in a plurality of layers in the display apparatus of an exemplary embodiment illustrated in FIG. 9. FIGS. 14A to 14B exemplarily illustrate a case in which the first protruding member DAM1 is laminated in two layers.

Figure 14C:
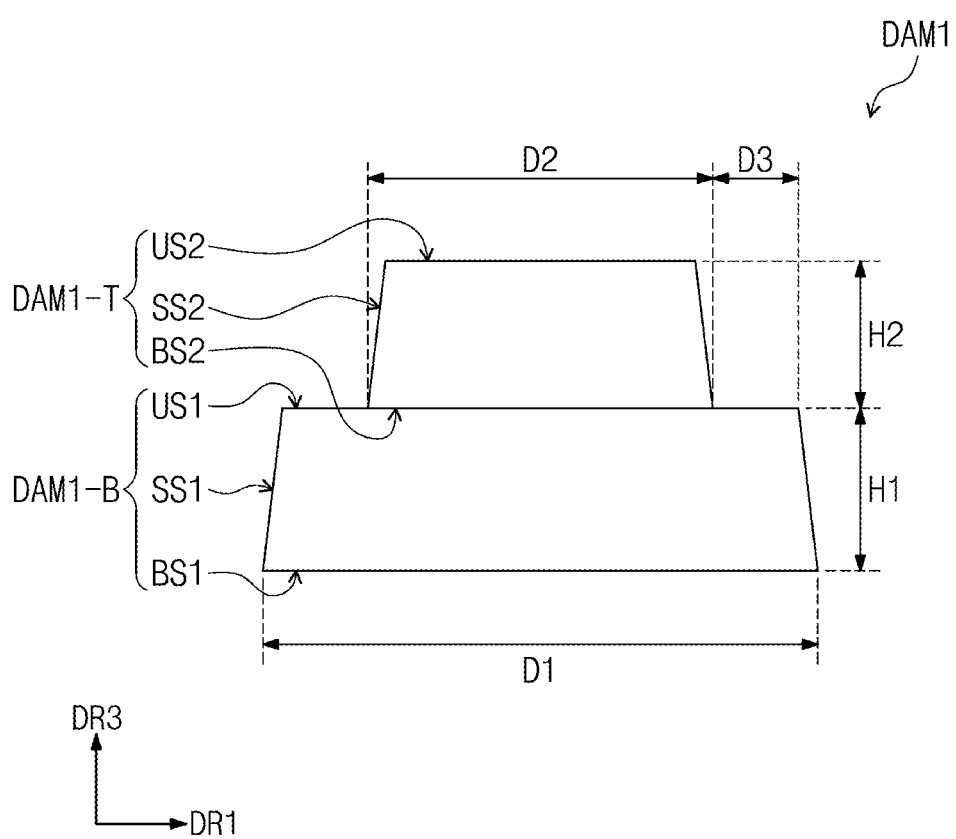
FIG. 14C is a cross-sectional view illustrating a protruding member according to an exemplary embodiment of the inventive concept.

FIG. 14A is a cross-sectional view illustrating a portion corresponding to line II-II' of FIG. 12, and FIG. 14B is an enlarged plan view illustrating region "CC" of FIG. 12. FIGS. 14A and 14B illustrate views of the wiring part TW passing the first protruding member DAM1 in the plan view of FIG. 12. FIG. 14C is a cross-sectional view illustrating the first protruding member DAM1 of FIG. 14A.

When viewed in a cross-section perpendicular to the base substrate SUB, the first protruding member DAM1 may include a lower protruding part DAM1-B having a first width D1 and disposed on the base substrate SUB, and an upper protruding part DAM1-T disposed on the lower protruding part DAM1-B and having a second width D2.

The lower protruding part DAM1-B and the upper protruding part DAM1-T may respectively include bottom surfaces BS1 and BS2, upper surfaces US1 and US2, and side surfaces SS1 and SS2. The bottom surfaces BS1 and BS2 and the upper surfaces US1 and US2 may face each other, and the side surfaces SS1 and SS2 may be disposed between the bottom surfaces BS1 and BS2 and the upper surfaces US1 and US2 to connect the bottom surfaces BS1 and BS2 and the upper surfaces US1 and US2. For example, the side surfaces SS1 and SS2 may be inclined surfaces respectively having inclination with respect to the bottom surfaces BS1 and BS2. Also, the bottom surface BS2 of the upper protruding part DAM1-T may be a portion of the upper surface US1 of the lower protruding part DAM1-B.

In cross-sections illustrated in FIG. 14A and FIG. 14C, each of the lower protruding part DAM1-B and the upper protruding part DAM1-T may have a trapezoidal shape. That is, each of the upper protruding part DAM1-T and the lower protruding part DAM1-B may have a trapezoidal shape in which the height of the protrusion gradually decreasing in the direction from the bottom surfaces BS1 and BS2 toward the upper surfaces US1 and US2.

The widths of the lower protruding part DAM1-B and the upper protruding part DAM1-T may be different from each other. The first width D1 of the bottom surface BS1 of the lower protruding part DAM1-B and the second width D2 of the bottom surface BS2 of the upper protruding part DAM1-T may be different from each other. The first width D1 of the lower protruding part DAM1-B may be greater than the second width D2 of the upper protruding part DAM1-T. The upper protruding part DAM1-T may be disposed on the lower protruding part DAM1-B such that a portion of the upper surface US1 of the lower protruding part DAM1-B is exposed. That is, the lower protruding part DAM1-B may include a portion overlapping the upper protruding part DAM1-T and a portion which does not overlap the upper protruding part DAM1-T and is exposed. For example, the first protruding member DAM1 may have a step shape by laminating the lower protruding part DAM1-B and the upper protruding part DAM1-T which have different widths from each other.

Also, FIGS. 14A to 14C illustrate the first protruding member DAM1 and the wiring part TW passing the first protruding member DAM1, but the exemplary embodiments of the inventive concept are not limited thereto. In the second protruding member DAM2 illustrated in FIG. 12, the shape of the protruding member illustrated in FIG. 14A to 14C may also be applied.

In the first protruding part DAM1 including the lower protruding part DAM1-B and the upper protruding part DAM1-T, which are laminated as a step, the exposed width D3 of a portion which is exposed and does not overlap the upper protruding part DAM1-T in the lower protruding part DAM1-B may be about 5 µm to about 30 µm, inclusive. For example, the exposed width D3 may be about 10 µm to about 25 µm, inclusive, and specifically, the exposed width D3 may be about 15 µm to about 20 µm, inclusive.

The first width D1 of the bottom surface BS1 of the lower protruding part DAM1-B may be about 60 µm to about 80 µm, inclusive. Specifically, the first width D1 may be about 65 µm to about 75 µm, inclusive. The width of the bottom surface BS2 of the upper protruding part DAM1-T, that is, the second width D2 may be about 10 µm to about 60 µm, inclusive. Specifically, the second width D2 may be about 30 µm to about 50 µm, inclusive.

The ratio of the first width D1 of the lower protruding part DAM1-B to the exposed width D3 of the lower protruding part DAM1-B may be about 1:0.01 to about 1:0.4, inclusive. As the exposed width D3 is increased, the likelihood of a short-circuit between the connection wiring parts TWC in the adjacent wiring parts TW may be reduced. However, when the ratio of D1 to D3 is greater than about 1:0.4, the area of the upper protruding part DAM1-T is decreased and thus, the wiring part TW passing the upper protruding part DAM1-T may be stably disposed.

The height H1 of the lower protruding part DAM1-B may be about 2 µm to about 5 µm, inclusive. Specifically, the height H1 of the lower protruding part DAM1-B may be about 2 µm to about 3 µm, inclusive. As the ratio of the height H1 of the lower protruding part DAM1-B to the exposed width D3 of the lower protruding part is increased, the wiring part may be stably disposed on the protruding member. The ratio of the height H1 of the lower protruding part DMA1-B to the exposed width D3 of the lower protruding part DAM1-B may be greater than about 1:1 and less than or equal to about 1:15. When the ratio of the height H1 of the lower protruding part DAM1-B to exposed width D3 of the lower protruding part DAM1-B is less than about 1:1 or greater than about 1:15, the connection wiring part may not be stably formed. Specifically, the ratio of the height H1 of the lower protruding part DAM1-B to the exposed width D3 of the lower protruding part DAM1-B may be greater than about 1:1 and less than or equal to about 1:5.

Also, the height H2 of the upper protruding part DAM1-T may be about 2 µm to about 5 µm, inclusive. Specifically, the height H2 of the upper protruding part DAM1-T may be about 2 µm to about 3 µm, inclusive. For example, the height H2 of the upper protruding part DAM1-T may be less than the height H1 of the lower protruding part DAM1-B. However, the exemplary embodiment of the inventive concept is not limited thereto, and the height H2 of the upper protruding part DAM1-T may be the same as the height H1 of the lower protruding part DAM1-B.

Also, the first protruding member DAM1 illustrated in FIG. 14A may be formed through a process for manufacturing an organic light-emitting display panel. The first protruding member DAM1 may be formed together through a process for forming the light-emitting element layer DP-OLED. For example, the lower protruding part DAM1-B and the upper protruding part DAM1-T may be formed together with the pixel defining layer PDL (FIG. 6B) but the exemplary embodiment of the inventive concept is not limited thereto.

In an exemplary embodiment illustrated in FIGS. 14A to 14B, the second wiring part TW2 overlapping the first protruding member DAM1 may overlap the upper protruding part DAM1-T. The connection wiring part TWC may overlap an edge of the lower protruding part DAM1-B of the first protruding member DAM1. A first sub connecting part TWC-1 having a third width W3 in the connection wiring part TWC may overlap the edge of the lower protruding part DAM1-B, and a third connecting part TWC-3 for connecting the second wiring part TW2 and the first sub connecting part TWC-1 may overlap the edge of the upper protruding part DAM1-T.

Figure 15A:
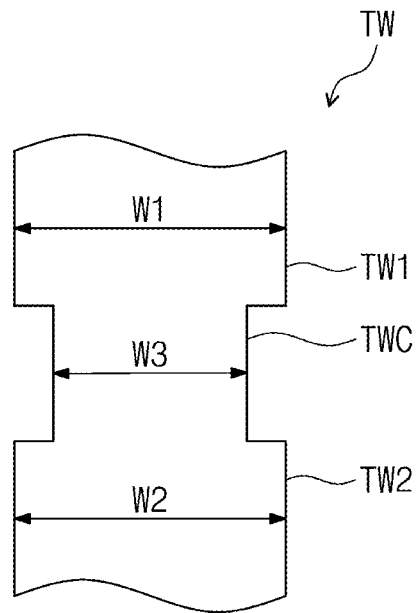
FIG. 15A and FIG. 15B are plan views illustrating exemplary embodiments of a wiring part including a connection wiring part.
Figure 15B:
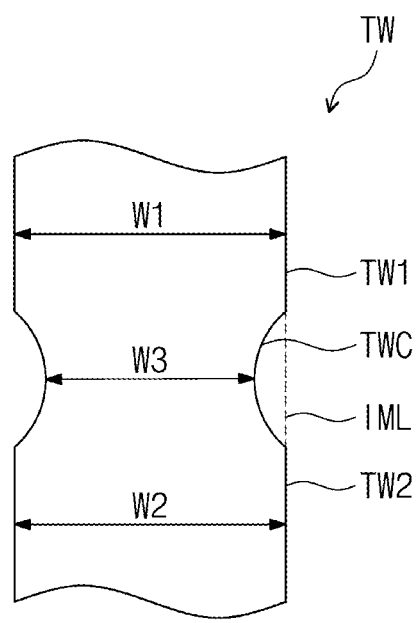

FIGS. 15A and 15B are views illustrating exemplary embodiments of a wiring part TW including a connection wiring part TWC. The wiring parts of exemplary embodiments illustrated in FIGS. 15A and 15B differ in the shapes of the connection wiring parts TWC in comparison with the wiring part TW illustrated in FIGS. 13B and 14B.

Also, the shapes of the wiring parts TW illustrated in FIGS. 13B and 14B and the shapes of the wiring parts TW illustrated in FIGS. 15A to 15B illustrate exemplary embodiments, and the shape of the connection wiring part TWC of the wiring part TW is not limited thereto.

Referring to FIG. 15A, the connection wiring part TWC may be a portion in which the wiring width is maintained at a third wiring width W3. The first wiring part TW1, the connection wiring part TWC, and the second wiring part TW2 may be distinguished by the difference in the wiring width. For example, in comparison with the connection wiring part TWC in an exemplary embodiment illustrated in FIG. 13B, in an exemplary embodiment of FIG. 15A, a sub-connection wiring part formed in a curved surface may not be provided between the first wiring part TW1 maintained at a first wiring width W1 and the connection wiring part TWC having a third wiring width W3 less than the first wiring width W1. Also, the sub connection wiring part formed in a curved surface may not be provided between the connection wiring part TWC and the second wiring part TW2 in which the wiring width is maintained at a second wiring width W2. That is, the sub connection wiring part in which edges have shapes of curves may not be provided between the first wiring part TW1 and the connection wiring part TWC in the wiring part TW in the exemplary embodiment of FIG. 15A. For example, in comparison with the wiring part TW in the exemplary embodiment illustrated in FIG. 13B, at least any one of second and third sub connecting parts TWC-2 and TWC-3 may not be provided.

Referring to FIG. 15B, the connection wiring part TWC may be a portion which is concavely recessed between the first and second wiring parts TW1 and TW2. For example, the connection wiring part TWC may be a portion which is concavely recessed inward with respect to an imaginary line IML connecting the edge portions of the first wiring part TW1 and the second wiring part TW2.

Also, although not illustrated in FIGS. 15A and 15B, the connection wiring part TWC is disposed between the first and second wiring parts TW1 and TW2, and may be used without limitation if only having a shape in which an edge of the connection wiring part TWC is disposed inside an imaginary line connecting the edge portions of the first and second wiring parts TW1 and TW2.

Figure 16:
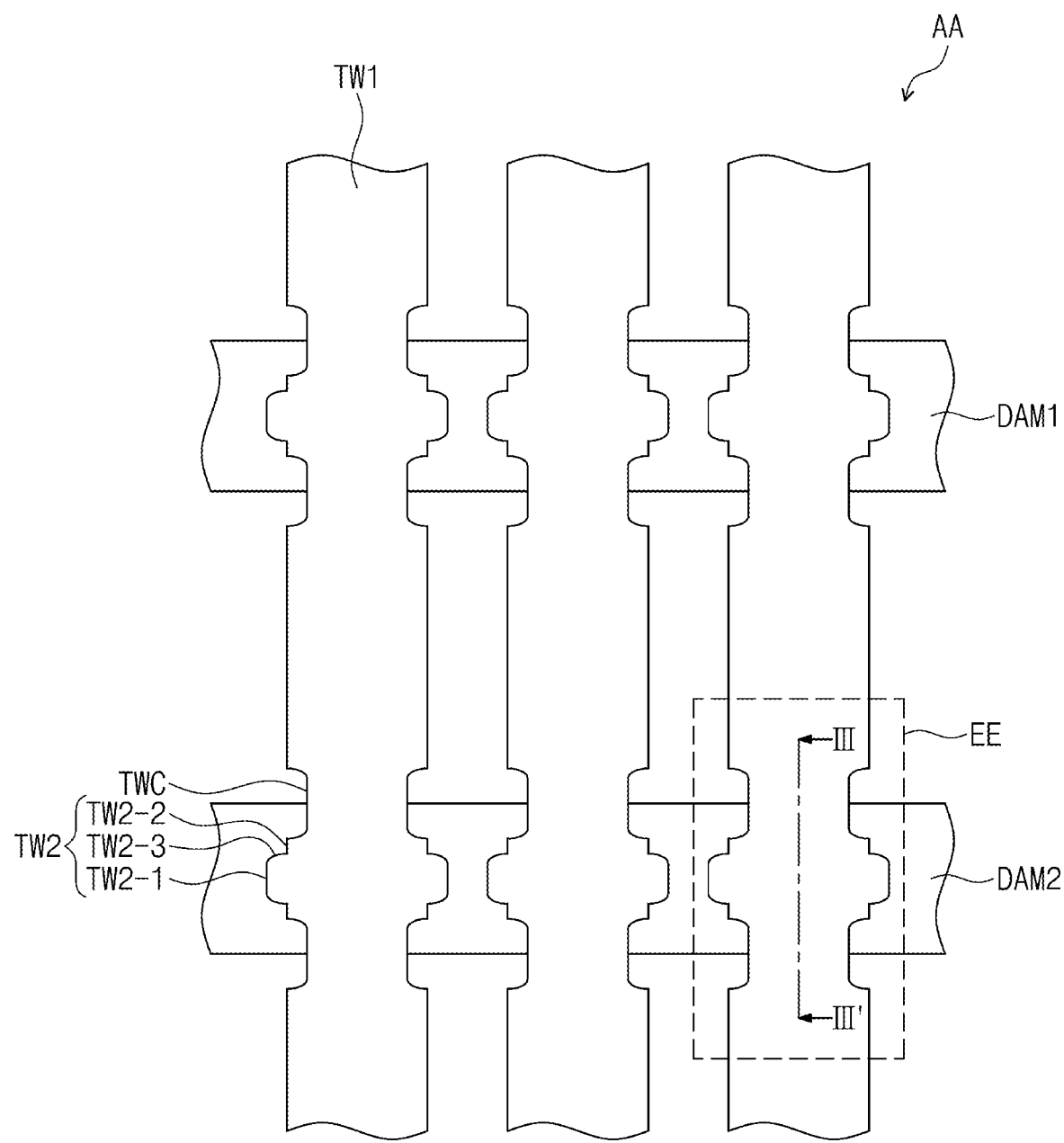
FIG. 16 is an enlarged plan view illustrating region AA of FIG. 9.

FIG. 16 may be an enlarged plan view illustrating a portion corresponding to region "AA" of FIG. 9. In FIG. 16, in comparison with the exemplary embodiment of FIG. 12, the shape of the second wiring part TW2 overlapping the protruding member may be different. Also, as illustrated in FIG. 16, the shapes of the wiring part TW passing first and second protruding members DAM1 and DAM2 may be the same, but the exemplary embodiment of the inventive concept is not limited thereto. For example, the wiring part TW passing the first protruding member DAM1 may have a shape illustrated in FIG. 14B when viewed in a plan view.

Figure 17A:
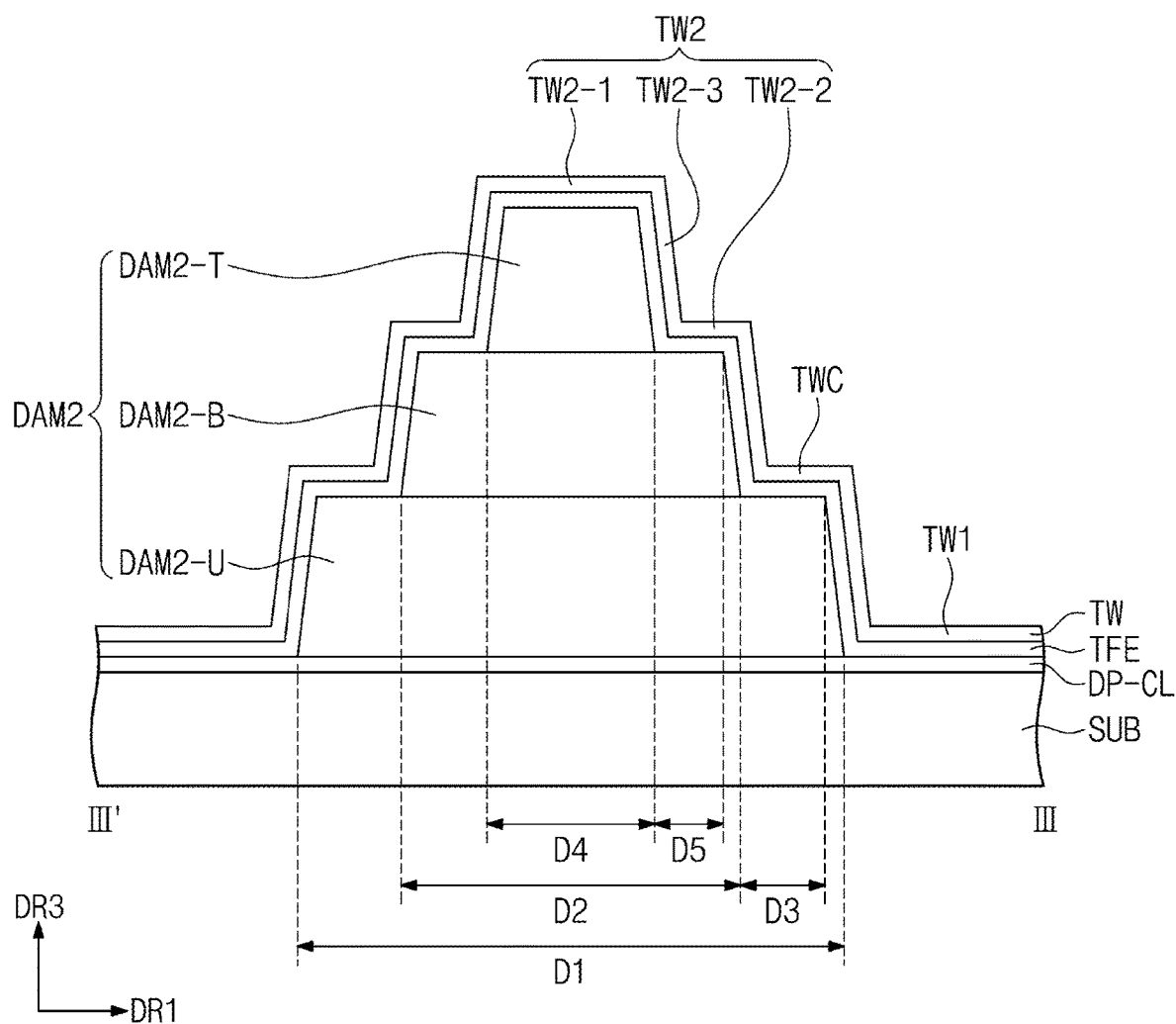
FIG. 17A is a cross-sectional view taken along line of FIG. 16.
Figure 17B:
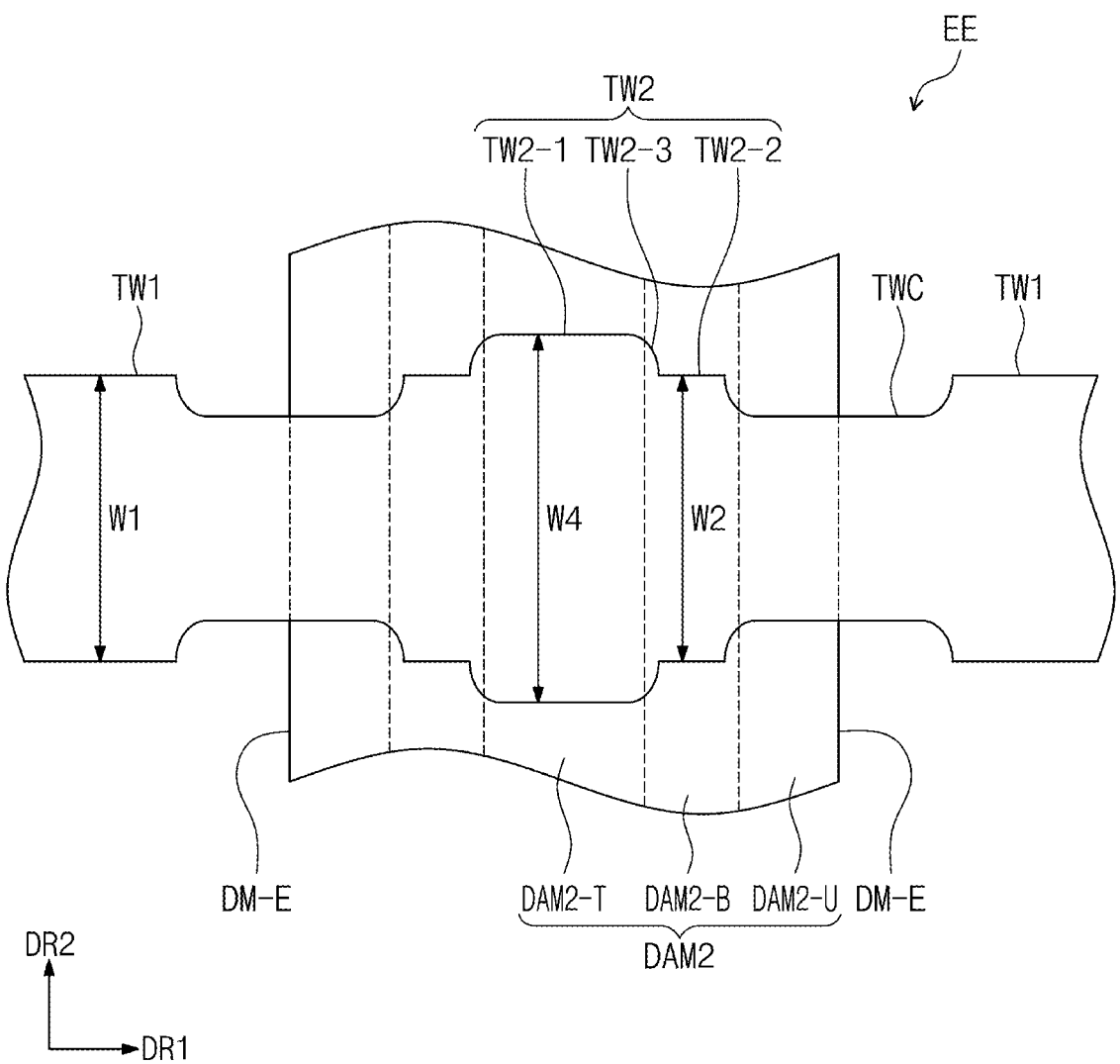
FIG. 17B is an enlarged plan view illustrating region EE of FIG. 16.

FIGS. 17A and 17B are views illustrating an exemplary embodiment of the second protruding member DAM2 and the wiring part TW passing the second protruding member DAM2. FIG. 17A may illustrate a cross-section of a surface corresponding to line III-III' of FIG. 16. FIG. 17B may be an enlarged plan view illustrating region EE of FIG. 16. In the exemplary embodiment of FIG. 17A, the second protruding member DAM2 is exemplarily illustrated, and the second protruding member DAM2 in the exemplary embodiment of FIG. 17A may have a shape different from those of the protruding members in the exemplary embodiments illustrated in FIGS. 13A and 14A.

Referring to the illustration of FIG. 17A, the second protruding member DAM2 may include a base protruding part DAM2-U, a second lower protruding part DAM2-B, and a second upper protruding part DAM2-T, which are sequentially laminated in the thickness direction. The second protruding member DAM2 may be formed together in a process for manufacturing an organic light-emitting display panel. For example, the base protruding part DAM2-U of second protruding part DAM2 may be formed together in a process for manufacturing an circuit layer DP-CL, and the second lower protruding part DAM2-B and the second upper protruding part DAM2-T may be formed together when a pixel defining layer PDL (FIG. 6B) of a light-emitting element layer DP-OLED is formed. However, the exemplary embodiment of the inventive concept is not limited thereto, and the second protruding part DAM2 may be formed through a process different from the suggested process.

In the second protruding member DAM2, the base protruding part DAM2-U, the second lower protruding part DAM2-B, and the second upper protruding part DAM2-T may be laminated in a step-shape. The base protruding part DAM2-U may have a first width D1, the second lower protruding part DAM2-B may have a second width D2, and the second upper protruding part DAM2-T may have a fourth width D4. Also, when the second lower protruding part DAM2-B is disposed on the base protruding part DAM2-U, the upper surface of the base protruding part DAM2-U may be exposed. When the exposed width of the base protruding part DAM2-U is the exposed width D3, the ratio of the first width D1 to the exposed width D3 in the base protruding part DAM2-U may be about 1:0.1 to about 1:0.4, inclusive. Also, when the second upper protruding part DAM2-T is disposed on the second lower protruding part DAM2-B, the upper surface of the second lower protruding part DAM2-B may be exposed. When the exposed width of the second lower protruding part DAM2-B is a fifth width D5, the ratio of the second width D2 to an exposed width D5 of the second lower protruding part DAM2-B may be about 1:0.1 to about 1:0.4, inclusive.

Referring to FIGS. 17A and 17B, the wiring part TW passing the second protruding member DAM2 may include a first wiring part TW1, which does not overlap the second protruding member DAM2, a second wiring part TW2 overlapping the second protruding member DAM2, and a connection wiring part TWC disposed between the first and second wiring parts TW1 and TW2. The connection wiring part TWC may connect the first and second wiring parts TW1 and TW2 and overlap an edge DM-E of the second protruding member DAM2.

Also, the second wiring part TW2 overlapping the second protruding member DAM2 may include a first sub wiring part TW2-1 having a first sub wiring width W4 greater than the first wiring width W1, a second sub wiring part TW2-2 extending from the connection wiring part TWC and having a second wiring width W2 smaller than the first sub wiring width W4, and a third sub wiring part TW2-3 disposed between the first sub wiring part TW2-1 and the second sub wiring part TW2-2. Here, the second wiring width W2 of the second sub wiring part TW2-2 may be the same as the first wiring width W1 which is the wiring width of the first wiring part TW1.

The wiring width of the third sub wiring part TW2-3 may be gradually decreased in the direction from the first sub wiring part TW2-1 toward the second sub wiring part TW2-2. The third sub wiring part TW2-3 may be disposed to overlap an edge of the second upper protruding part DAM2-T of the second protruding member DAM2.

That is, the wiring part TW in the exemplary embodiment illustrated in FIGS. 17A and 17B may have a notch shape in which the connection wiring part TWC overlapping the edge of the base protruding part DAM2-U is concavely formed toward the inside of the wiring part. Also, in the upper surface of the second upper protruding part DAM2-T, which is the topmost surface of the second protruding member DAM2, the second wiring part TW2 may include a first sub wiring part TW2-1 formed to protrude with respect to the first wiring part TW1, which does not overlap the second protruding member DAM2. The first sub wiring part TW2-1 may have a wiring width greater than that of the first wiring part TW1. That is, the second wiring part TW2 may include the first sub wiring part TW2-1 protruding in a convex manner with respect to the first wiring part TW1. For example, in the second wiring part TW2, the first sub wiring part TW2-1 has the first sub wiring part TW2-1 having a protruding shape such that the wiring part overlapping the topmost surface of the protruding member having a relatively small flat surface has a sufficient wiring width, and thus, may prevent disconnection of the wiring part.

Figure 18A:
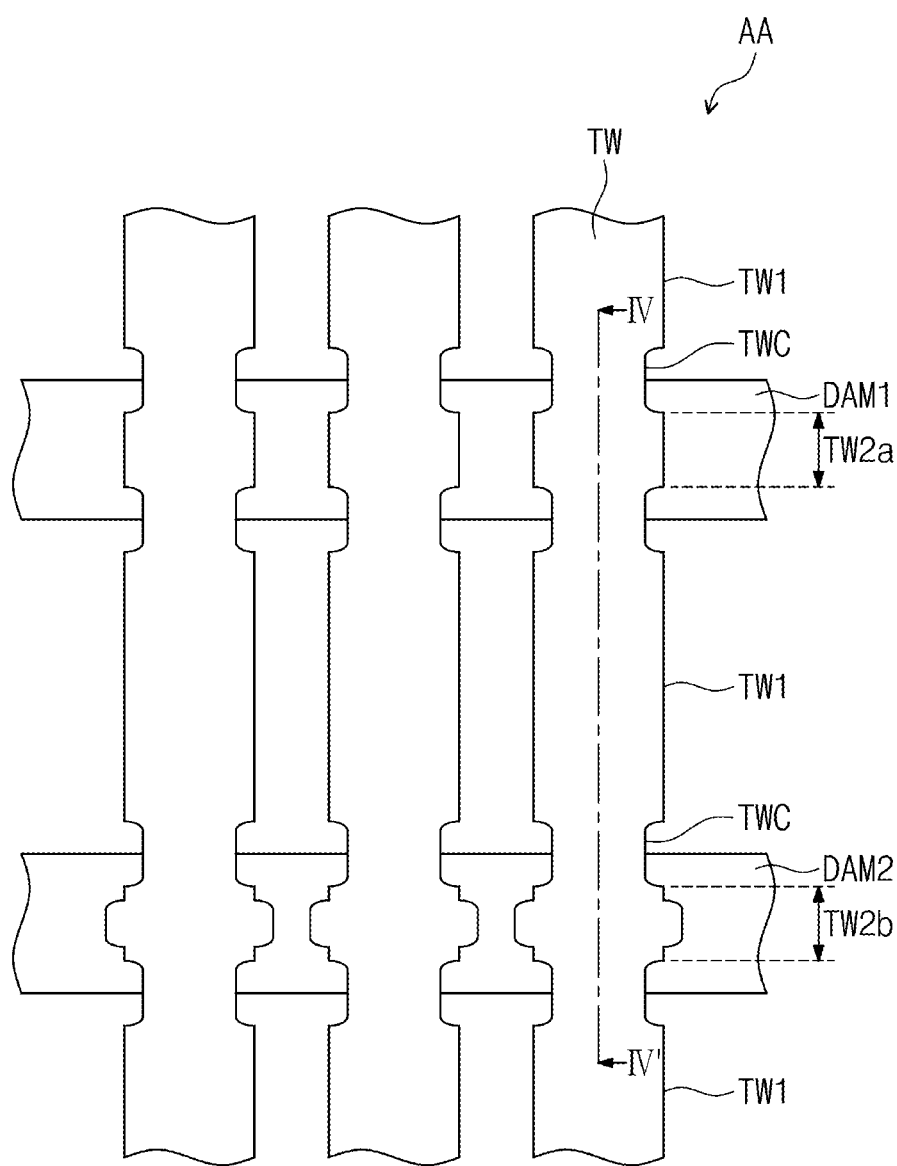
FIG. 18A is an enlarged plan view illustrating region AA of FIG. 9.
Figure 18B:
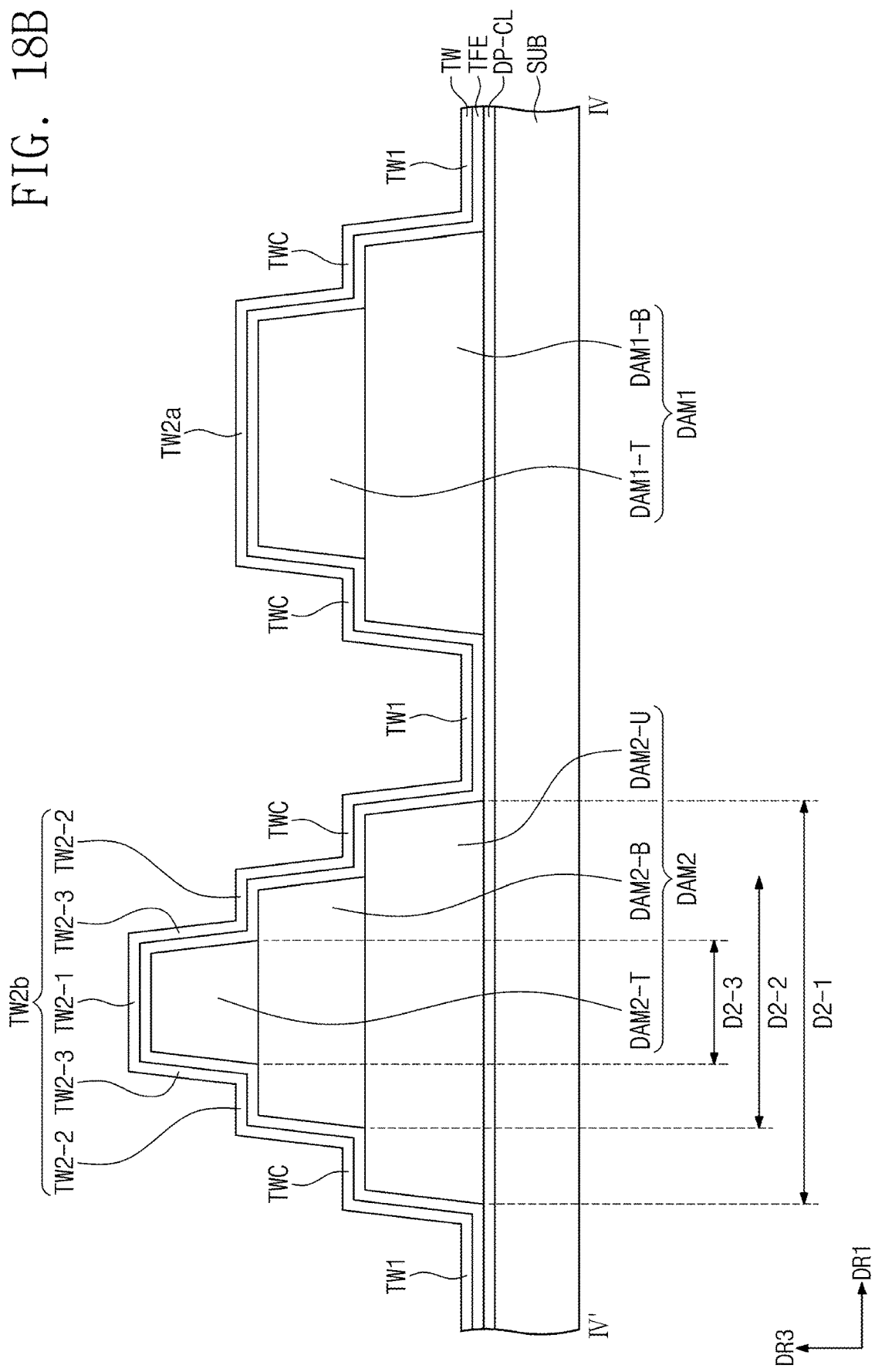
FIG. 18B is a cross-sectional view taken along line IV-IV' of FIG. 18A.

FIG. 18A is a plan view illustrating a protruding member and a wiring part disposed to pass the protruding member. FIG. 18A may be an enlarged plan view illustrating a portion corresponding to region "AA" of FIG. 9. In comparison with the exemplary embodiments of FIGS. 12 and 16, FIG. 18A illustrate a case in which the shapes of a second wiring part TW2a overlapping a first protruding member DAM1 and a second wiring part TW2b overlapping a second protruding member DAM2 are different from each other. FIG. 18B is a view illustrating a cross-section of a surface corresponding to line IV-IV' of FIG. 18A.

In the description of FIGS. 18 to 18B, descriptions overlapping the above-mentioned description about the above-mentioned exemplary embodiments of FIGS. 12 and 16 will not be described again, and the difference will be mainly described.

Referring to FIGS. 18A and 18B, the first protruding member DAM1 may be a protruding member in which two layers are laminated, and the second protruding member DAM2 may be a protruding member in which three layers are laminated. The first protruding member DAM1 may include a first lower protruding part DAM1-B, and a first upper protruding part DAM1-T, and the second protruding member DAM2 may include a base protruding part DAM2-U, a second lower protruding part DAM2-B, and a second upper protruding part DAM2-T.

In an exemplary embodiment, the first lower protruding part DAM1-B, and the second lower protruding part DAM2-B may be manufactured through the same process. Also, the first upper protruding part DAM1-T, and the second upper protruding part DAM2-T may be manufactured through the same process. For example, the first lower protruding part DAM1-B and the second lower protruding part DAM2-B, and the first upper protruding part DAM1-T and the second upper protruding part DAM2-T may be manufactured through the same process as the process forming a pixel defining layer PDL (FIG. 6C) of an organic light-emitting display panel DP. Also, the base protruding part DAM2-U of the second protruding member DAM2 may be manufactured through the same process as the process forming a circuit layer DP-CL.

In the exemplary embodiments of FIGS. 18A and 18B, the second wiring part TW2b disposed on the second protruding member DAM2 may include a first sub wiring part TW2-1 overlapping the second upper protruding part DAM2-T, a second sub wiring part TW2-2 overlapping an exposed portion of the second lower protruding part DAM2-B, and a third sub wiring part TW2-3 disposed at a step portion between the second lower protruding part DAM2-B and the second upper protruding part DAM2-T.

When viewed in a cross-sectional view, the wiring part TW may have a notch shape, which is concavely recessed in a portion overlapping edges of the first and second protruding members DAM1 and DAM2. Also, the second protruding member DAM2, in which the height of the protrusion is greater than that of the first protruding member DAM1, may include a protruding portion protruding from the second wiring part TW2b in a convex manner.

The wiring part is configured to have a notch shape at a portion having a step in the protruding member which is formed by laminating a plurality of layers, and the wiring part is configured to have a shape convexly protruding with respect to other portions on the topmost surface of a protruding member having a relatively small flat surface, and thus, the likelihood of short-circuit defects or disconnection defects of the wiring part may be reduced or eliminated.

Figure 19A:
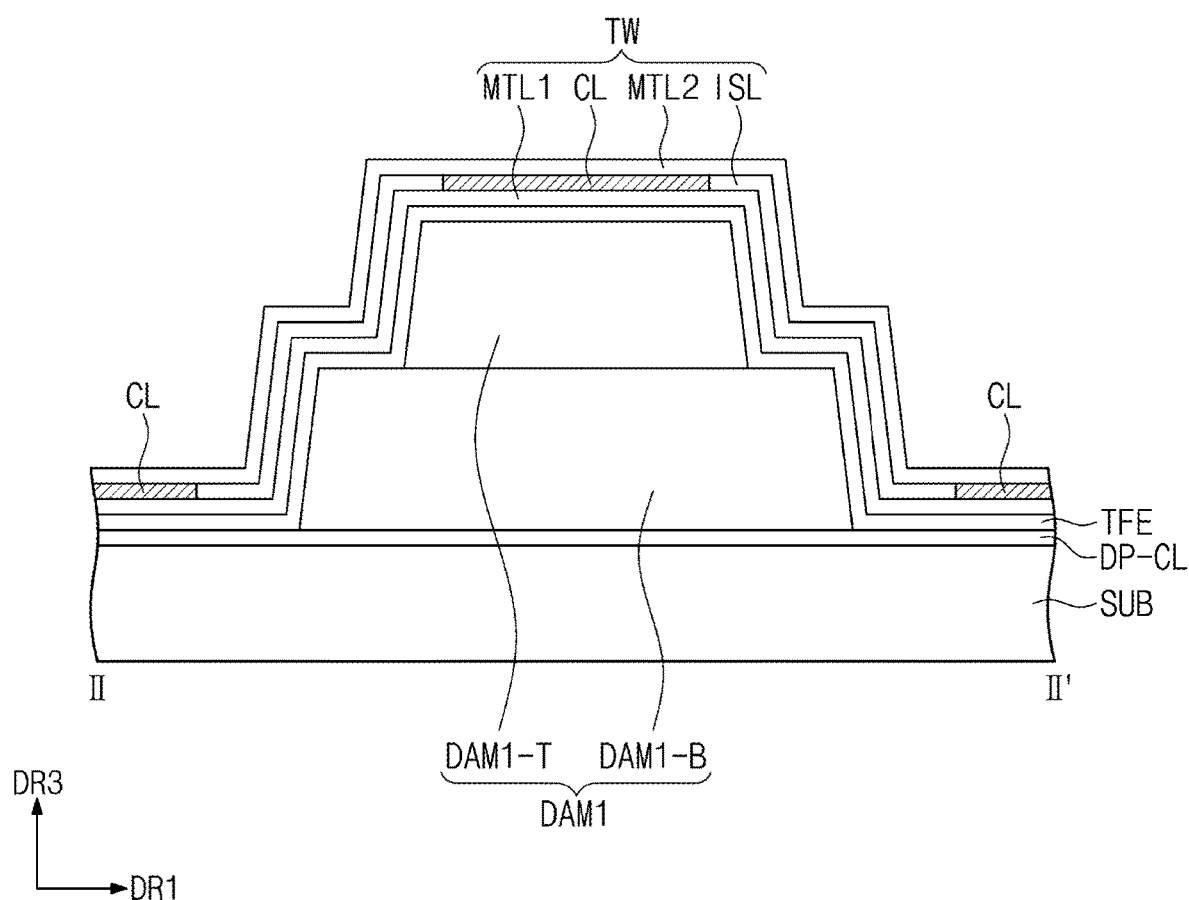
FIG. 19A is a cross-sectional view taken along line II-II' of FIG. 12.
Figure 19B:
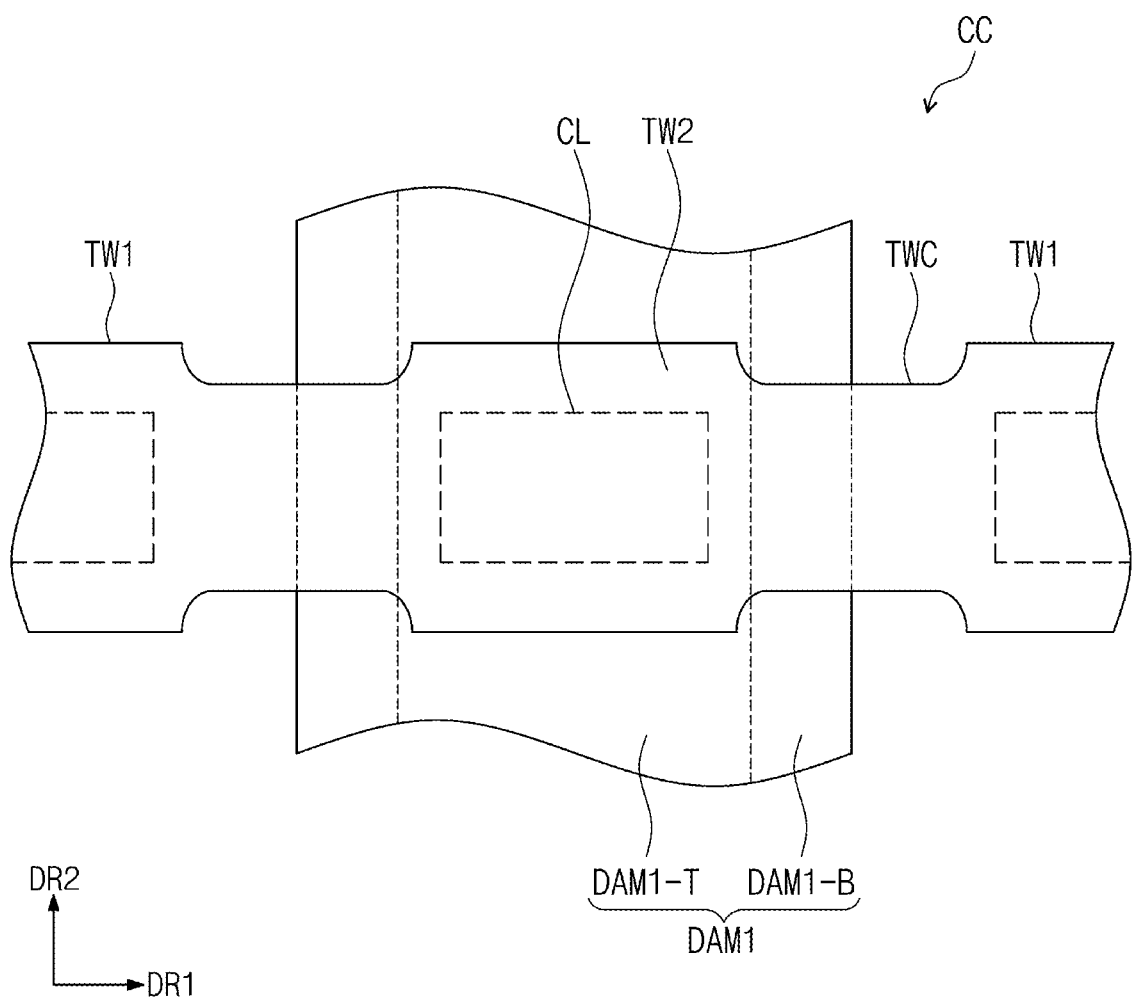
FIG. 19B is a partial enlarged view of region CC of FIG. 12.

FIGS. 19A and 19B illustrate a cross-sectional view and a plan view when the configuration of a wiring part TW in comparison with the above-mentioned exemplary embodiments of FIGS. 14A and 14B. Referring to FIGS. 19A and 19B, the wiring part TW may have a double wiring structure.

In an exemplary embodiment, the wiring part TW may include a first metal layer MTL1, an insulating layer ISL, a second metal layer MTL2, and contact holes CL. The first metal layer MTL1 may be disposed on an encapsulating layer TFE, and the insulating layer ISL may be disposed between the first and second metal layers MTL1 and MTL2. Also, the plurality of contact holes CL may be disposed between the first and second metal layers MTL1 and MTL2. The contact holes CL may electrically connect the first and second metal layers MTL1 and MTL2. The contact holes CL may be formed to pass through the insulating layer ISL. The resistance of the wiring part may be reduced by configuring the wiring part as the double wiring structure in which the first and second metal layers MTL1 and MTL2 are laminated.

Also, in an exemplary embodiment, the contact holes CL may be disposed not to overlap a connection wiring part TWC. The contact holes may be disposed not to overlap a portion having a step in a protruding member. The contact holes CL is configured to be disposed on a flat surface of the encapsulating layer TFE and a flat surface of an upper protruding part DAM1-T so as to improve electrical connection between the first and second metal layers MTL1 and MTL2, and thus, resistance of the wiring part TW may be reduced.

In the exemplary embodiments described so far in FIGS. 9 to 19B, the shape of the wiring part passing the protruding member at a portion adjacent to the touch pad of the touch sensing unit is exemplarily illustrated, but the exemplary embodiments of the inventive concept are not limited thereto. For example, when the wiring part TW connected to the second touch electrodes TE2-1 to TE2-5 illustrated in FIG. 9 and extending in the second direction DR2 is disposed to pass the protruding member DAM extending in the first direction DR1, the shape of the wiring part described in the above-mentioned exemplary embodiment may also be applied. Also, the wiring part which passes not only the protruding member DAM, but also the structure having a step, may have a notch shape which is concavely recessed at a step portion of the structure.

A display apparatus of an exemplary embodiment having the above-mentioned structure of the wiring part may reduce both the likelihood of short-circuit defects between the wiring parts and the likelihood of disconnection defects of the wiring parts.

Figure 20:
FIG. 20 is a schematic cross-sectional view illustrating a photolithgraphy process in a process for manufacturing a display apparatus according to an exemplary embodiment of the inventive concept.
Figure 20:
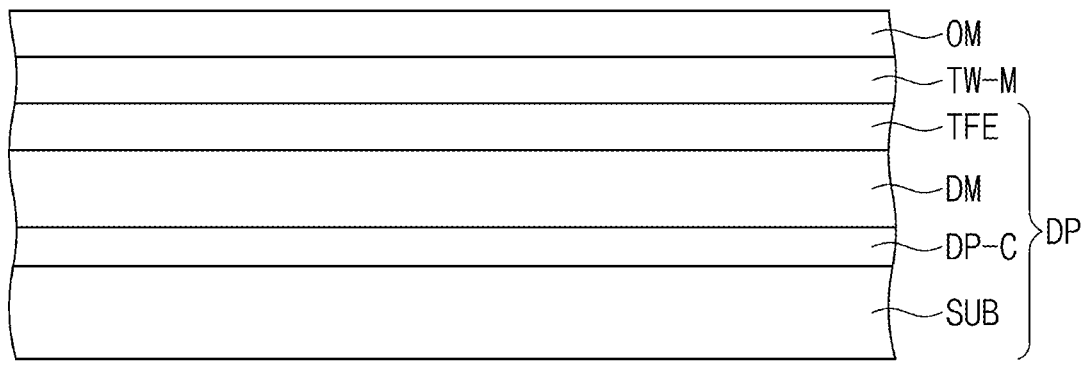

FIG. 20 illustrates a cross-sectional view illustrating a portion of a photolithography process from among processes for forming the wiring part of a touch sensing unit in a display apparatus of an exemplary embodiment. The wiring part may be formed in an exemplary embodiment by patterning a metal layer TW-M deposited on an encapsulating layer TFE of an organic light-emitting display panel DP in a process of FIG. 20. The metal layer TW-M may be deposited on the encapsulating layer TFE, and an organic layer OM for patterning the wiring part may be provided on the metal layer TW-M. The organic layer OM may be a photoresist material, for example, a negative-type photoresist may be used as the organic layer OM. A mask MSK is disposed on an organic light-emitting display panel DP coated with the organic layer OM, the organic layer OM is then cured by providing ultraviolet light, and then the organic layer OM is patterned according to the shape of the mask by removing an uncured organic layer OM. Then, an etching process is performed to pattern the metal layer TW-M along the patterned organic layer OM. After patterning the metal layer TW-M, a strip process is performed to remove the remaining organic layer OM and to thereby form the wiring part.

Figure 21A:
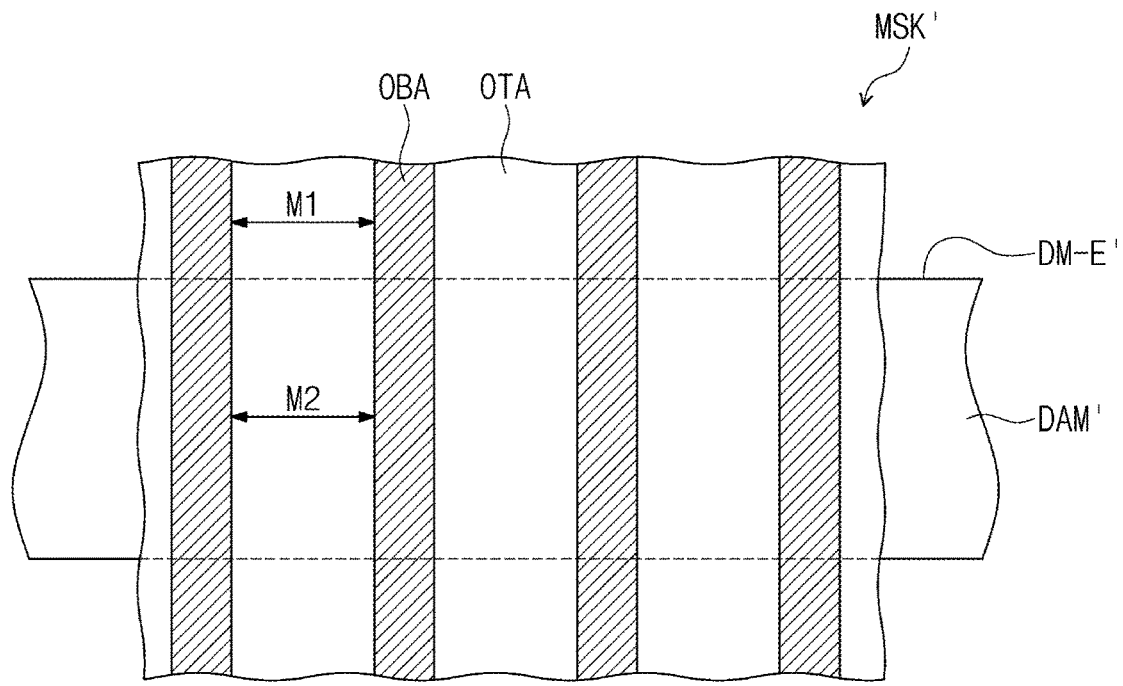
FIG. 21A is a plan view exemplarily illustrating a case in which a typical mask for manufacturing a wiring part is used.
Figure 21B:
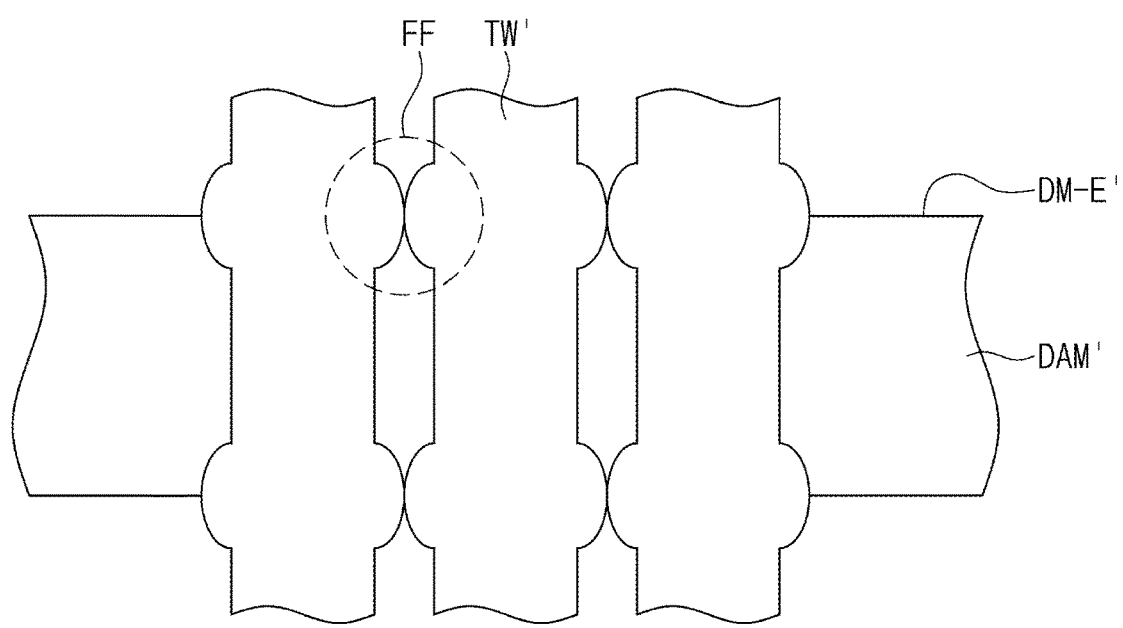
FIG. 21B is a plan view illustrating a structure of a wiring part according to the related art.

FIG. 21A illustrates a shape of a mask MSK' according to related arts used to form a wiring part. FIG. 21B is a view illustrating a wiring part TW' formed by using the mask MSK' illustrated in FIG. 21A.

In FIG. 21A, the mask MSK' may include a light-transmitting part OTA and a light-blocking part OBA. In the mask MSK' illustrated in FIG. 21A, an edge of the light-transmitting part OTA is a straight line shape. When the wiring part passing a protruding member DAM' is formed by using the mask MSK' having the shape illustrated in FIG. 21A, like a region "FF" of FIG. 21B, wiring parts TW' adjacent to each other are connected to each other at an edge DM-E of a protruding member, and thus a short-circuit phenomenon of the wiring part TW' may be caused. This is because when the organic layer OM is provided to pattern the wiring part TW', the laminating height of the organic layer OM is increased at a portion at which a step of the protruding member DAM' is formed, and a problem is thereby caused such that the patterning quality of edge portions of the wiring part TW' is deteriorated when the metal layer TW-M is etched. Under the influence of the organic layer OM which is thickly formed, the metal layer passing the protruding member DAM' may not be patterned to have an edge having a straight line shape according to the mask pattern, and the distance between the adjacent patterned wiring parts TW' is thereby decreased, and thus a short-circuit may be partially caused at the wiring part.

Figure 22:
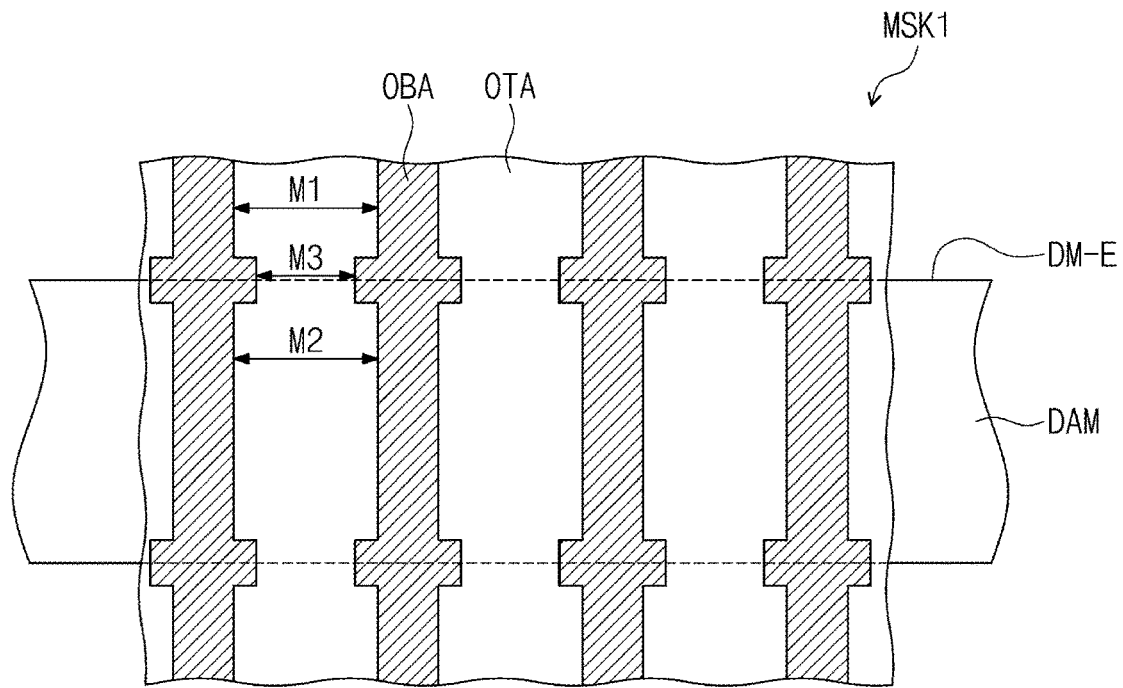
FIGS. 22 and 23 are plan views illustrating a disposition of a mask for manufacturing a wiring part in a display apparatus according to an exemplary embodiment of the inventive concept.

FIG. 22 illustrates a shape of a mask MSK1 used in a display apparatus of an exemplary embodiment to form a wiring part. The mask MSK1 may include a light-transmitting part OTA and a light-blocking part OBA, and the shape of the light-transmitting part OTA may correspond to that of the wiring part TW of FIG. 12 formed on a protruding member DAM in the display apparatus of the exemplary embodiment.

FIG. 22 illustrates the shape of the mask MSK1 of a portion disposed to overlap on the protruding member DAM. The light-transmitting part OTA of the mask MSK1 may have a first width M1 at a portion which does not overlap the protruding member DAM, may have a second width M2 at a portion overlapping the protruding member DAM, and may have a third width M3 at a connecting portion overlapping an edge DM-E of the protruding member DAM. Here, the first and second widths M1 and M2 may be the same, and the third width M3 may be smaller than the first and second widths M1 and M2. For example, in the mask MSK1, the first and second widths M1 and M2 may respectively correspond to first and second wiring widths W1 and W2 which are the wiring widths of the first and second wiring parts TW1 and TW2 in the wiring part of the display apparatus of the exemplary embodiment illustrated in FIG. 12. Also, the third width M3 of the light-transmitting part OTA may correspond to a third wiring width W3 of a connection wiring part TWC.

When the wiring part is patterned by using a shape of the mask MSK1 illustrated in FIG. 22, the light-transmitting part OTA of the mask MSK1 is designed to have the third width M3 smaller than the first width M1 or the second width M2 at a portion overlapping the edge DM-E of the protruding member, and thus short-circuit phenomenon between the wiring parts may be prevented. The light-transmitting part OTA of the mask MSK1 is configured to have the third width M3 smaller than that of the portion overlapping the protruding member DAM at the portion overlapping the edge DM-E of the protruding member, and thus the thickness of the organic layer formed by light transmitting the light-transmitting part OTA of the mask having the third width M3 may be decreased. Accordingly, in the wiring part formed later by an etching process, the wiring parts adjacent to each other at the portion overlapping the edge DM-E of the protruding member may be sufficiently spaced apart from each other, and thus the short-circuit problem between the wiring parts may be improved.

Figure 23:
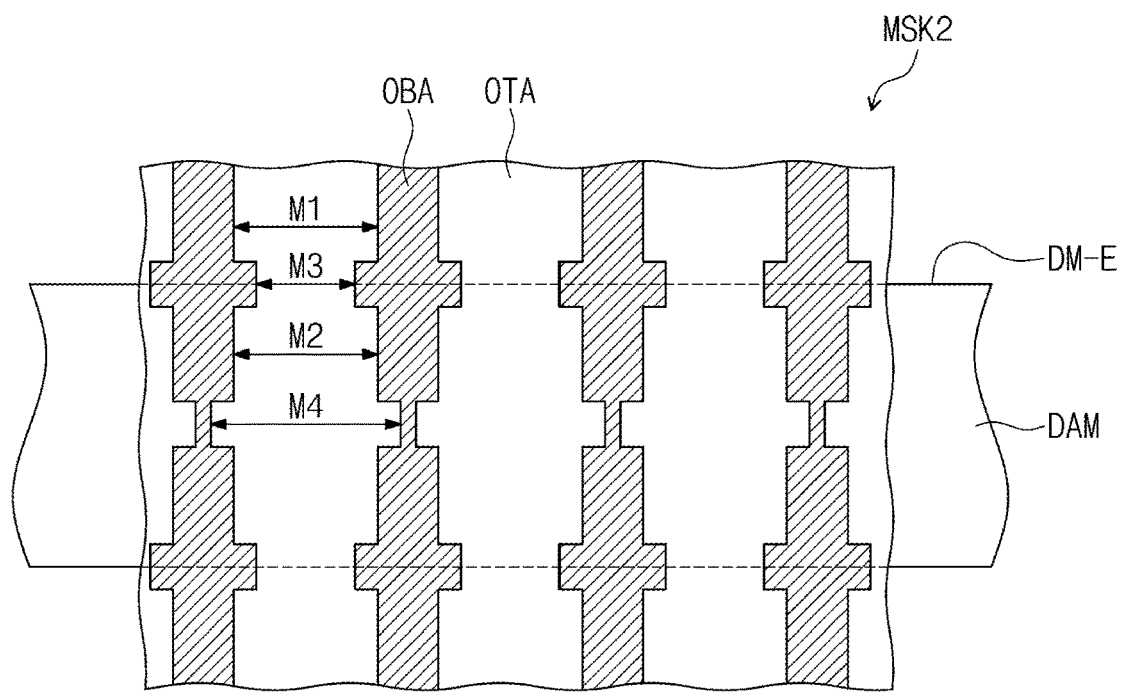

Also, when the protruding member is formed such that a plurality of layers are laminated, and when the area of the topmost surface of the protruding member is smaller than that of the lower protruding parts, the wiring part may be patterned by using a mask MSK2 illustrated in FIG. 23.

FIG. 23 illustrates the shape of the mask MSK2 used in a display apparatus of an exemplary embodiment to form a wiring part. The mask MSK2 may include a light-transmitting part OTA and a light-blocking part OBA, and the shape of the light-transmitting part OTA may correspond to that of a wiring part TW of FIG. 16 formed on a protruding member DAM in the display apparatus of the exemplary embodiment.

FIG. 23 illustrates a shape of the mask MSK2 of a portion disposed to overlap the protruding member DAM. The light-transmitting part OTA of the mask MSK2 may have a first width M1 at a portion which does not overlap the protruding member DAM, and may include a portion having a second width M2 at a portion overlapping the protruding member DAM, and a portion having a fourth width M4 greater than the second width M2. Also, the light-transmitting part OTA of the mask MSK2 may have a third width M3 at a portion overlapping an edge DM-E of the protruding member DAM. Here, the first and second widths M1 and M2 may be the same, and the third width M3 may be smaller than the first and second widths M1 and M2. For example, in the mask MSK2, the first and second widths M1 and M2 of the light-transmitting part OTA may respectively correspond to a first wiring width W1 and a second wiring width W2 which are the wiring widths of the first and second wiring parts TW1 and TW2 in the wiring part of the display apparatus of the exemplary embodiment illustrated in FIG. 16. Also, the third width M3 of the light-transmitting part OTA may correspond to a third wiring width W3 of a connection wiring part TWC. A fourth width M4 of light-transmitting part OTA may correspond to a first sub wiring width W4 of a first sub wiring part TW2-1.

When the wiring part is patterned by using a shape of the mask MSK2 illustrated in FIG. 23, the light-transmitting part OTA of the mask MSK2 is designed to have the third width M3 smaller than the first width M1 or the second width M2 at a portion overlapping the edge DM-E of the protruding member, and thus short-circuit phenomenon between the wiring parts may be prevented.

Also, when a connecting part is patterned by using the mask MSK' according to a related art due to the relatively small area in case of the topmost surface of the protruding member, a metal layer at the topmost edge portion of the protruding member is excessively etched, and thus, a problem of a short-circuit of the connecting part may be caused.

In comparison with this, when the connecting part is patterned by using the mask MSK2 having a shape illustrated in FIG. 23, the width of the light-transmitting part OTA of the mask may be relatively increased at the topmost layer of the protruding member such that the wiring part may be patterned to have a sufficient width, and thus, disconnection problem of the wiring part may be improved.

Accordingly, in a display apparatus of an exemplary embodiment, a wiring part reduces the likelihood of a short-circuit problem between the adjacent wiring parts by forming a concavely-shaped notch at a step portion of a protruding member, and also may reduce the likelihood of a disconnection problem of the wiring part by forming a protruding part having a convex shape at the topmost surface of the protruding member.

Also, in a display apparatus of an exemplary embodiment, a protruding member is disposed such that a lower protruding part and an upper protruding part are laminated in a step shape to thereby introduce a flat surface on the protruding member, and thus, the likelihood of a short-circuit problem between the adjacent wiring parts may be reduced.

A display apparatus according to an exemplary embodiment may reduce or prevent short-circuit defects between adjacent wiring parts when wiring is formed by decreasing the width of wiring parts overlapping edges of a protruding member to be less than the width of wiring parts which do not overlap the protruding member.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display apparatus comprising:
    a base substrate comprising a display region and a non-display region adjacent to the display region;
    a light-emitting element layer disposed on the display region;
    a touch sensing unit disposed on the light-emitting element layer and comprising a touch electrode and a wiring part connected to the touch electrode; and
    a protruding member disposed on the non-display region, wherein:
    the wiring part comprises, when viewed in a plan view:
        a first wiring part which does not overlap the protruding member and having a first wiring width, the protruding member protruding higher than the first wiring part in a cross-sectional view;
        a second wiring part overlapping and on the protruding member and having a second wiring width; and
        a connection wiring part disposed between the first and second wiring parts, the connection wiring part having a third wiring width different from the first and second wiring widths; and
    the first to third wiring widths are widths in a direction perpendicular to an extending direction of the wiring part.

2. The display apparatus of claim 1, wherein the connection wiring part comprises a notch defined in at least one side of the connection wiring part.

3. The display apparatus of claim 2, wherein the notch is concavely recessed to the inside direction of the wiring part.

4. The display apparatus of claim 1, wherein the connection wiring part overlaps around an edge of the protruding member.

5. The display apparatus of claim 1, wherein the third wiring width is less than the first and second wiring widths.

6. The display apparatus of claim 1, wherein the connection wiring part comprises:
    a first sub connecting part having a wiring width less than the first wiring width;
    a second sub connecting part disposed between the first wiring part and the first sub connecting part; and
    a third sub connecting part disposed between the second wiring part and the first sub connecting part; and
    the first sub connecting part overlaps around an edge of the protruding member.

7. The display apparatus of claim 1, wherein:
    the protruding member comprises:
        a bottom surface;
        an upper surface facing the bottom surface; and
        side surfaces connecting the bottom surface and the upper surface;
    the side surfaces have an inclination with respect to the bottom surface; and
    an area of the bottom surface is equal to or greater than that of the upper surface.

8. The display apparatus of claim 1, wherein:
    the protruding member comprises, in a cross-section perpendicular to the base substrate:
        a lower protruding part having a first width; and
        an upper protruding part disposed on the lower protruding part and having
    a second width equal to or less than the first width; and
    the first and second widths are widths in a direction parallel to the extending direction of the wiring part.

9. The display apparatus of claim 8, wherein:
the connection wiring part comprises:
a first sub connecting part having a wiring width less than the first wiring width;
a second sub connecting part disposed between the first wiring part and the first sub connecting part; and
a third sub connecting part disposed between the second wiring part and the first sub connecting part; and
the first sub connecting part overlaps around an edge of the lower protruding part and the third sub connecting part overlaps around an edge of the upper protruding part.

10. The display apparatus of claim 1, further including an encapsulating layer covering the light-emitting element layer,
wherein the touch sensing unit is directly disposed on the encapsulating layer.

11. A display apparatus comprising:
a base substrate comprising a display region and a non-display region adjacent to the display region;
a light-emitting element layer disposed on the display region;
a touch sensing unit disposed on the light-emitting element layer and comprising a touch electrode and a wiring part connected to the touch electrode;
a first protruding member disposed on the non-display region; and
a second protruding member disposed outside the first protruding member on the non-display region, and the second protruding member is spaced apart from the first protruding member;
wherein:
the wiring part comprises, when viewed in a plan view:
a first wiring part having a first wiring width and disposed between the first protruding member and the second protruding member, wherein the first wiring part does not overlap neither the first protruding member nor the second protruding member;
a second wiring part having a second wiring width and overlapping and on the first protruding member and the second protruding member; and
a connection wiring part having a third wiring width different from the first and second wiring widths and disposed between the first and second wiring parts; and
the first to third wiring widths are widths in a direction perpendicular to an extending direction of the wiring part.

12. The display apparatus of claim 11, wherein the second protruding member has a height equal to or greater than the first protruding member.

13. The display apparatus of claim 11, wherein:
the first protruding member comprises two layers laminated in a thickness direction; and
the second protruding member comprises three layers laminated in the thickness direction.

14. The display apparatus of claim 11, wherein:
the second wiring part comprises:
a first part overlapping and on the first protruding member; and
a second part overlapping and on the second protruding member; and
a shape of the first part and a shape of the second part are different form each other.

15. The display apparatus of claim 11, wherein the third wiring width is less than the first and second wiring widths.

16. The display apparatus of claim 11, wherein the connection wiring part overlaps around each of an edge of the first protruding member and an edge of the second protruding member.

17. The display apparatus of claim 11, wherein the connection wiring part comprises a notch defined at least one sides of the connection wiring part.

18. The display apparatus of claim 17, wherein the notch is concavely recessed to the inside direction of the wiring part.

19. The display apparatus of claim 11, wherein the second wiring part comprises:
a first sub wiring part having a first sub wiring width greater than the first wiring width;
a second sub wiring part extending from the connection wiring part and having a second sub wiring width less than the first sub wiring width; and
a third sub wiring part disposed between the first and second sub wiring parts.

20. The display apparatus of claim 19, wherein a wiring width of the third sub wiring part is decreased in a direction toward the second sub wiring part.

21. A display apparatus comprising:
a base substrate comprising a display region and a non-display region adjacent to the display region;
a light-emitting element layer disposed on the display region;
a touch sensing unit disposed on the light-emitting element layer and comprising a touch electrode and a wiring part connected to the touch electrode; and
a protruding member disposed on the non-display region,
wherein:
the wiring part comprises, when viewed in a plan view:
a first wiring part which does not overlap the protruding member and having a first wiring width;
a second wiring part overlapping and on the protruding member and having a second wiring width; and
a connection wiring part disposed between the first and second wiring parts, the connection wiring part having a third wiring width different from the first and second wiring widths;
the first to third wiring widths are widths in a direction perpendicular to an extending direction of the wiring part; and
the wiring part comprises:
a first metal layer;
a second metal layer disposed on the first metal layer; and
contact holes electrically connect the first and second metal layers.

22. The display apparatus of claim 21, wherein:
the wiring part includes an insulating layer disposed between the first metal layer and the second metal layer; and
the contact holes pass through the insulating layer.

23. The display apparatus of claim 21, wherein the contact holes are disposed between the first and second metal layers.

24. The display apparatus of claim 21, wherein the contact holes do not overlap the connection wiring part.

25. The display apparatus of claim 21, wherein the connection wiring part overlaps around an edge of the protruding member.

26. The display apparatus of claim 21, wherein the third wiring width is less than the first and second wiring widths.

27. The display apparatus of claim 21, wherein the connection wiring part comprises a notch defined at least one sides of the connection wiring part.

28. The display apparatus of claim 27, wherein the notch is concavely recessed to the inside direction of the wiring part.

29. The display apparatus of claim 21, wherein:
the connection wiring part comprises:
- a first sub connecting part having a wiring width less than the first wiring width;
- a second sub connecting part disposed between the first wiring part and the first sub connecting part; and
- a third sub connecting part disposed between the second wiring part and the first sub connecting part; and the first sub connecting part overlaps around an edge of the protruding member.

30. The display apparatus of claim 21, further including an encapsulating layer covering the light-emitting element layer,
wherein the touch sensing unit is directly disposed on the encapsulating layer.

* * * * *